(12) United States Patent
Chuang et al.

(10) Patent No.: US 11,239,208 B2
(45) Date of Patent: Feb. 1, 2022

(54) PACKAGED SEMICONDUCTOR DEVICES INCLUDING BACKSIDE POWER RAILS AND METHODS OF FORMING THE SAME

(71) Applicant: Taiwan Semiconductor Manufacturing Co., Ltd., Hsinchu (TW)

(72) Inventors: Chi-Yi Chuang, Hsinchu (TW); Hou-Yu Chen, Zhubei (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/994,223

(22) Filed: Aug. 14, 2020

(65) Prior Publication Data

US 2021/0358891 A1   Nov. 18, 2021

Related U.S. Application Data

(60) Provisional application No. 63/023,317, filed on May 12, 2020.

(51) Int. Cl.
*H01L 23/00* (2006.01)
*H01L 23/528* (2006.01)
(Continued)

(52) U.S. Cl.
CPC ...... *H01L 25/0657* (2013.01); *H01L 23/5286* (2013.01); *H01L 24/08* (2013.01);
(Continued)

(58) Field of Classification Search
CPC ............... H01L 25/0657; H01L 25/50; H01L 23/5286; H01L 24/08; H01L 24/80;
(Continued)

(56) References Cited

U.S. PATENT DOCUMENTS 9,209,247 B2   12/2015   Colinge et al.
9,236,267 B2    1/2016   De et al.
(Continued)

FOREIGN PATENT DOCUMENTS

DE   102014109352 A1   11/2015
TW       201841378 A   11/2018
TW       202017182 A    5/2020

*Primary Examiner* — Tong-Ho Kim
(74) *Attorney, Agent, or Firm* — Slater Matsil, LLP

(57) ABSTRACT

Methods for forming packaged semiconductor devices including backside power rails and packaged semiconductor devices formed by the same are disclosed. In an embodiment, a device includes a first integrated circuit device including a first transistor structure in a first device layer; a front-side interconnect structure on a front-side of the first device layer; and a backside interconnect structure on a backside of the first device layer, the backside interconnect structure including a first dielectric layer on the backside of the first device layer; and a first contact extending through the first dielectric layer to a source/drain region of the first transistor structure; and a second integrated circuit device including a second transistor structure in a second device layer; and a first interconnect structure on the second device layer, the first interconnect structure being bonded to the front-side interconnect structure by dielectric-to-dielectric and metal-to-metal bonds.

20 Claims, 79 Drawing Sheets

(51) Int. Cl.
  *H01L 25/00* (2006.01)
  *H01L 25/065* (2006.01)
  *H01L 29/06* (2006.01)
  *H01L 29/423* (2006.01)
  *H01L 29/45* (2006.01)
  *H01L 29/786* (2006.01)

(52) U.S. Cl.
  CPC .............. *H01L 24/80* (2013.01); *H01L 25/50* (2013.01); *H01L 29/0673* (2013.01); *H01L 29/42392* (2013.01); *H01L 29/45* (2013.01); *H01L 29/78618* (2013.01); *H01L 29/78696* (2013.01); *H01L 2224/08145* (2013.01); *H01L 2224/80006* (2013.01); *H01L 2224/80895* (2013.01); *H01L 2224/80896* (2013.01); *H01L 2924/13091* (2013.01)

(58) Field of Classification Search
  CPC ........... H01L 29/0673; H01L 29/42392; H01L 29/45; H01L 29/78618; H01L 29/78696; H01L 2224/08145; H01L 2224/80896; H01L 2924/13091
  USPC ........................................................ 257/347
  See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,867,891 B2 | 12/2020 | Shen et al. |
| 2010/0155932 A1* | 6/2010 | Gambino .............. H01L 23/481 257/698 |
| 2017/0186799 A1 | 6/2017 | Lin et al. |
| 2018/0122714 A1 | 5/2018 | Cheng et al. |
| 2019/0348389 A1 | 11/2019 | Pancholi et al. |
| 2020/0006329 A1 | 1/2020 | Lilak et al. |
| 2020/0235013 A1 | 7/2020 | Lilak et al. |

\* cited by examiner

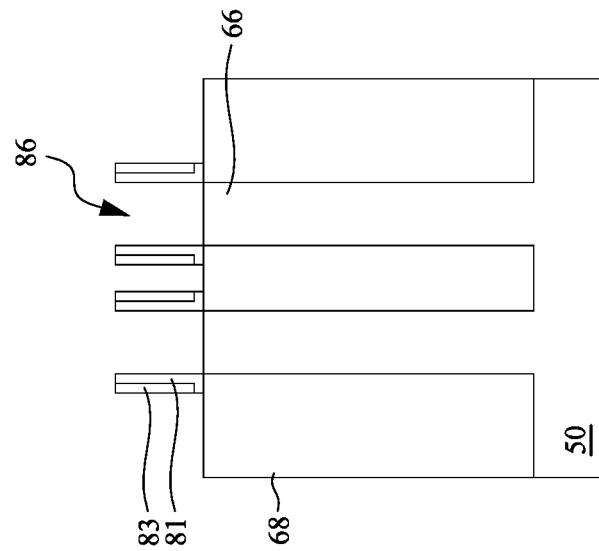
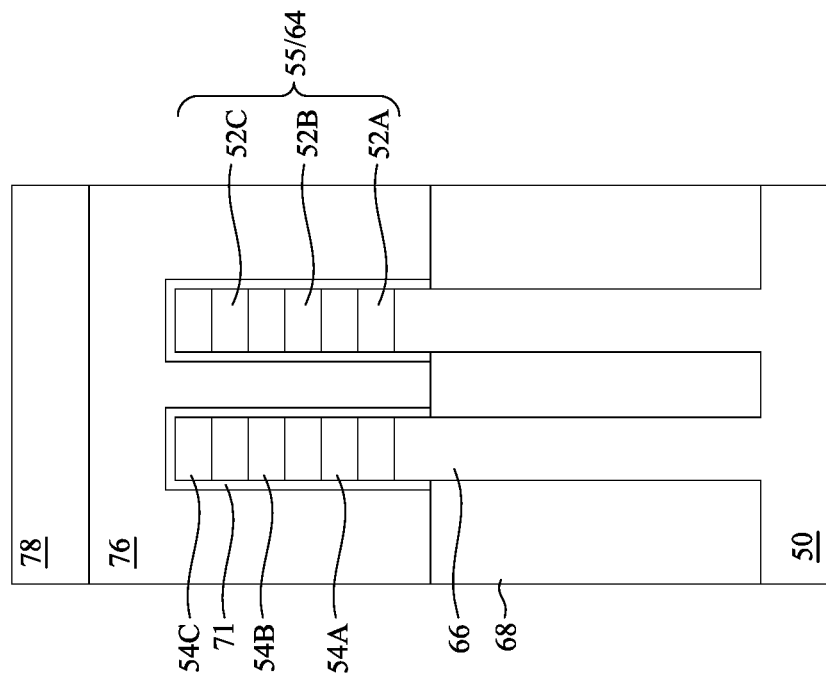

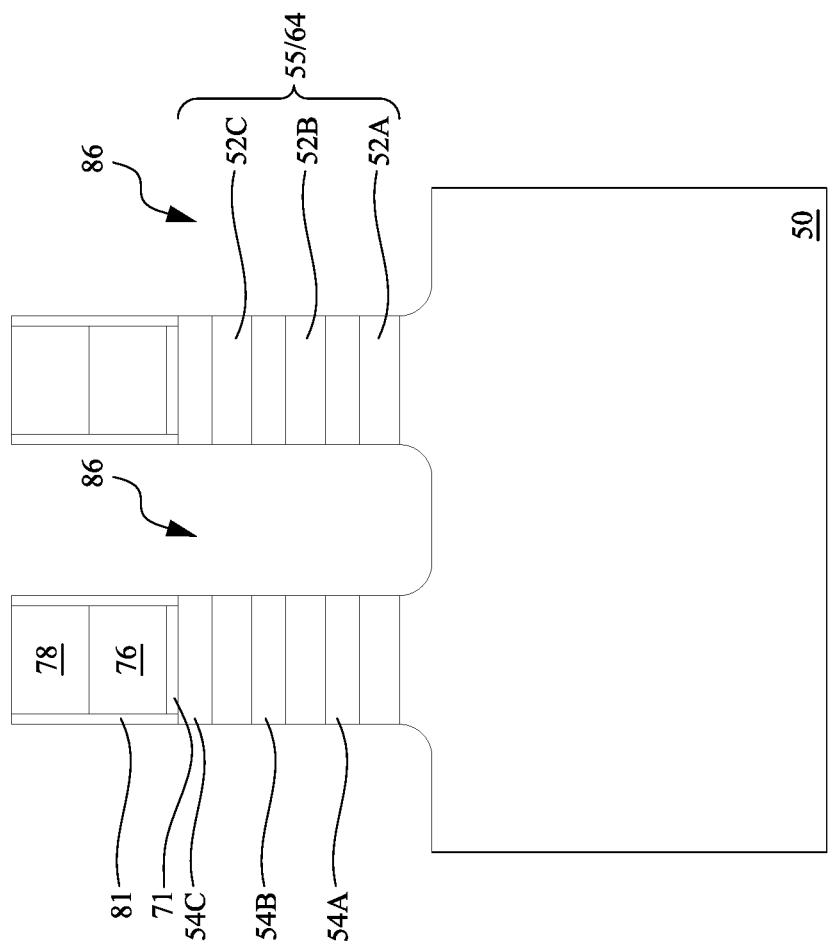

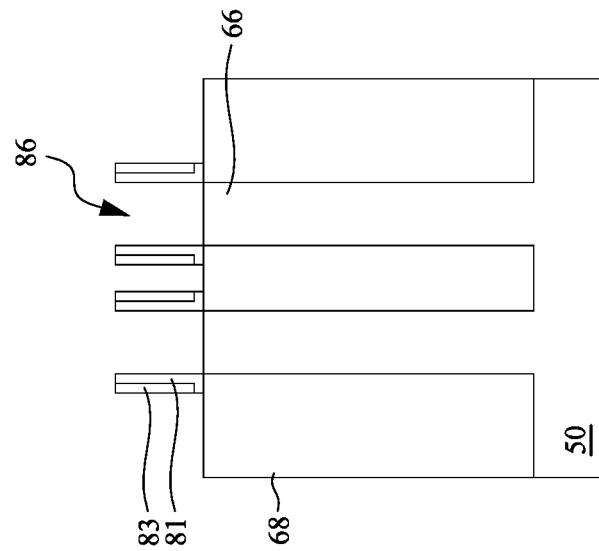
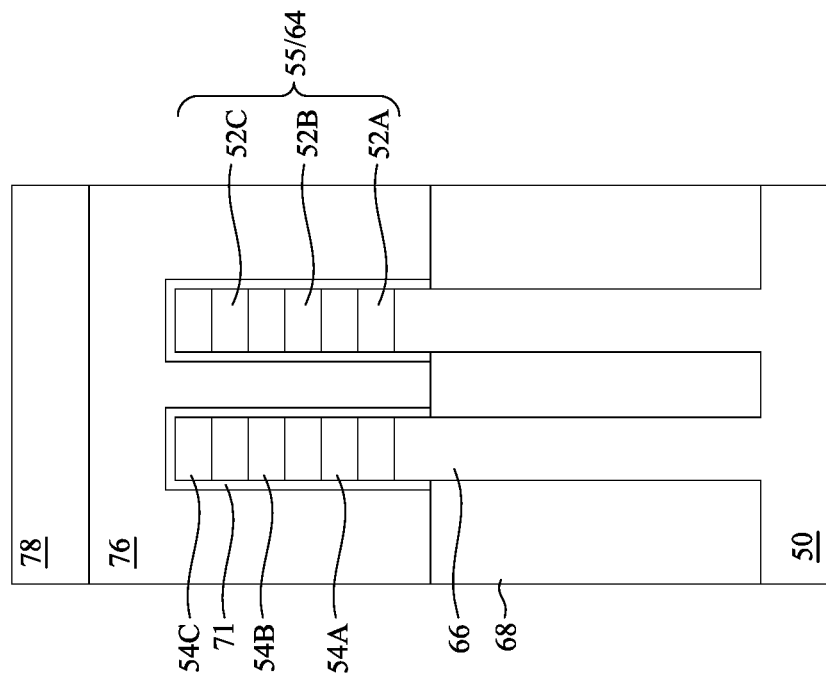
Fig. 11B
Fig. 11A

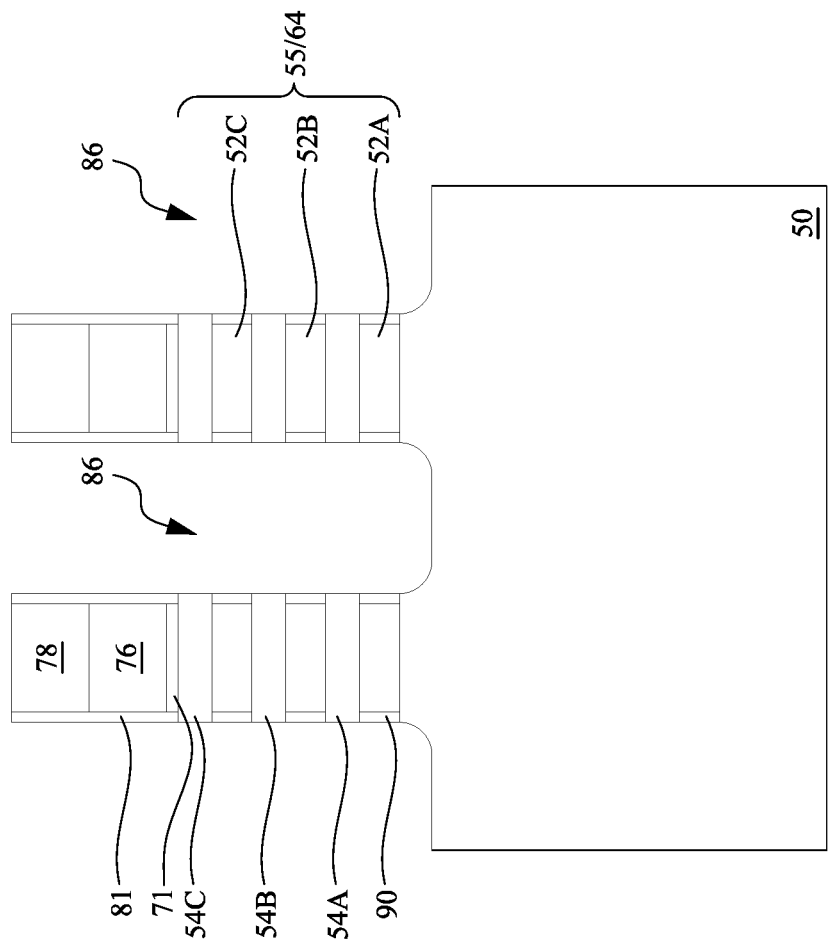

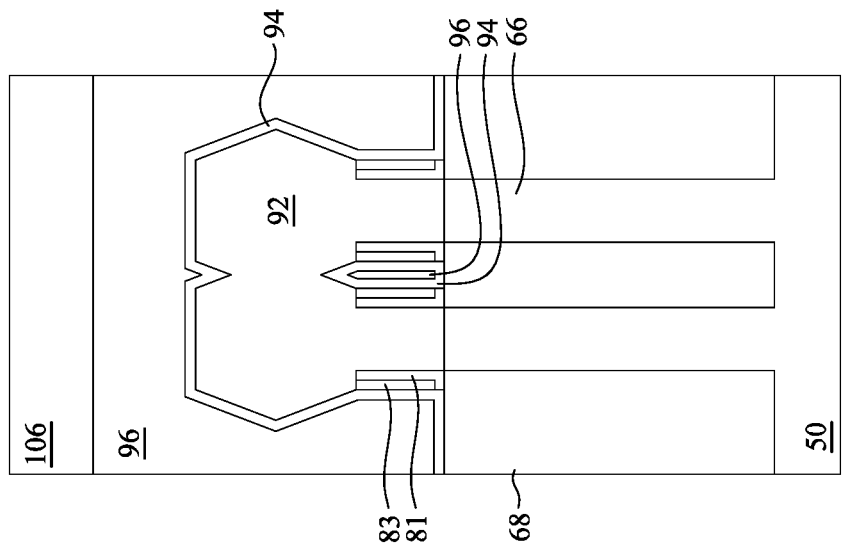
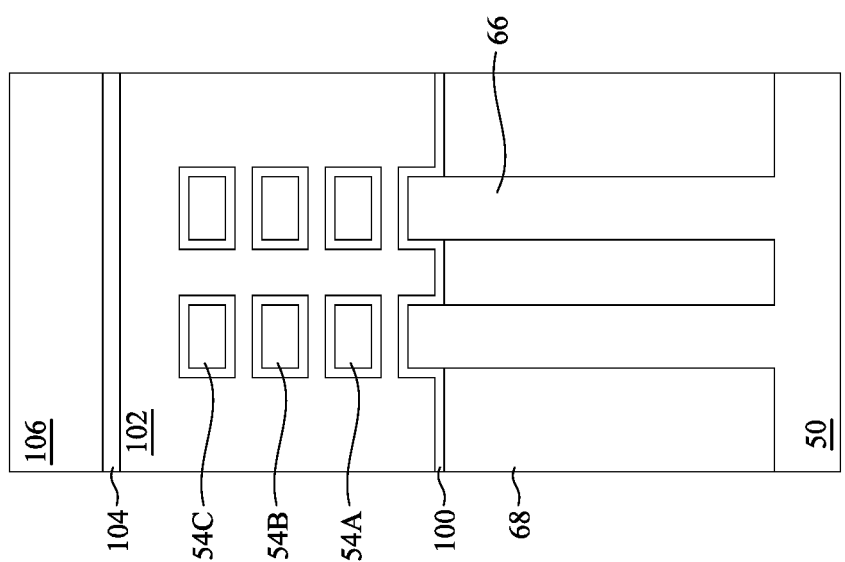
Fig. 18B
Fig. 18A

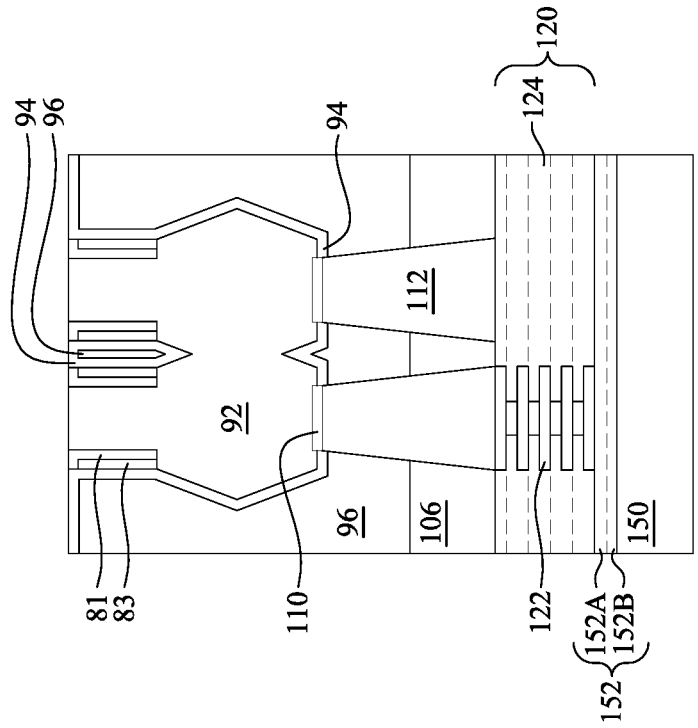
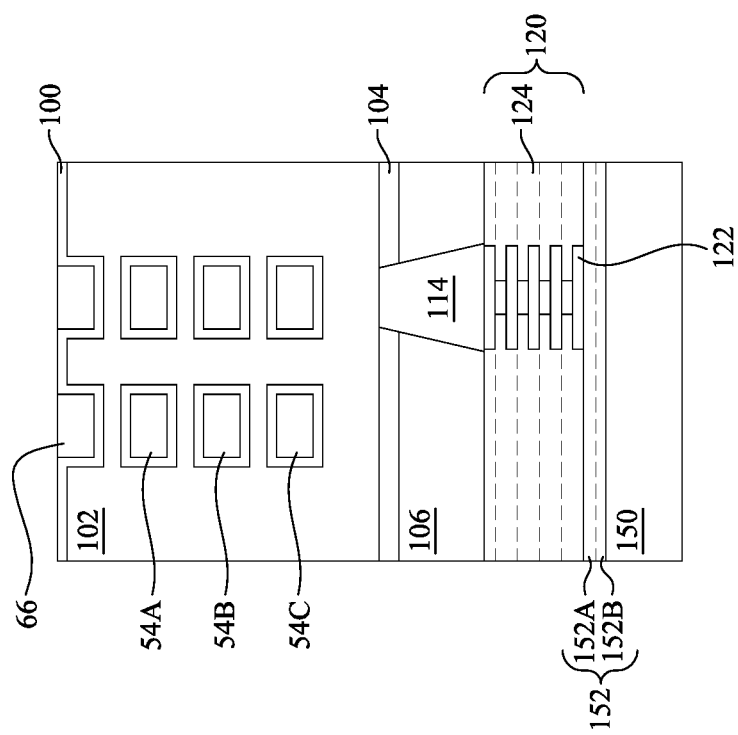
Fig. 23B
Fig. 23A

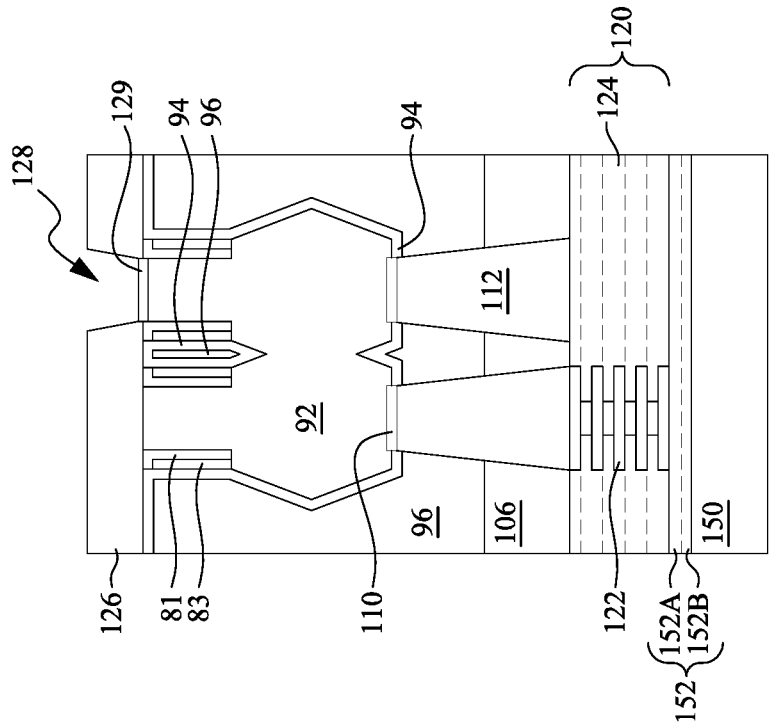
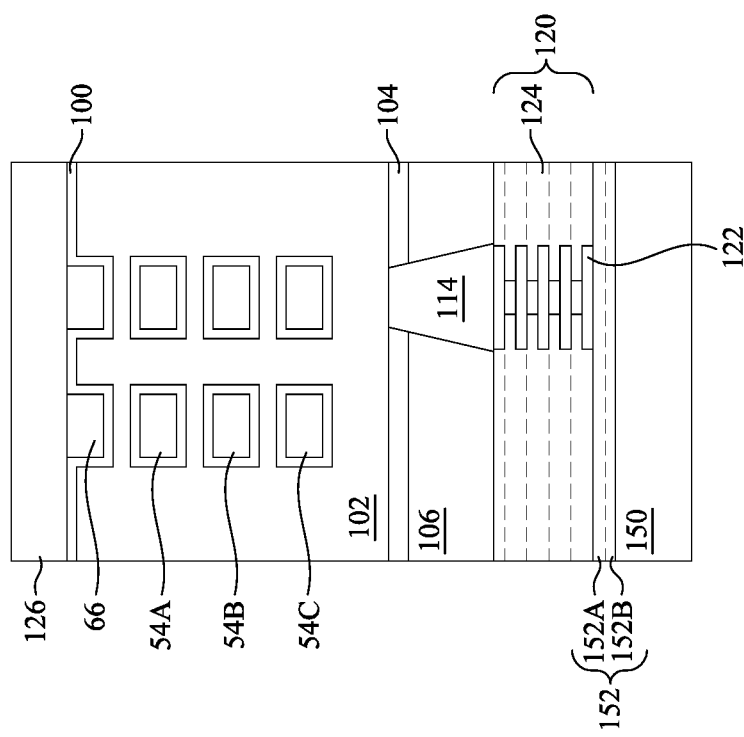
Fig. 25B
Fig. 25A

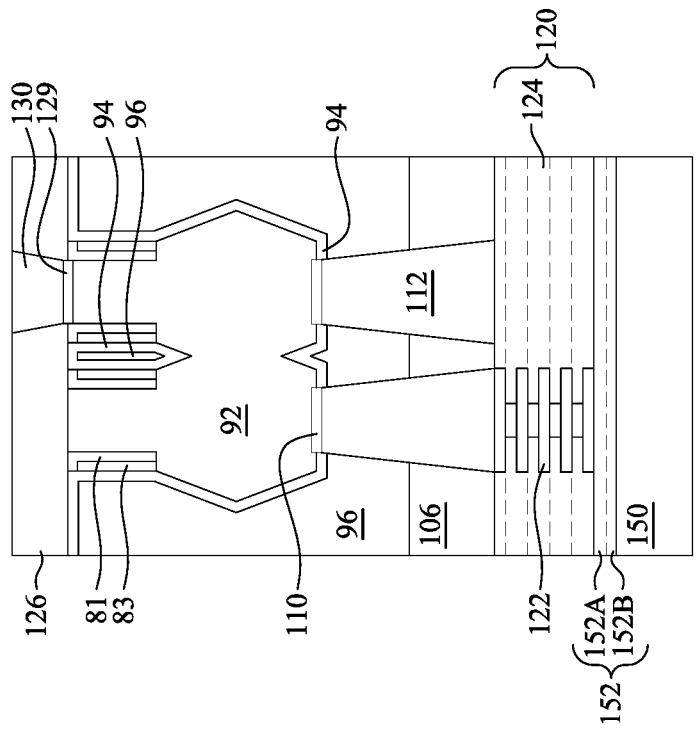
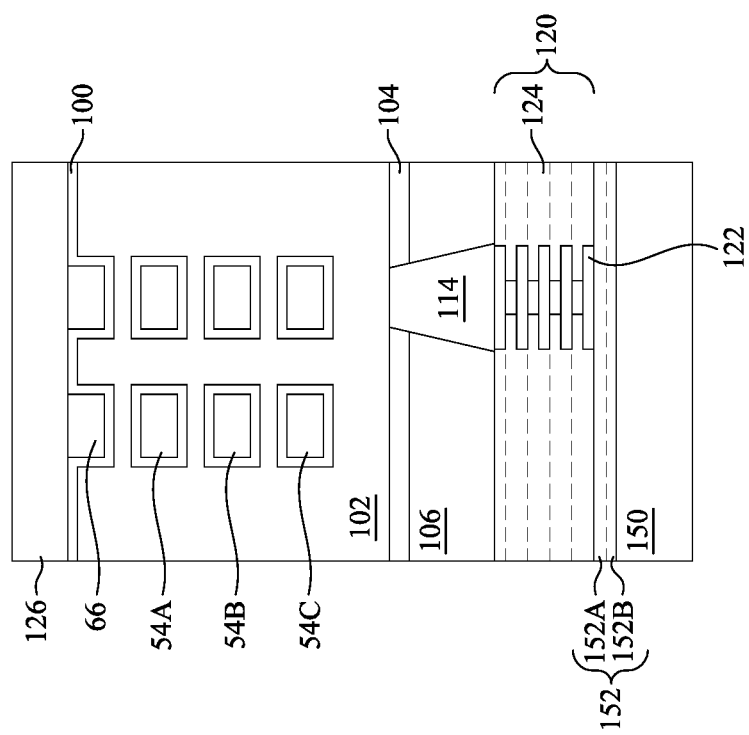

PACKAGED SEMICONDUCTOR DEVICES INCLUDING BACKSIDE POWER RAILS AND METHODS OF FORMING THE SAME

CROSS-REFERENCE TO RELATED APPLICATIONS

This application claims the benefit of U.S. Provisional Application No. 63/023,317, filed on May 12, 2020, and entitled "Semiconductor Chip Stack with Back Side Power Rail and Method of Forming the Same," which patent application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 21D, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, and 29C are cross-sectional views of intermediate stages in the manufacturing of nano-FETs, in accordance with some embodiments.

DETAILED DESCRIPTION

Figure 1:
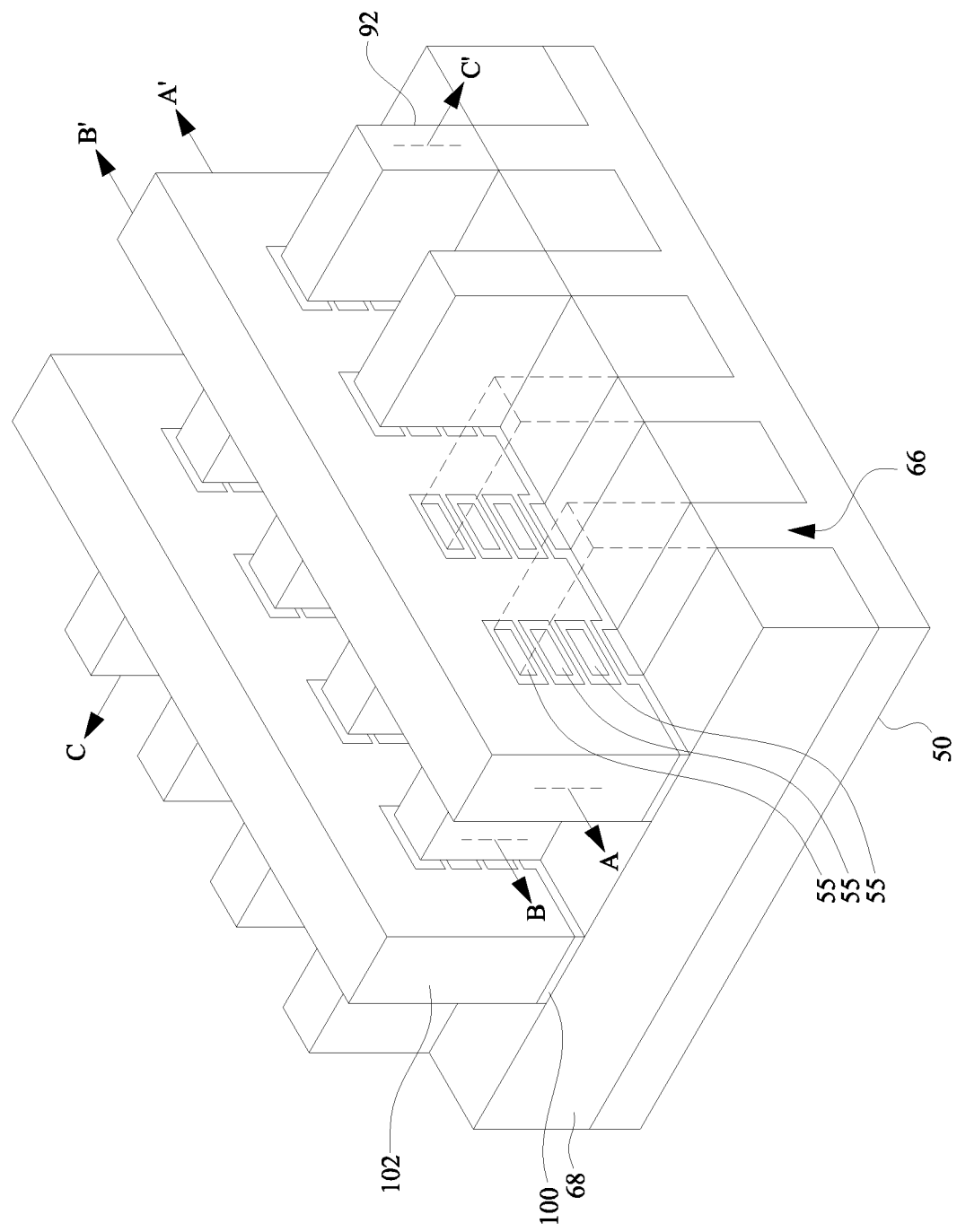
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming packaged semiconductor devices using hybrid bonding and packaged semiconductor devices formed by the same. The packaged semiconductor devices include stacked integrated circuit (IC) dies, at least one of which includes a backside interconnect structure with a backside power rail. The backside power rail may be connected to a source/drain region of the stacked IC die through a backside via. In some embodiments, a front-side interconnect structure of a first IC die is hybrid bonded to a front-side interconnect structure of a second IC die; a front-side interconnect structure of a first die is hybrid bonded to a backside interconnect structure of a second die; or a backside interconnect structure of a first die is hybrid bonded to a backside interconnect structure of a second die. Forming packaged semiconductor devices having IC dies which include backside power rails allows for the IC dies to be formed with greater transistor densities, reduces distances between bonded IC dies, and provides for greater flexibility in IC die stacking and packaging.

Some embodiments discussed herein are described in the context of IC dies including nano-FETs. However, various embodiments may be applied to IC dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 29C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, and 29A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, and 29B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 21D, 22C, 23C, 24C, 25C, 26C, 27C, 28C, and 29C illustrate reference cross-section C-C' illustrated in FIG. 1. FIGS. 30 through 51 are cross-sectional views of intermediate stages in the packaging of IC dies, in accordance with some embodiments. FIGS. 30 through 51 illustrate reference cross-section C-C' illustrated in FIG. 1.

Figure 2:
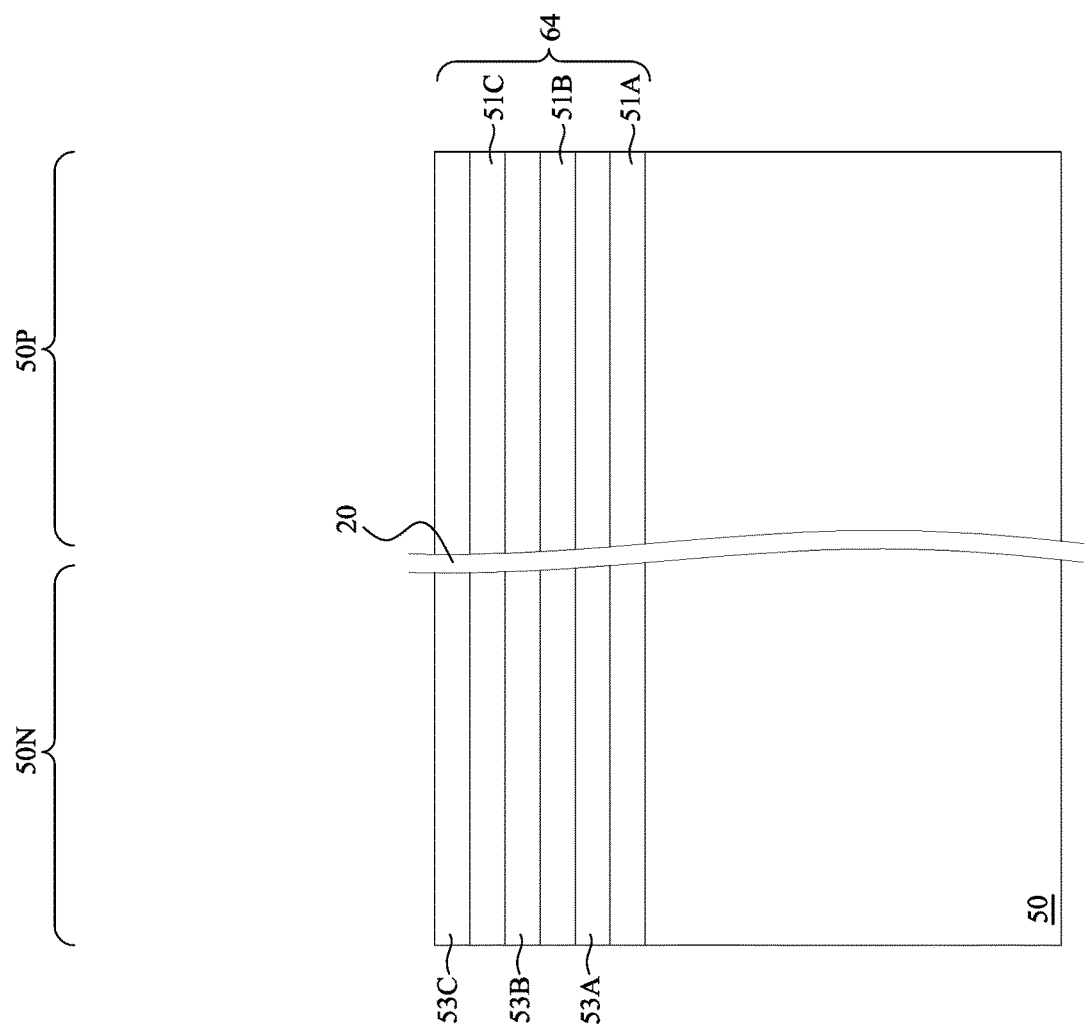

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
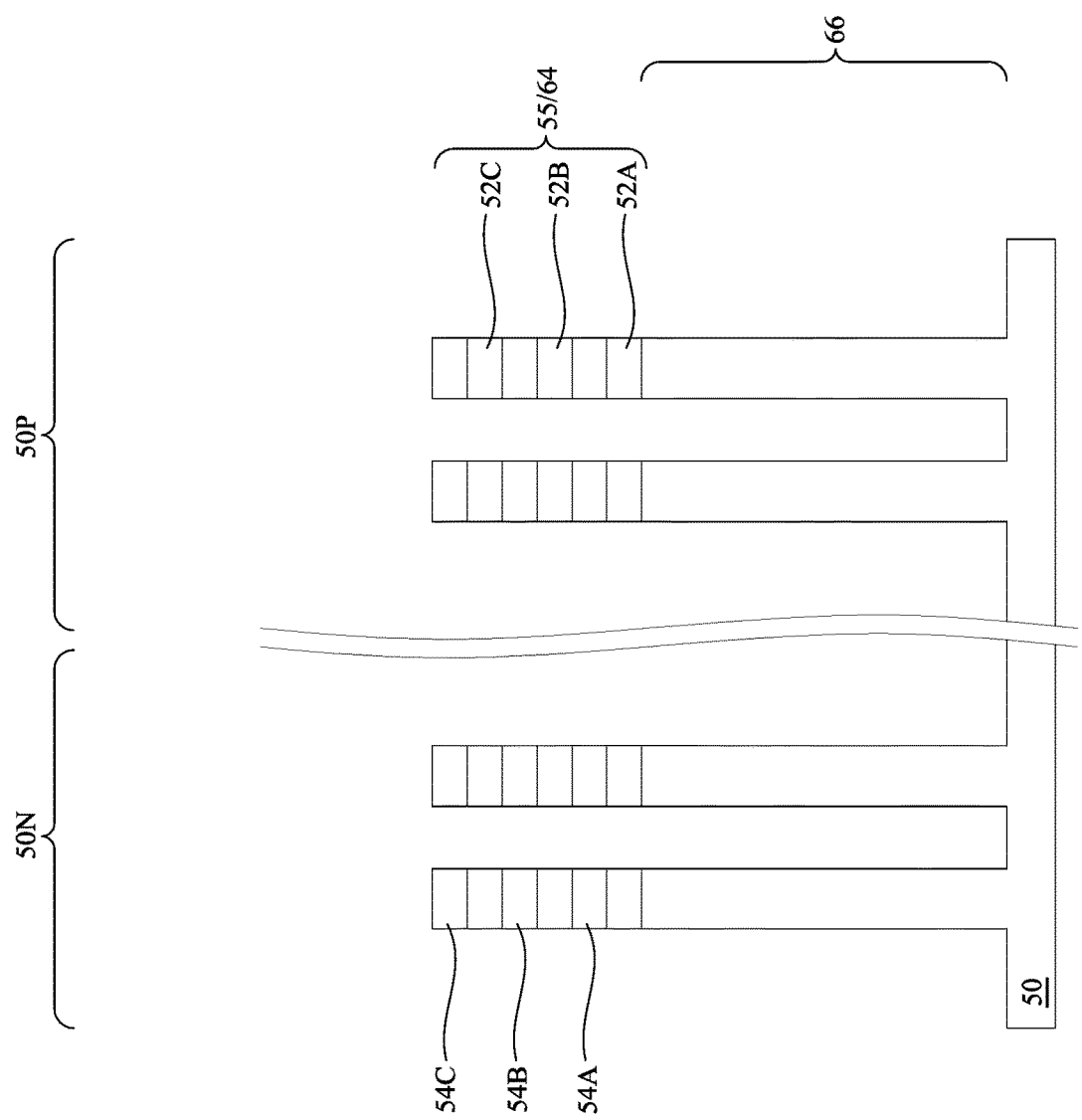

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nano structures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
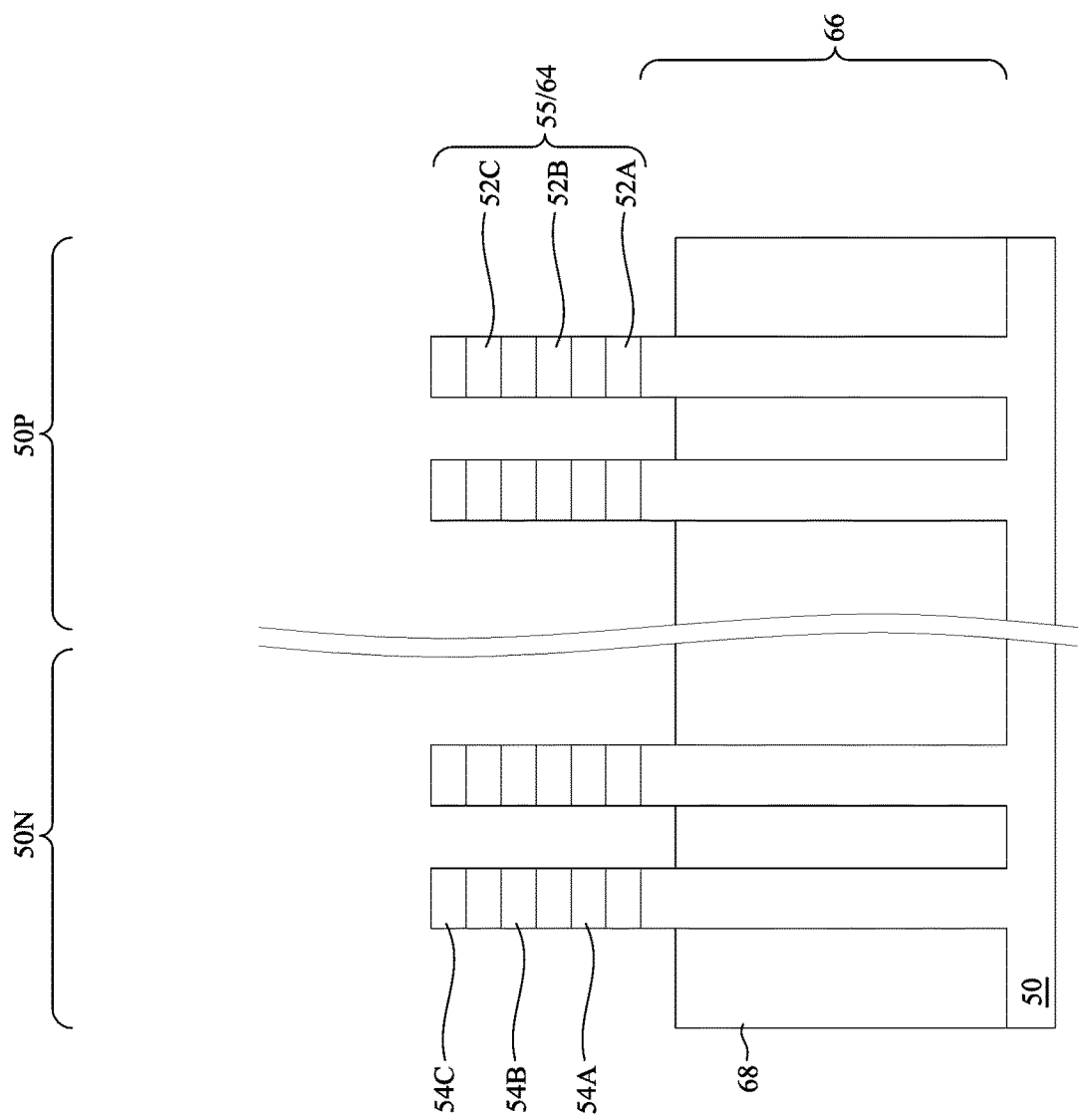

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
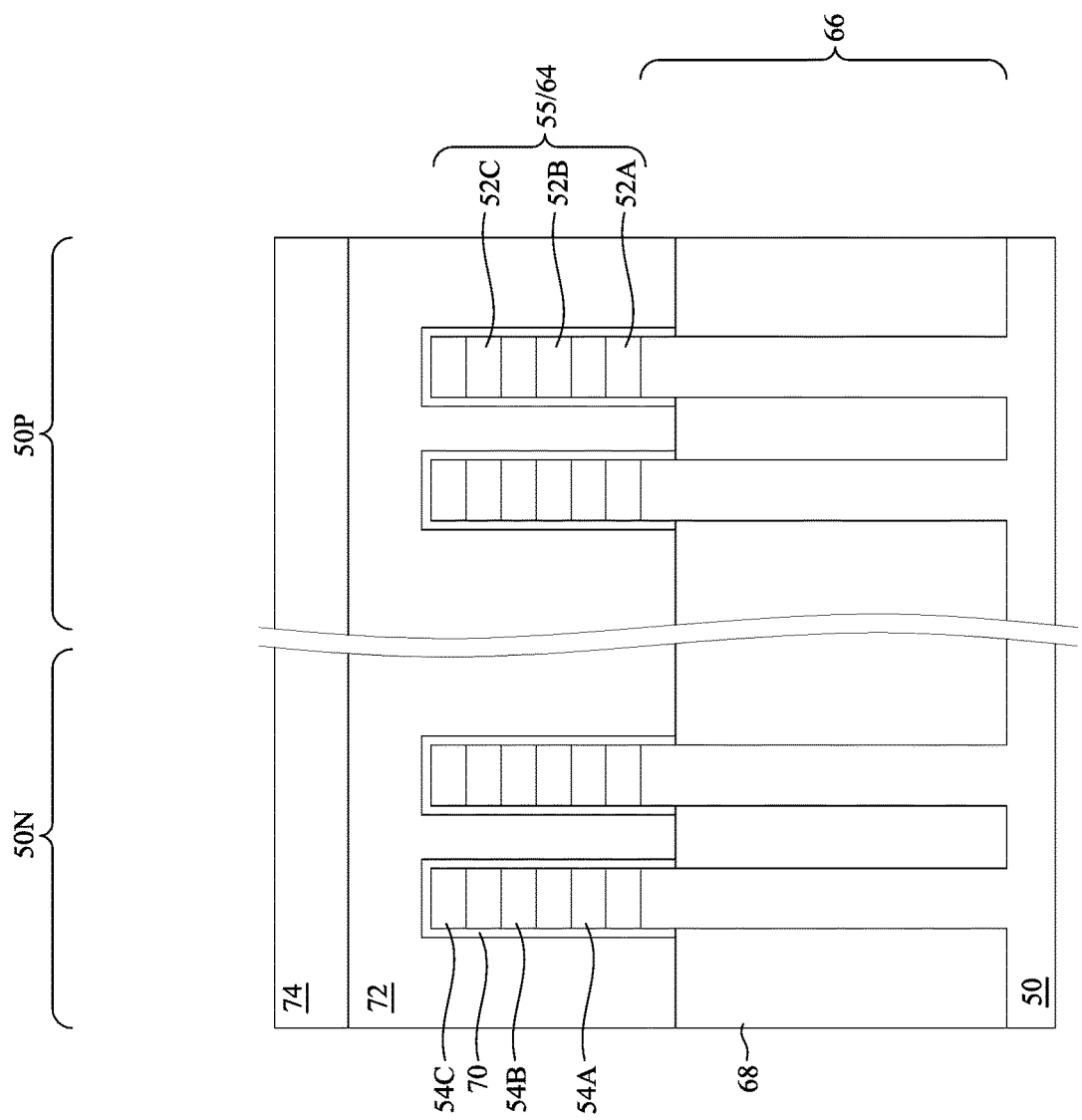

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
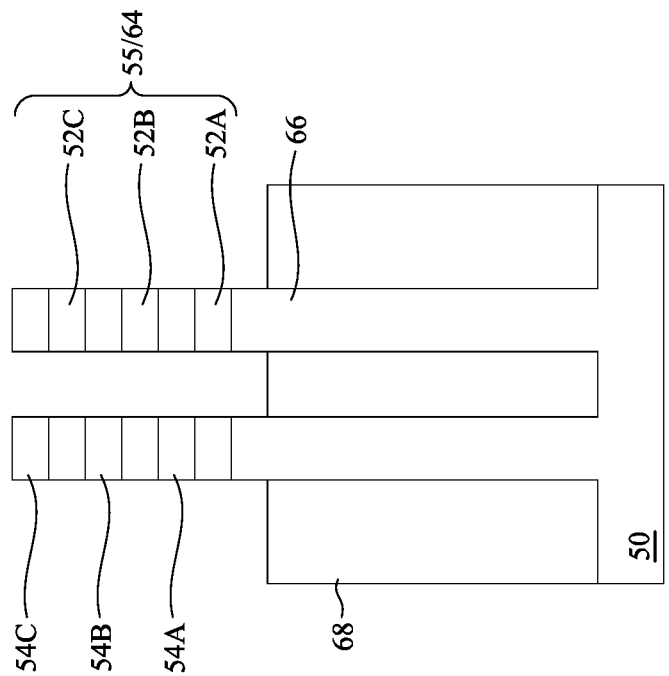
Figure 6A:
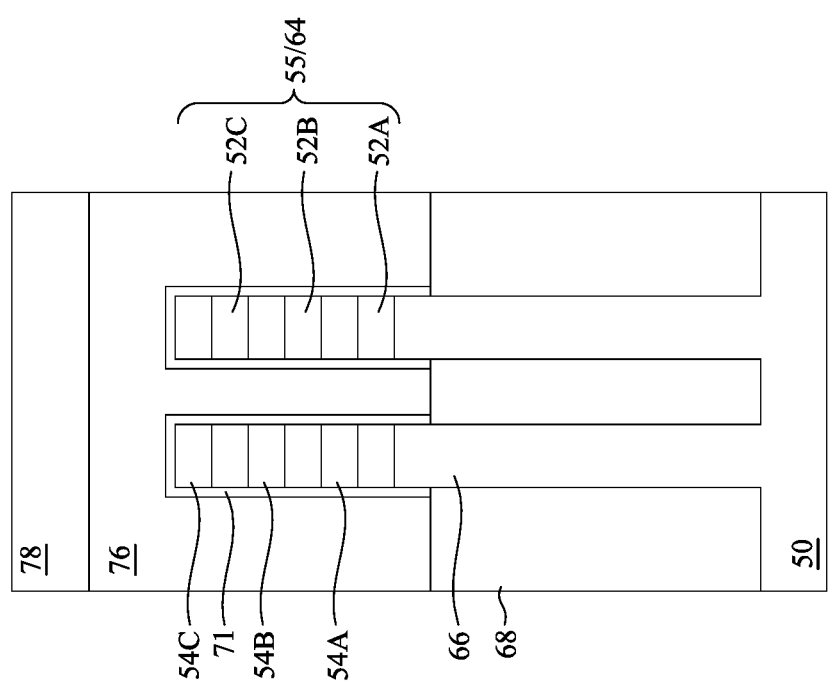
Figure 6C:
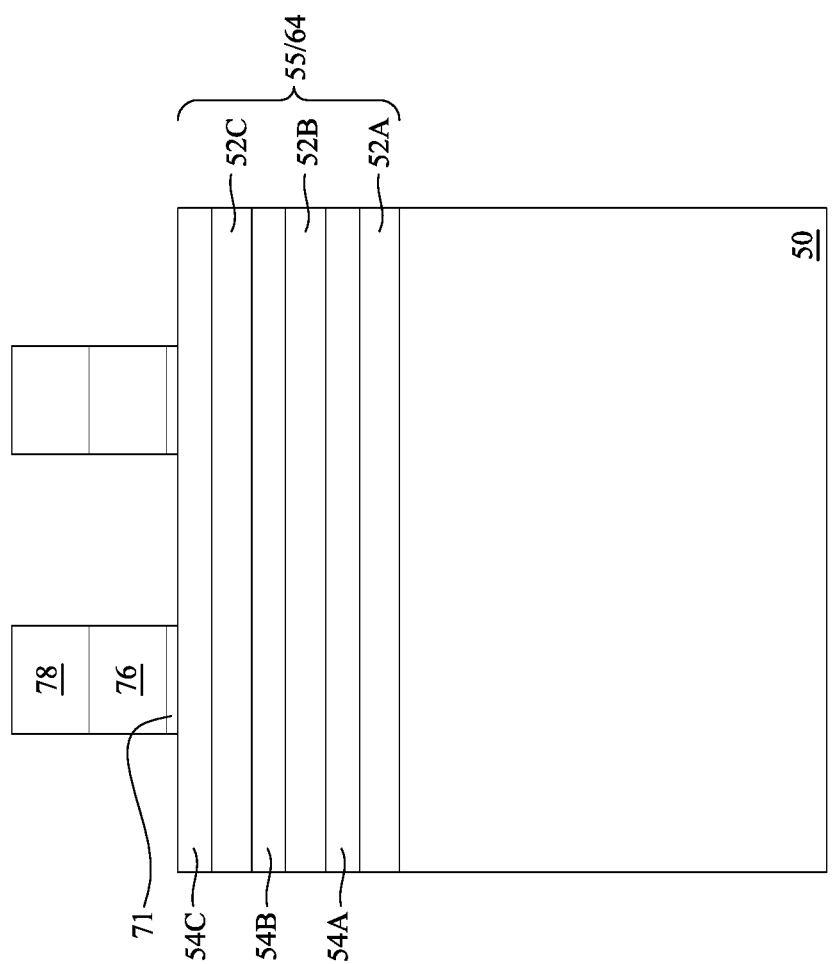

FIGS. 6A through 18C illustrate various additional steps in the manufacturing of embodiment devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
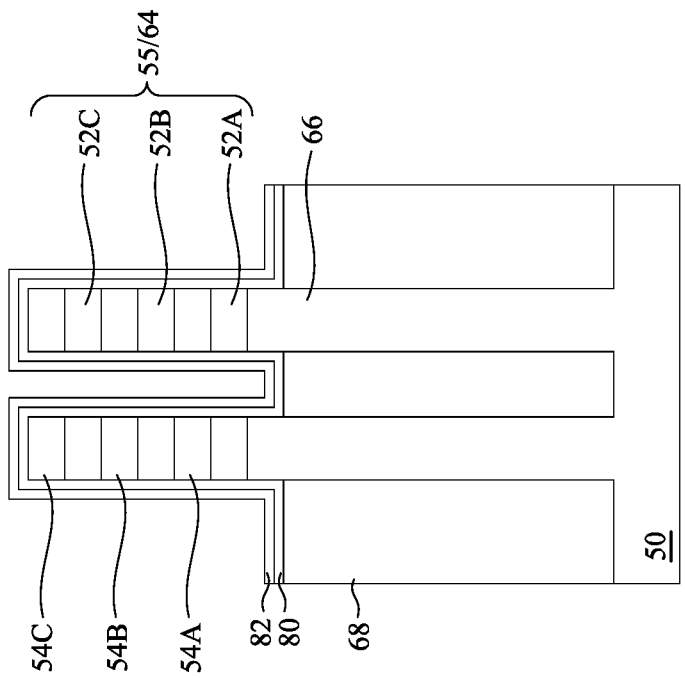
Figure 7A:
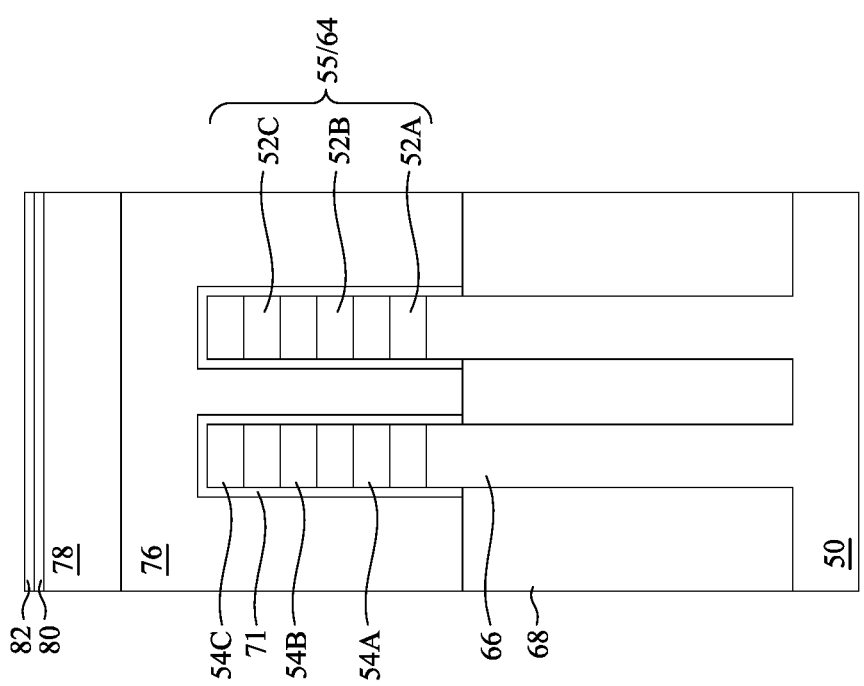
Figure 7C:
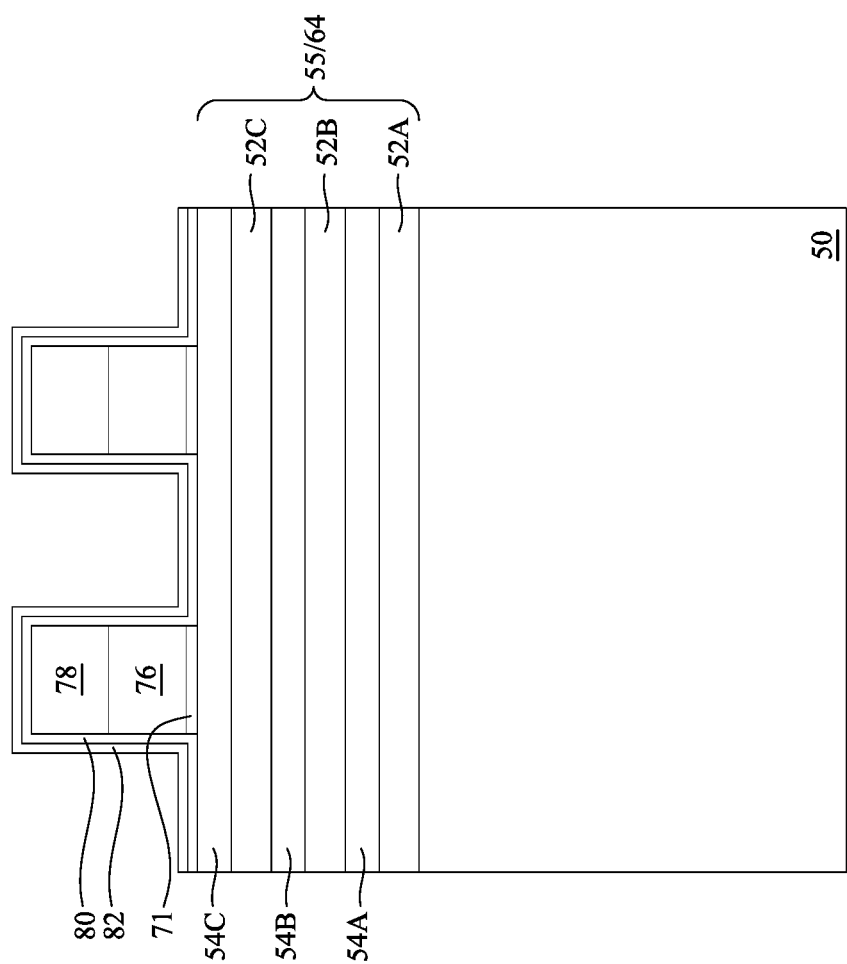

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
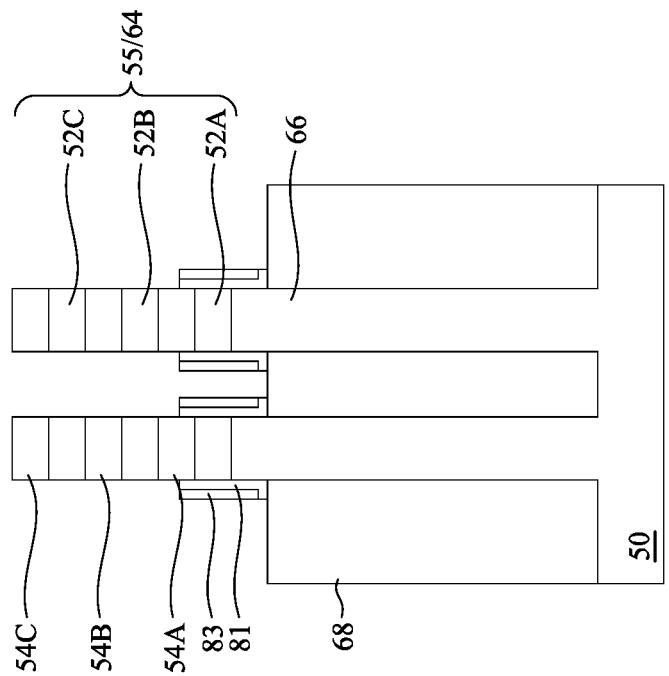
Figure 8A:
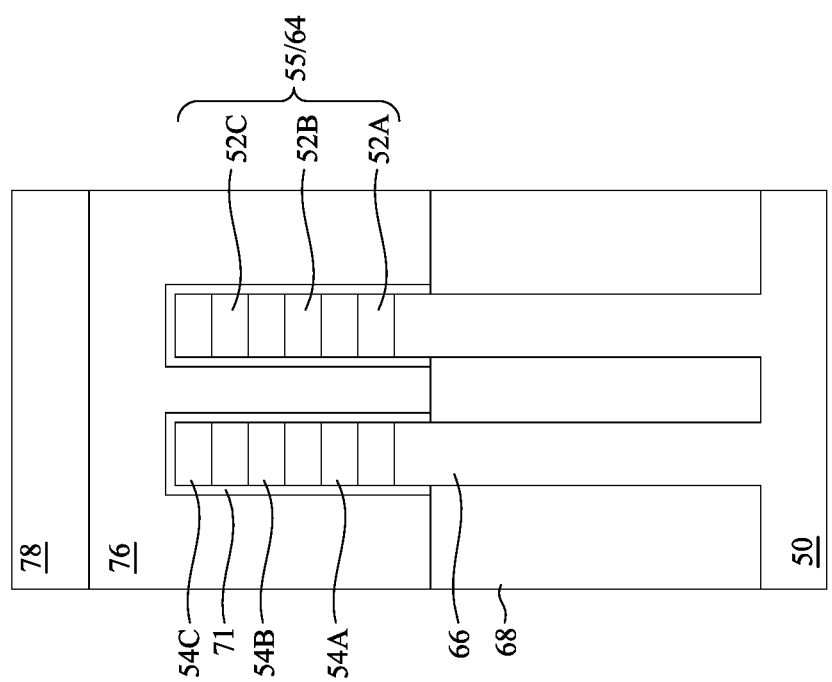
Figure 8C:
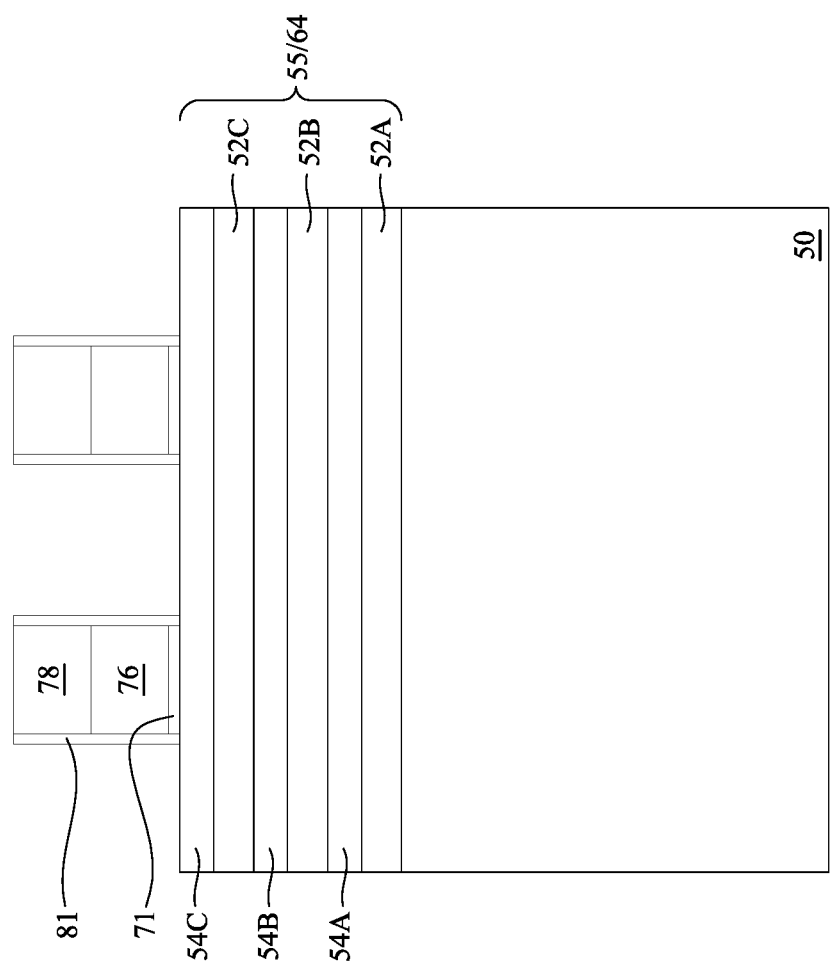

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-align subsequently formed source/drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

In FIGS. 9A through 9C, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10B:
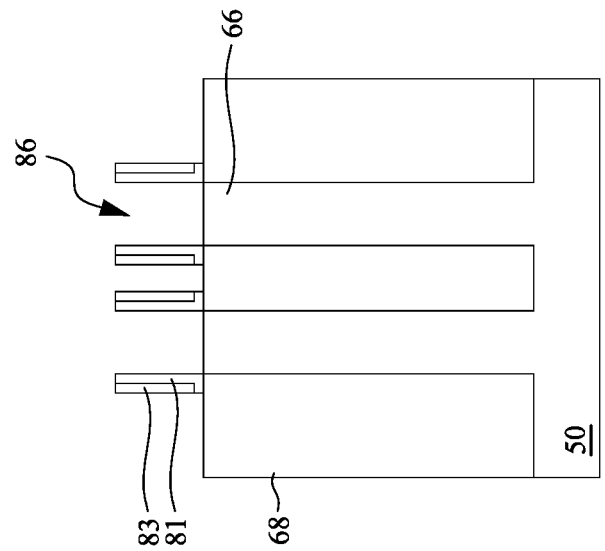
Figure 10A:
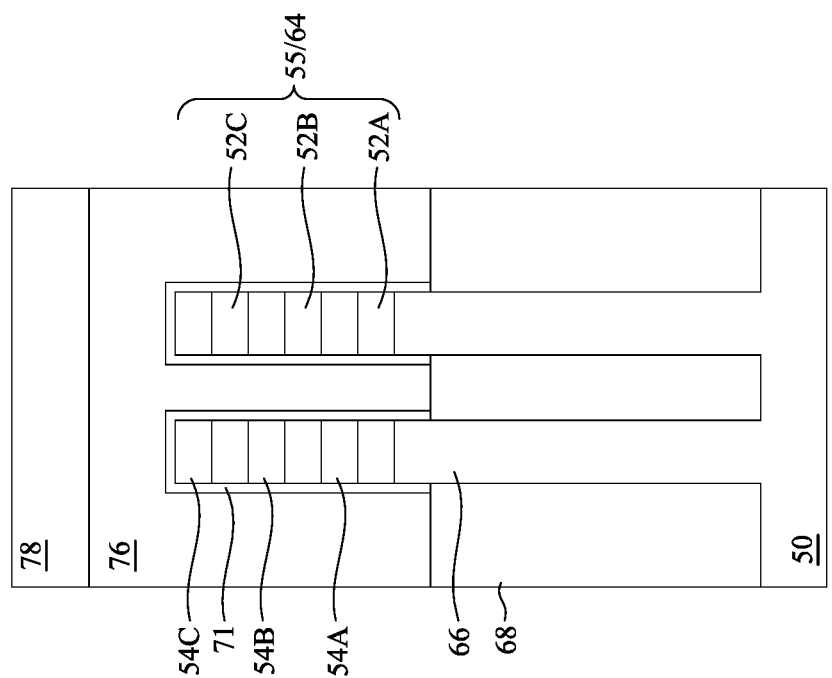
Figure 10C:
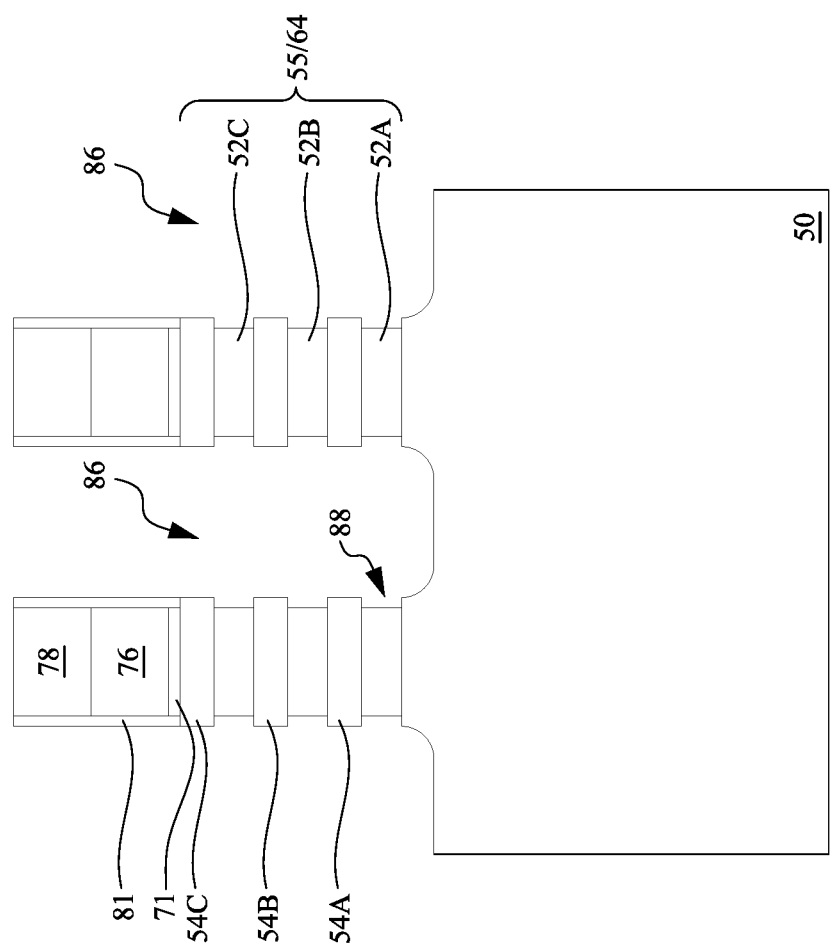

In FIGS. 10A through 10C, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions will be formed in the first recesses 86, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11D:
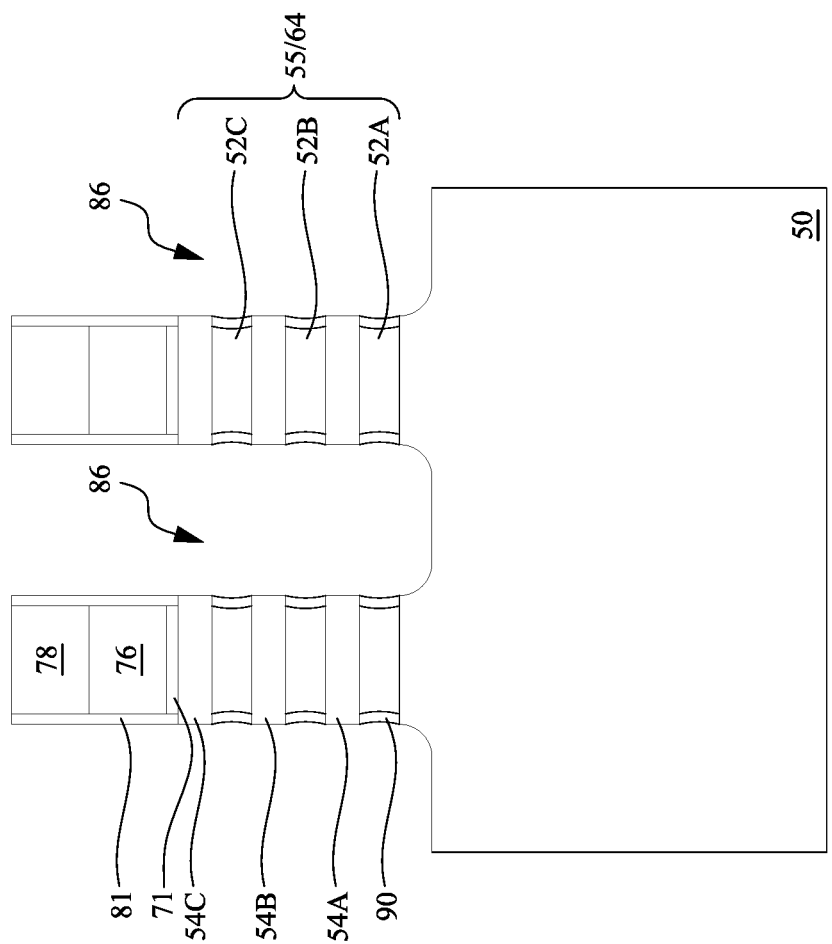

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

Figure 12B:
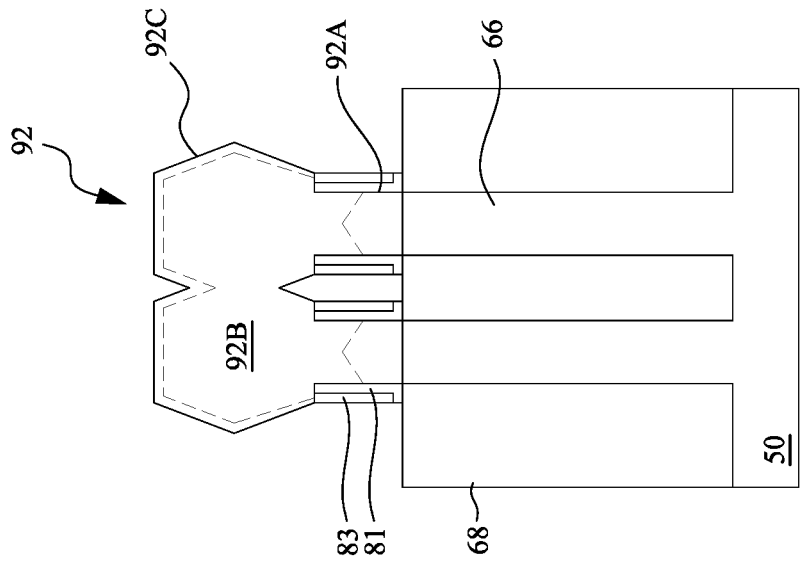
Figure 12A:
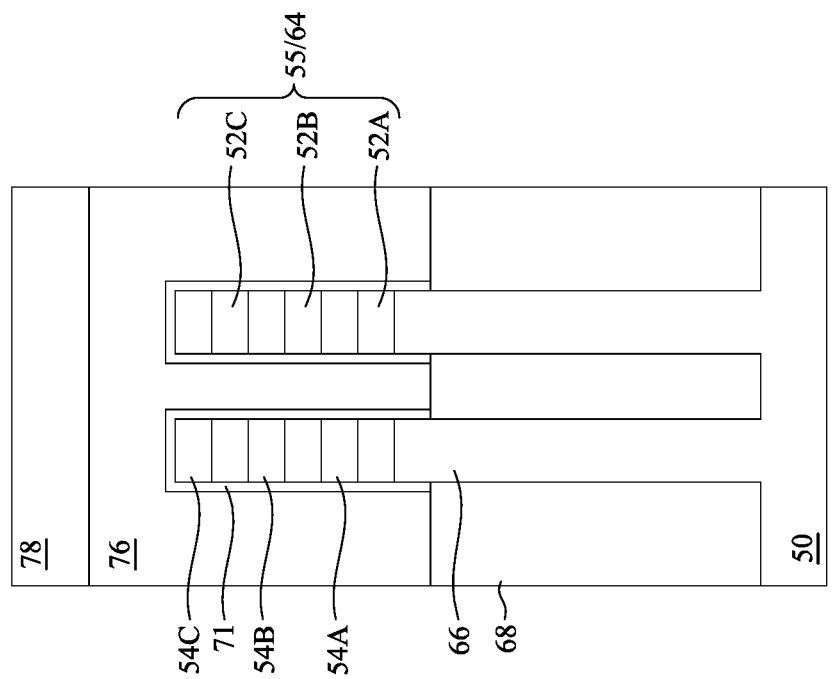
Figure 12C:
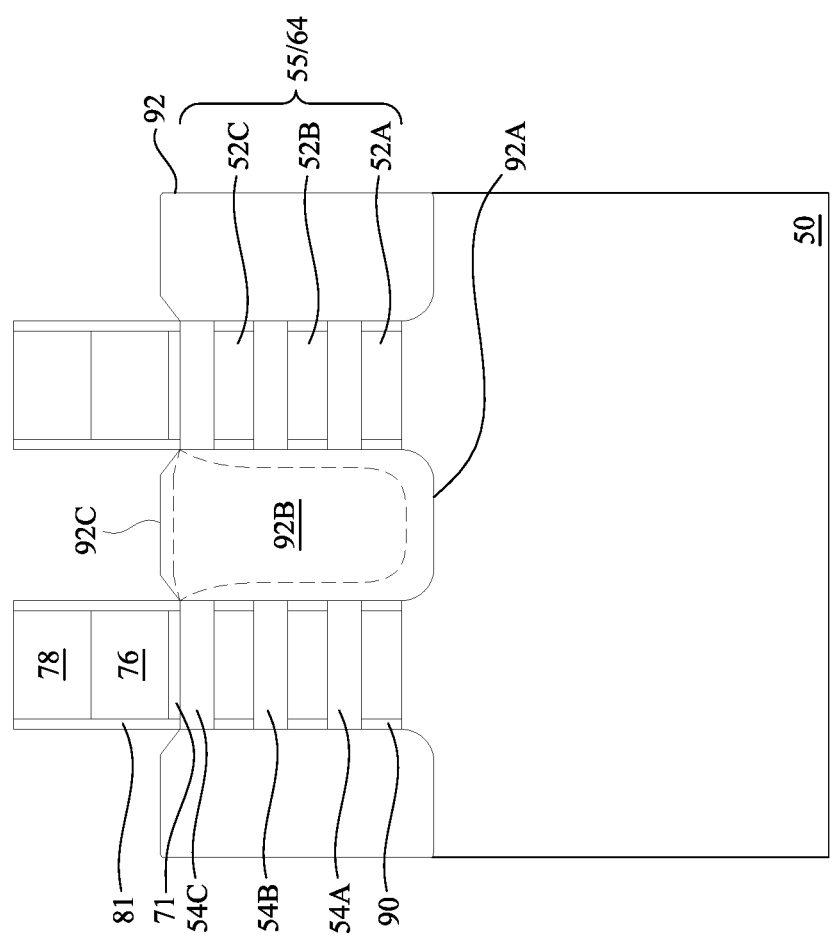

In FIGS. 12A through 12E, epitaxial source/drain regions 92 are formed in the first recesses 86. In some embodiments, the epitaxial source/drain regions 92 may exert stress on the second nanostructures 54, thereby improving performance. As illustrated in FIG. 12C, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the first nanostructures 52 by appropriate lateral distances so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may have surfaces raised from respective upper surfaces of the nanostructures 55 and may have facets.

The epitaxial source/drain regions 92, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

Figure 12D:
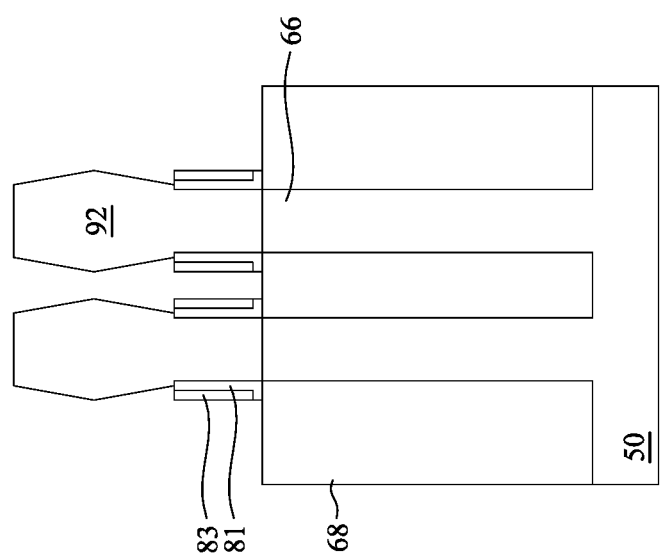

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 12B. In other embodiments, adjacent epitaxial source/drain regions 92 remain separated after the epitaxy process is completed as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
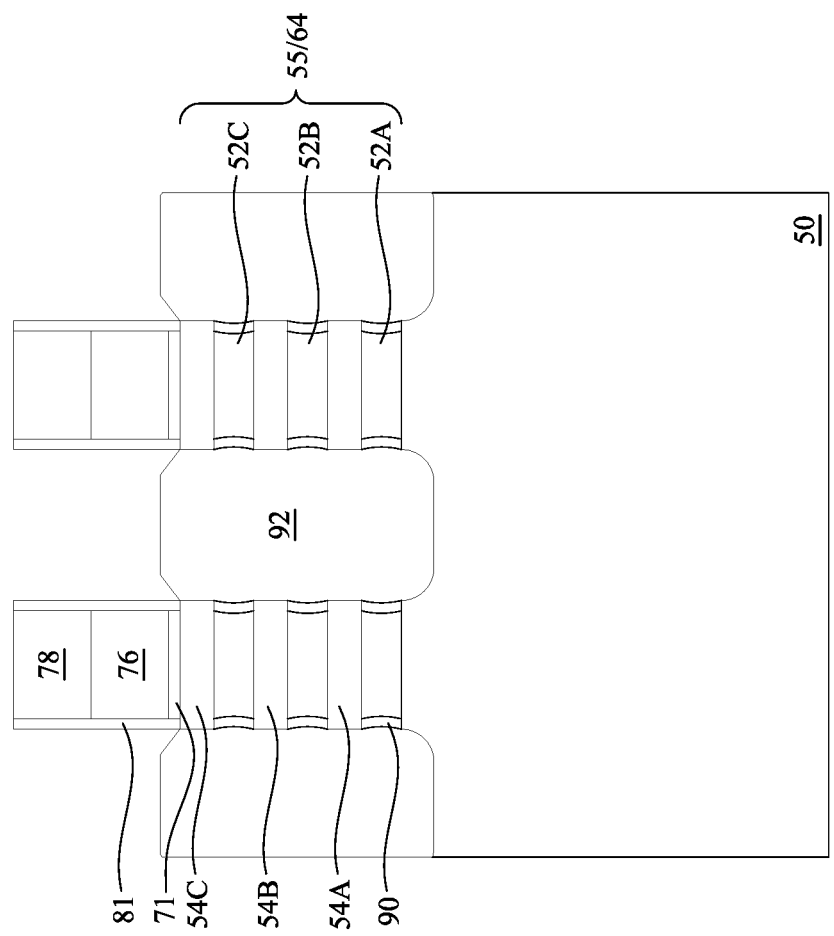

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
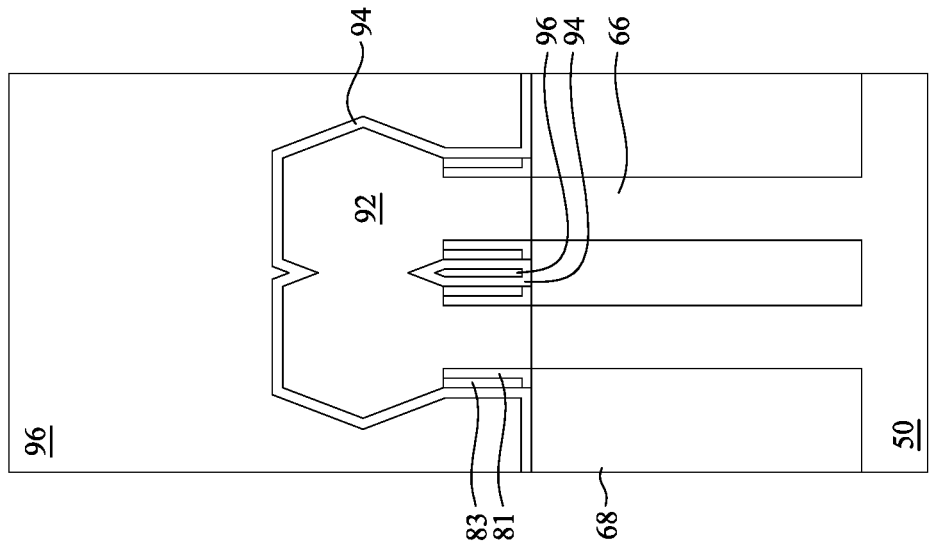
Figure 13A:
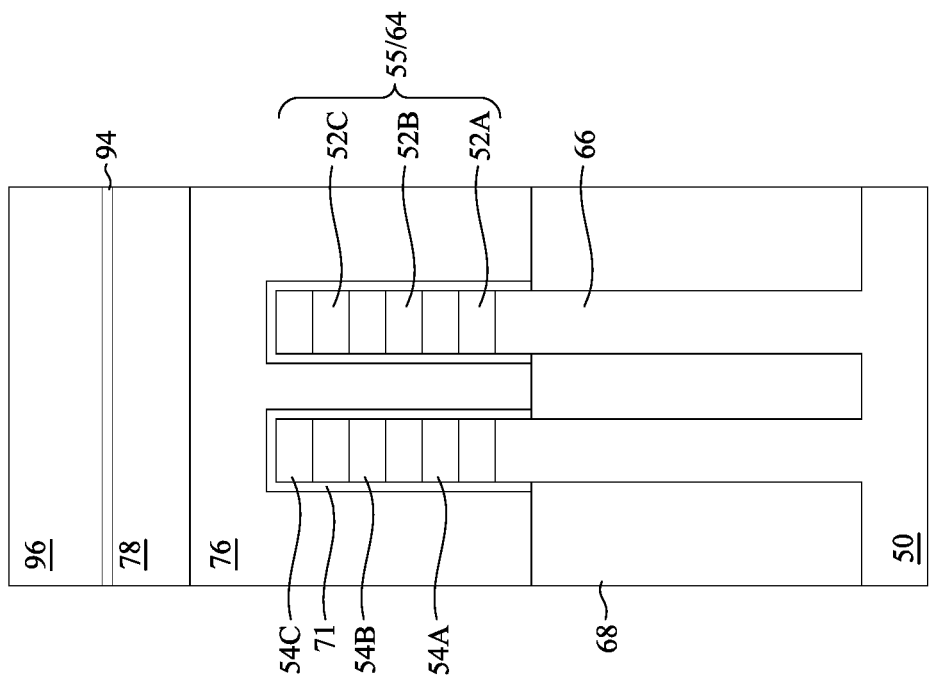
Figure 13C:
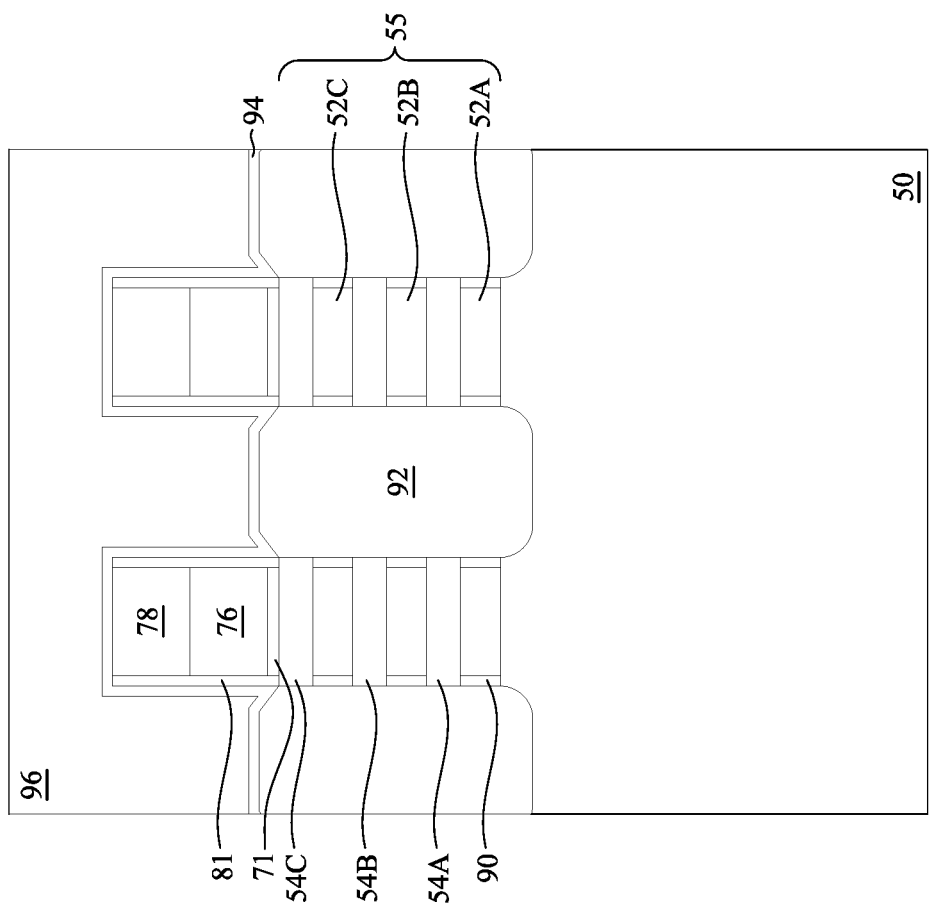

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
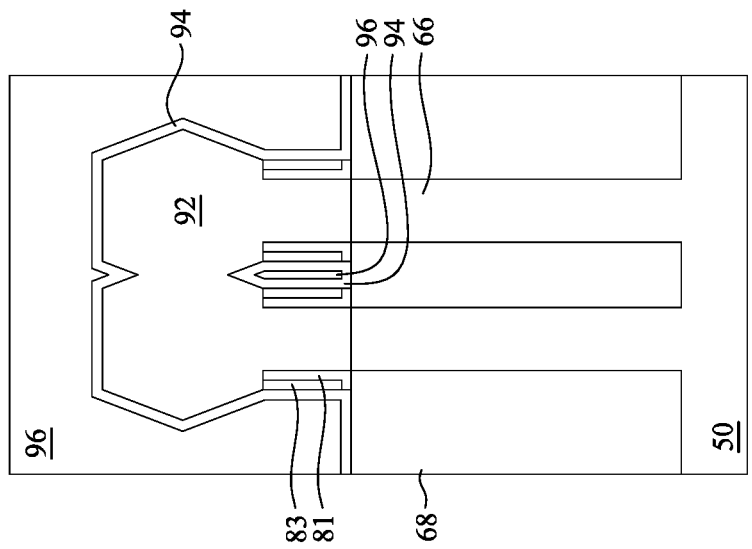
Figure 14A:
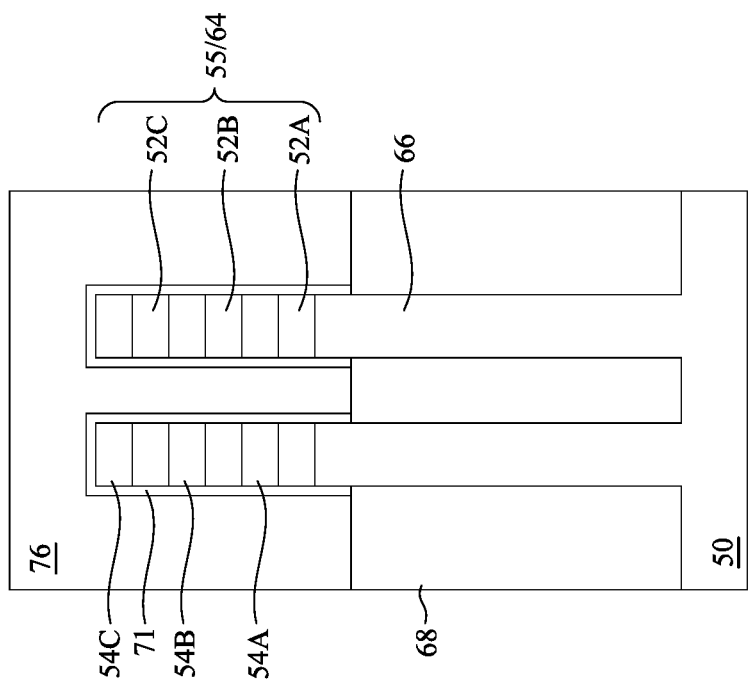
Figure 14C:
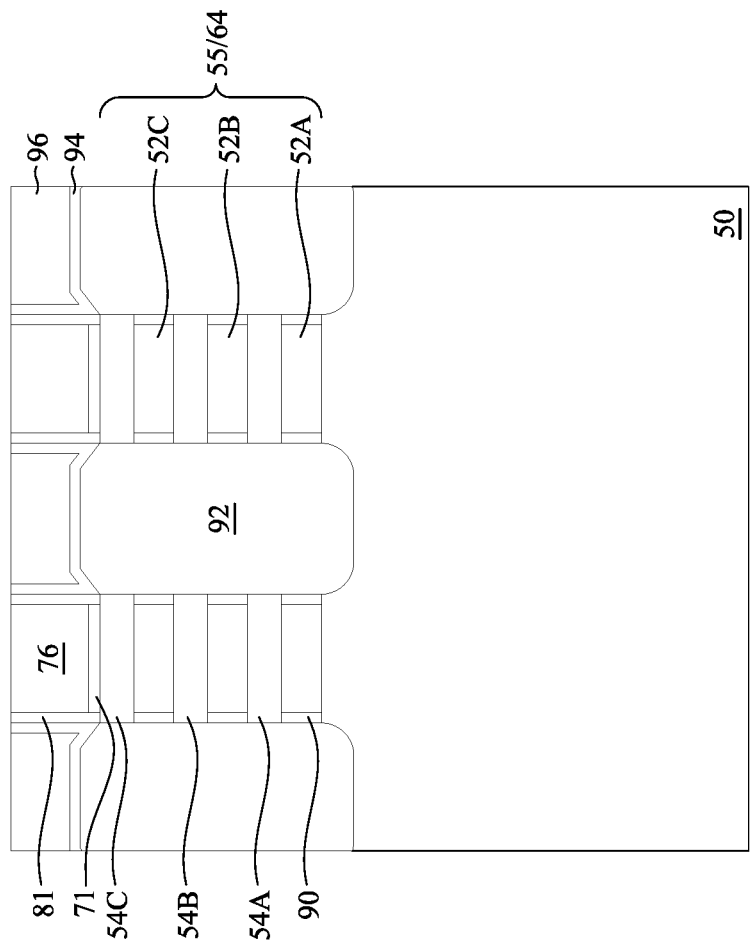

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
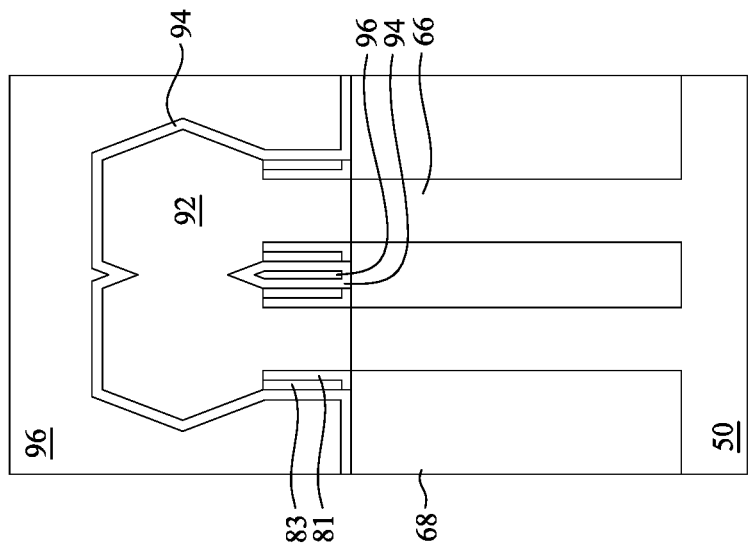
Figure 15A:
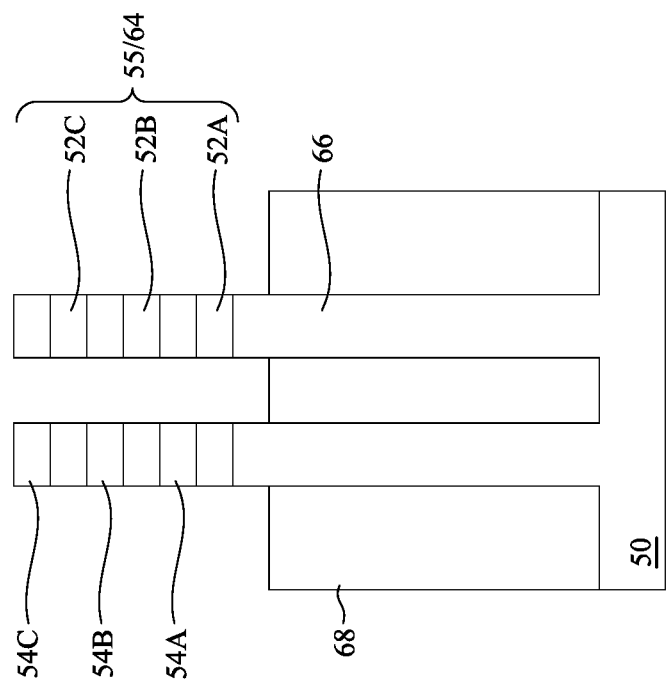
Figure 15C:
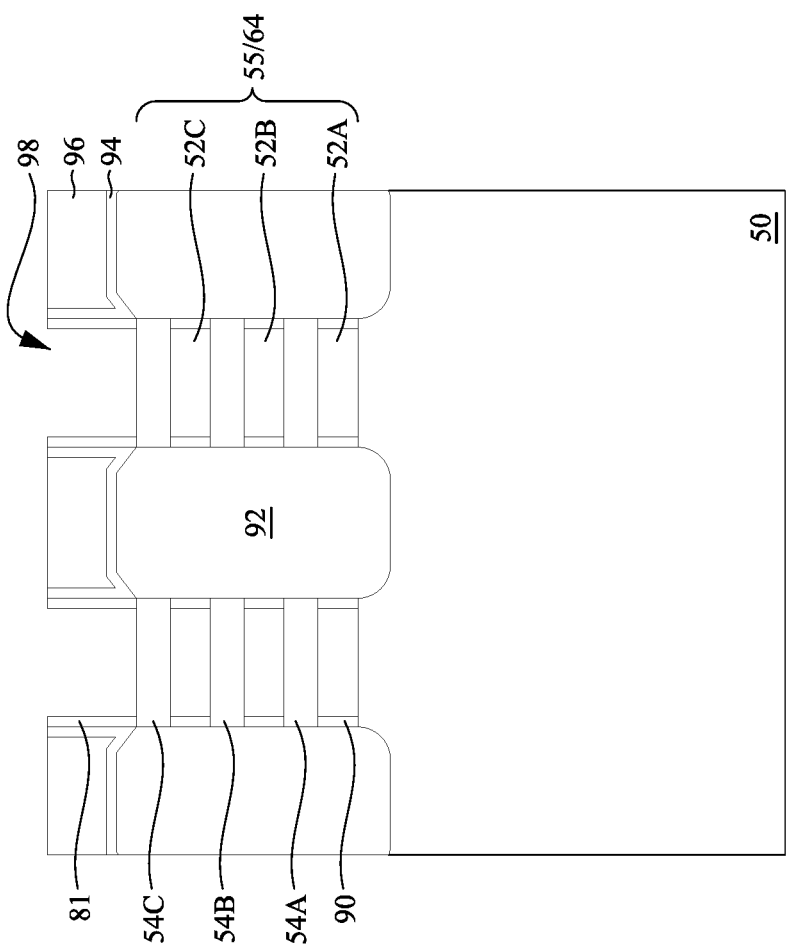

In FIGS. 15A through 15C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
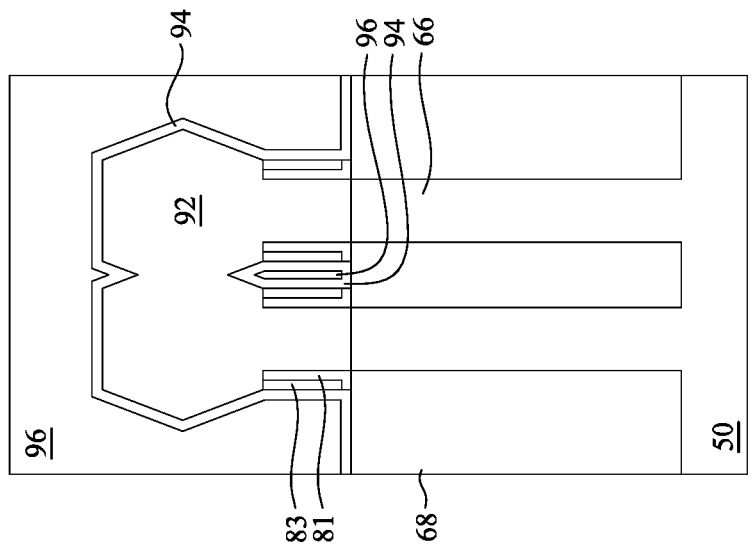
Figure 16A:
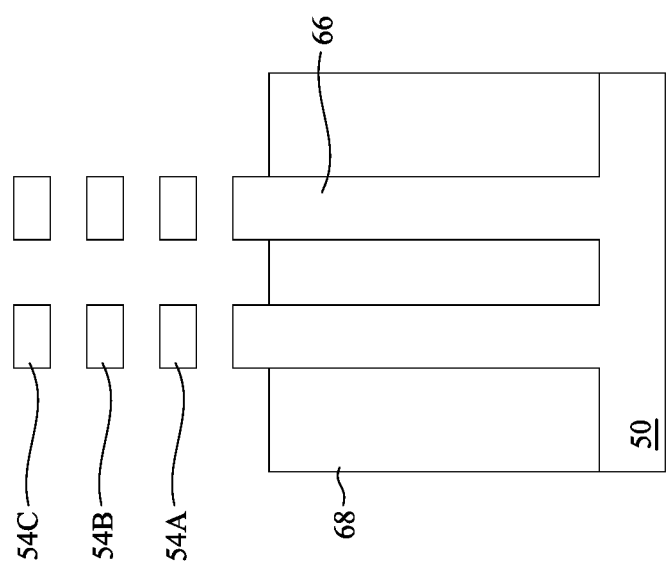
Figure 16C:
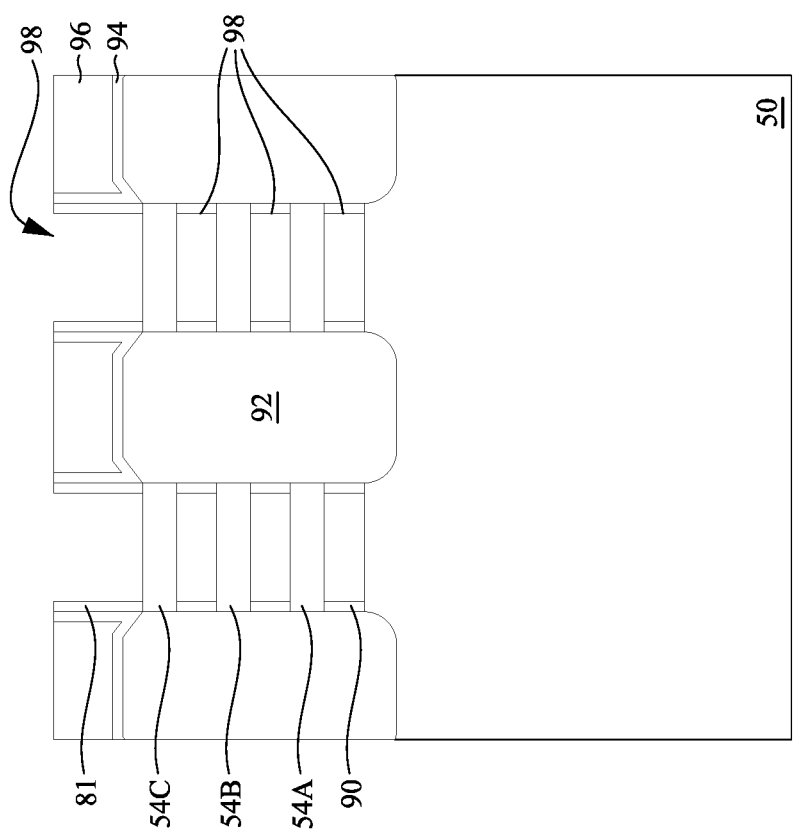

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52.

Figure 17B:
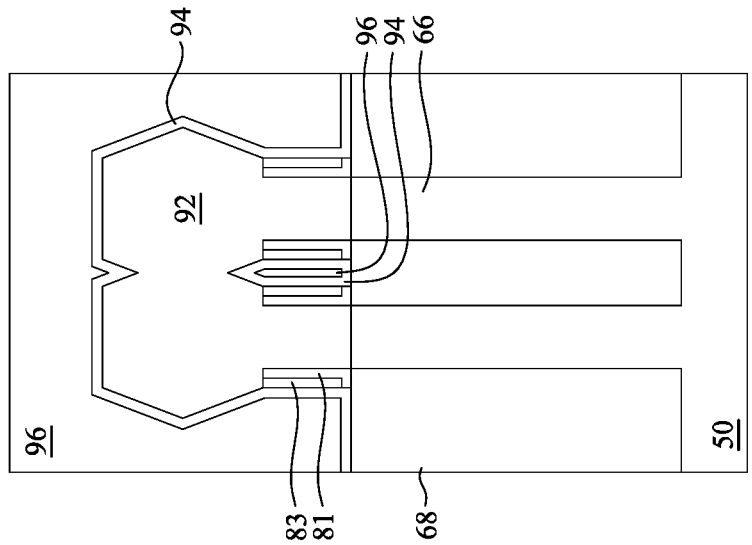
Figure 17A:
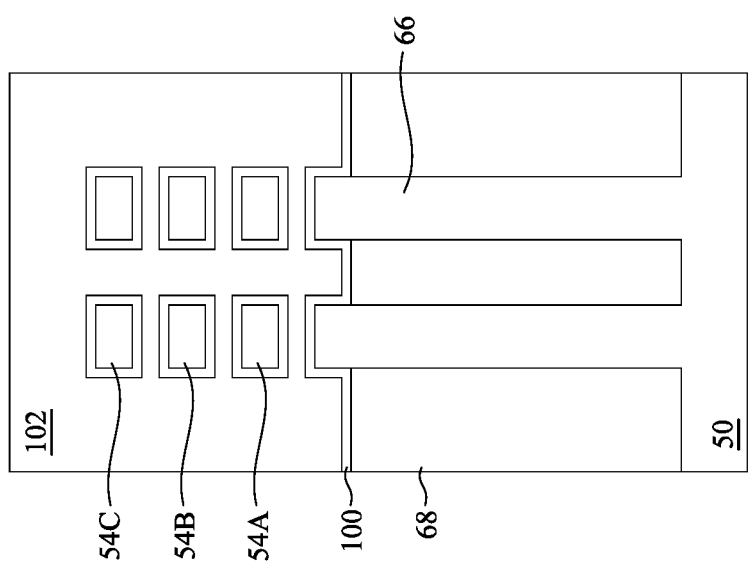
Figure 17C:
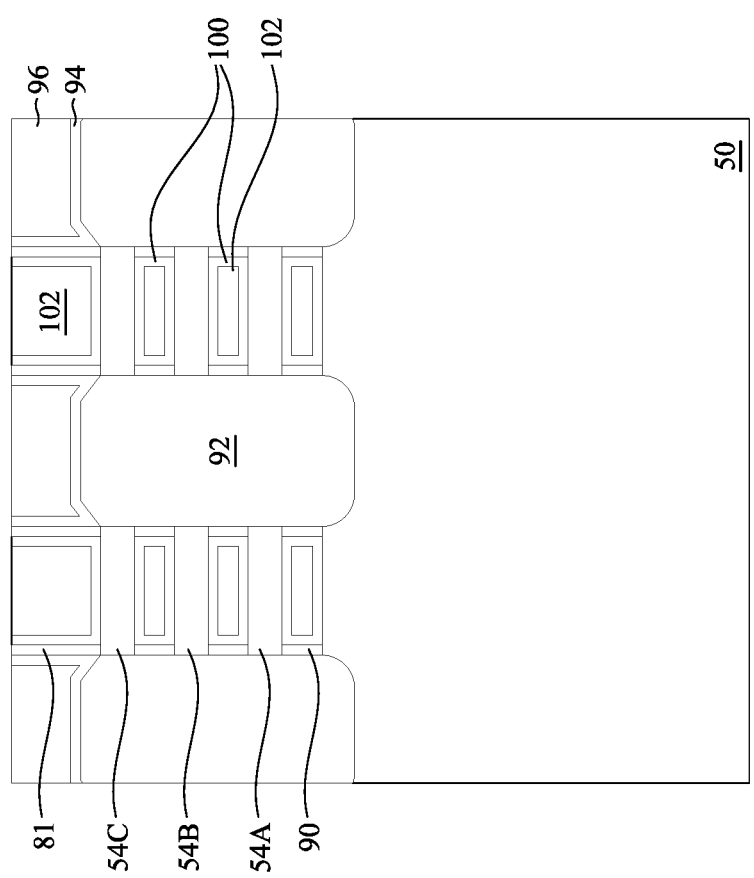

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited between adjacent ones of the second nanostructures 54 and between the second nanostructure 54A and the substrate 50.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18C:
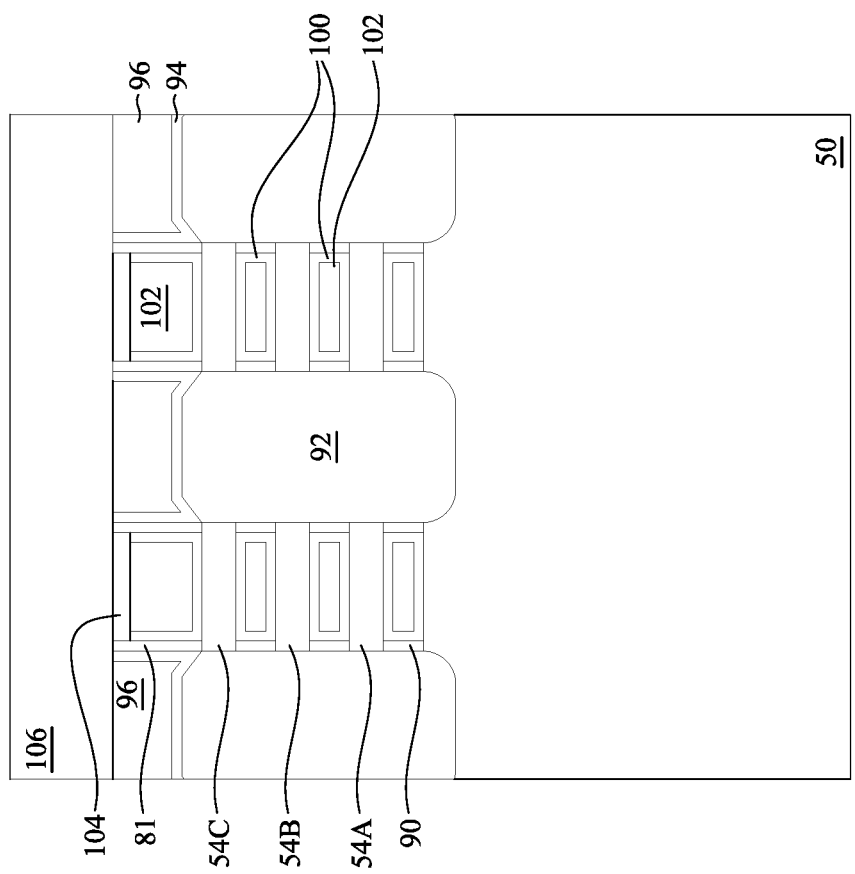

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
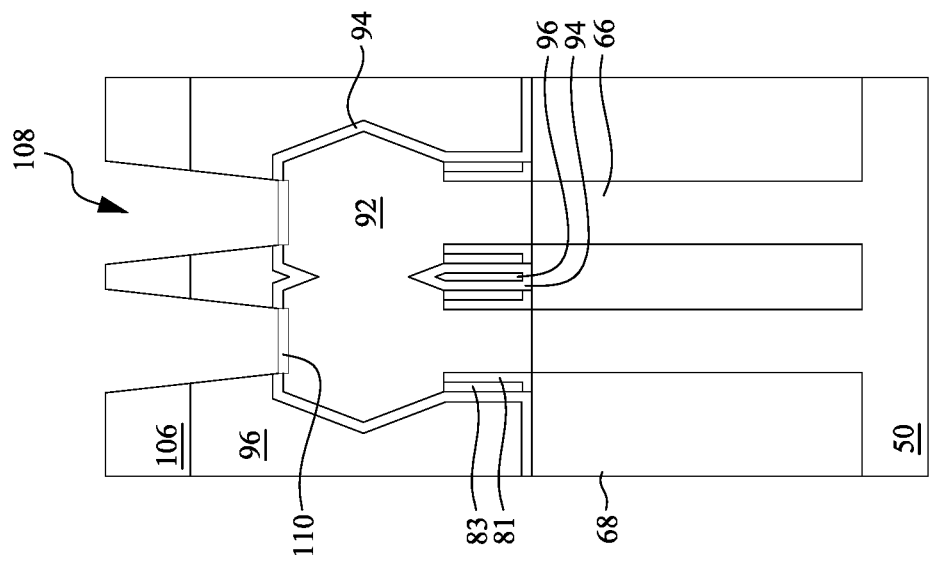
Figure 19A:
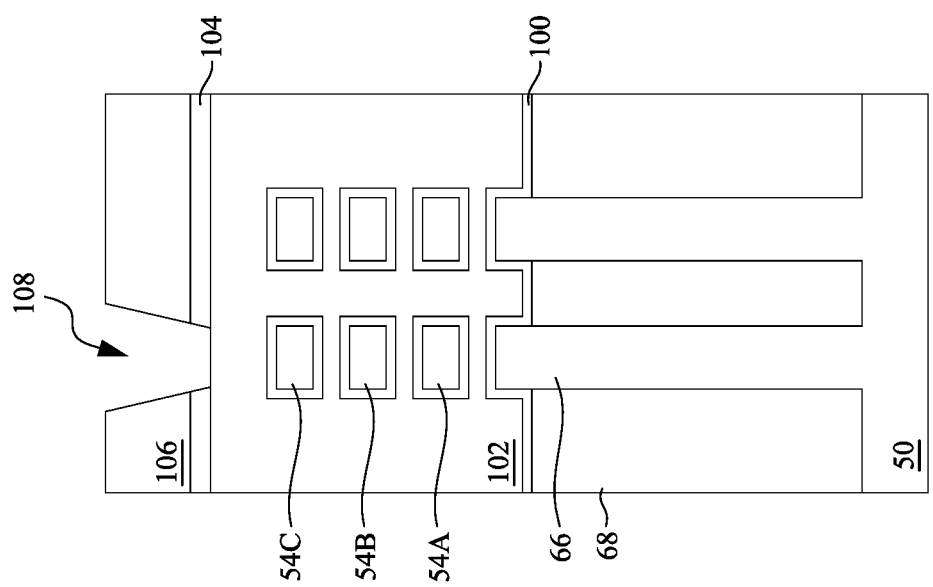
Figure 19C:
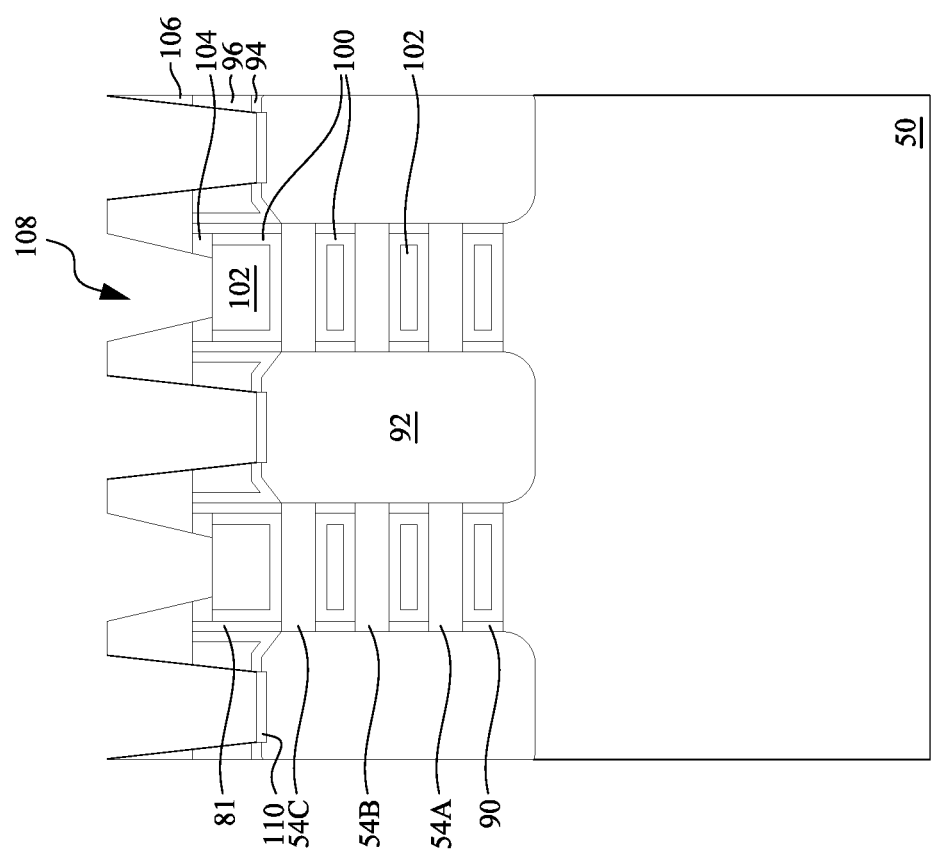

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have thicknesses ranging from about 2 nm to about 10 nm.

Figure 20B:
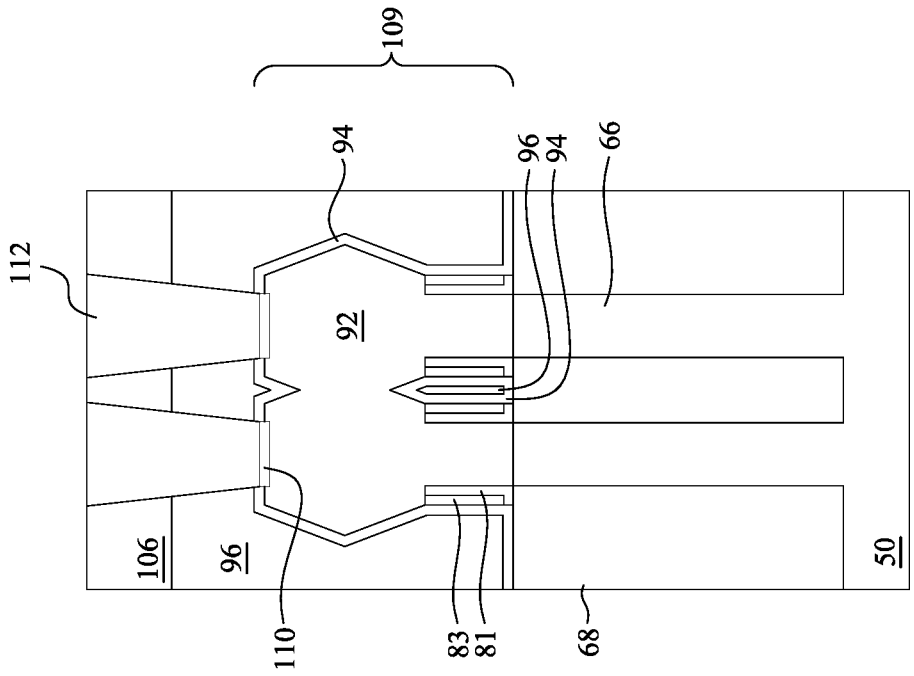
Figure 20A:
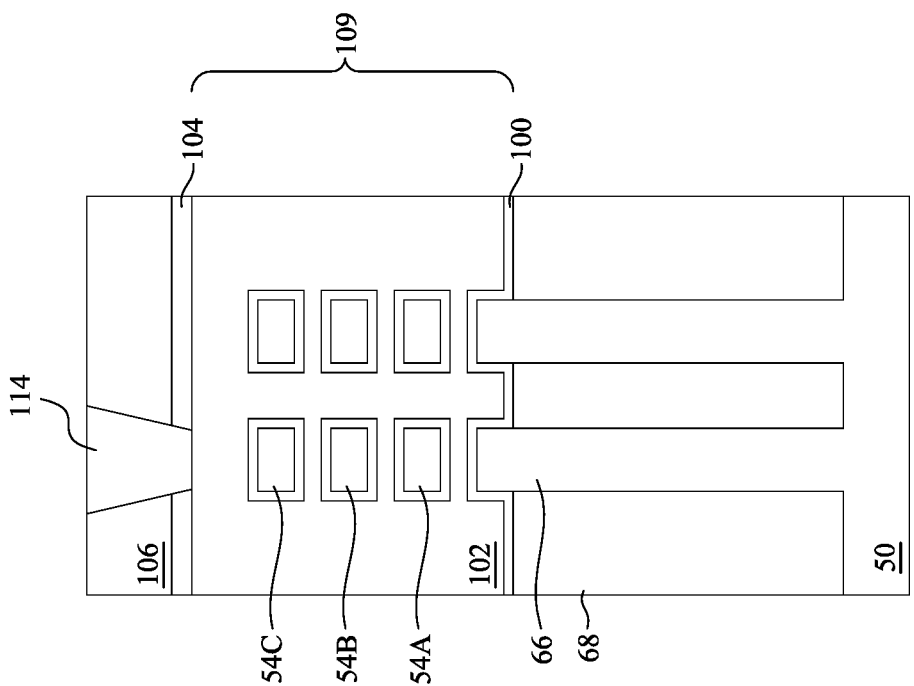
Figure 20C:
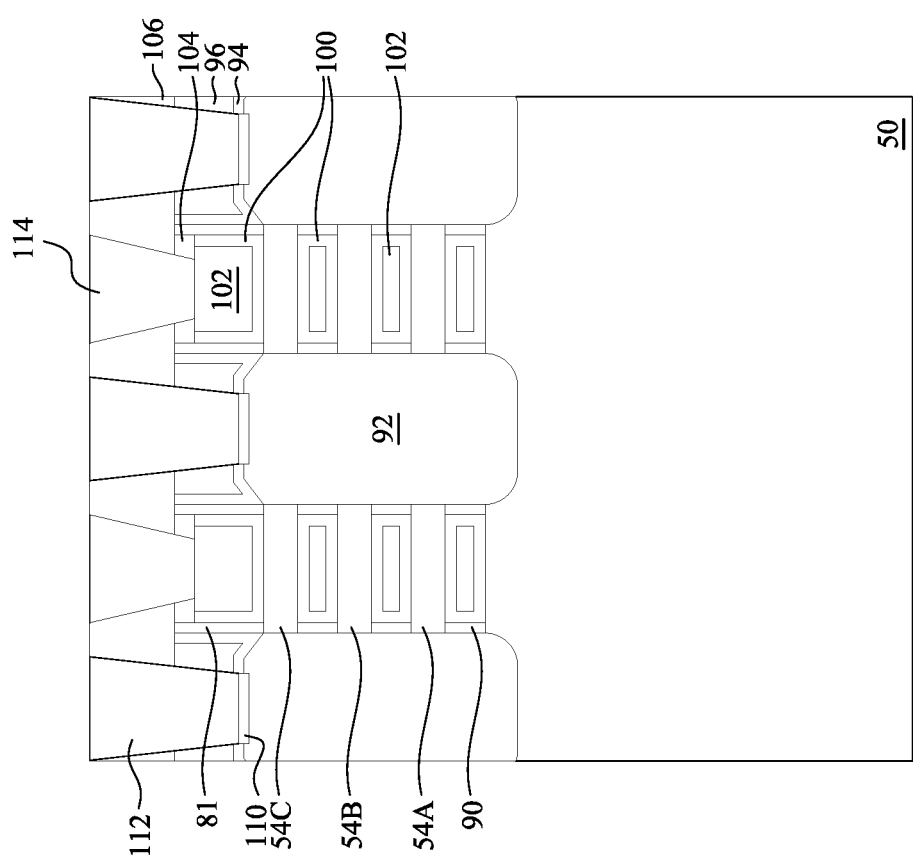

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 21A through 21D) being formed over a front-side thereof and a second interconnect structure (such as the backside interconnect structure 136, discussed below with respect to FIGS. 28A through 28C) being formed over a backside thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21D).

FIGS. 21A through 29C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 21A, 22A, 23A, 24A, 25A, 26A, 27A, 28A, and 29A illustrate reference cross-section A-A' illustrated in FIG. 1. FIGS. 21B, 22B, 23B, 24B, 25B, 26B, 27B, 28B, and 29B illustrate reference cross-section B-B' illustrated in FIG. 1. FIGS. 21C, 21D, 22C, 23C, 24C, 25C, 26C, 27C, 28C, and 29C illustrate reference cross-section C-C' illustrated in FIG. 1. The process steps described in FIGS. 21A through 29C may be applied to both the n-type region 50N and the p-type region 50P. As noted above, a back-side conductive feature (e.g., a backside via, a power rail, or the like) may be connected to one or more of the epitaxial source/drain regions 92. As such, the source/drain contacts 112 may be optionally omitted from the epitaxial source/drain regions 92.

In FIGS. 21A through 21D, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21D illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figures 21A, 21B:
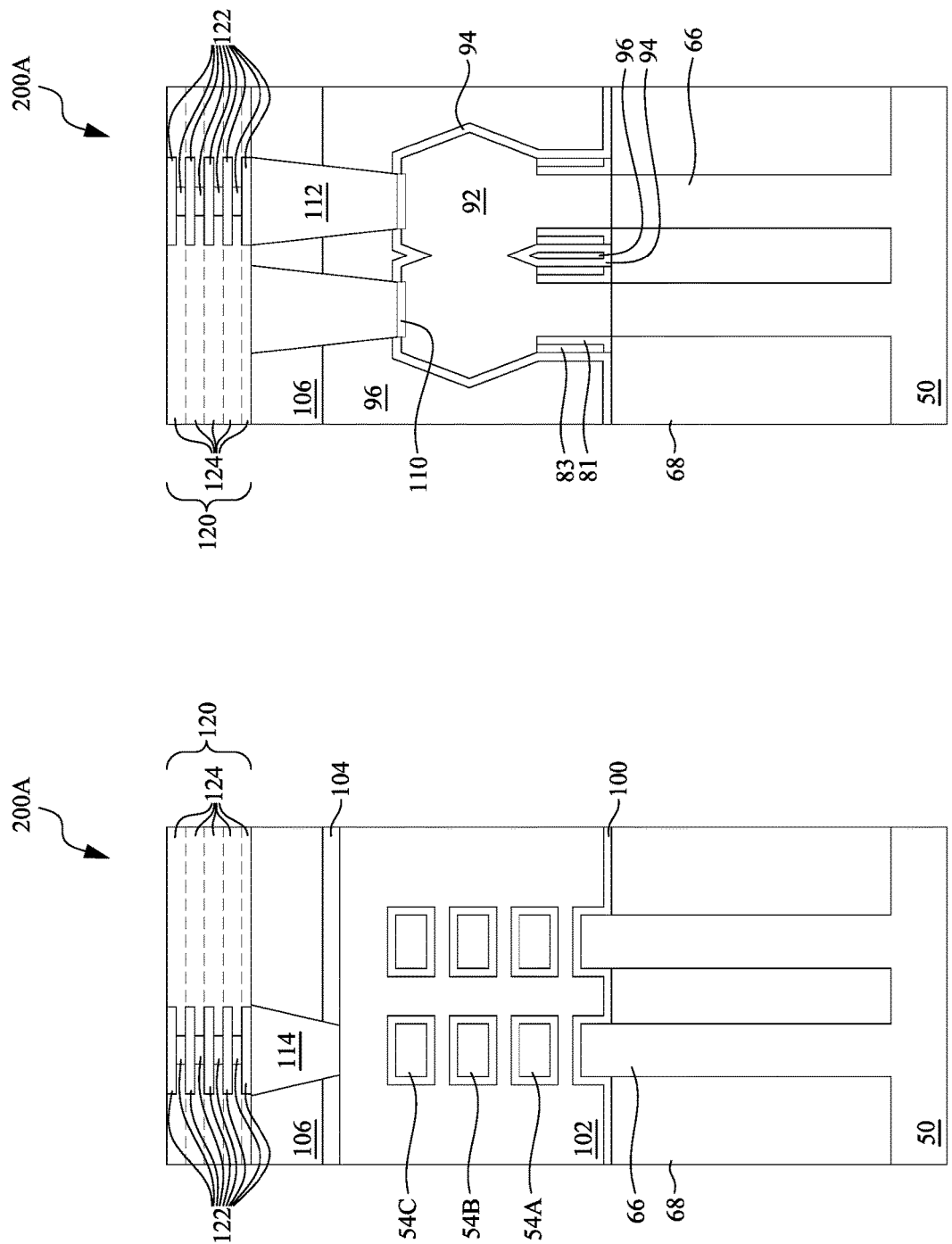
Figure 21C:
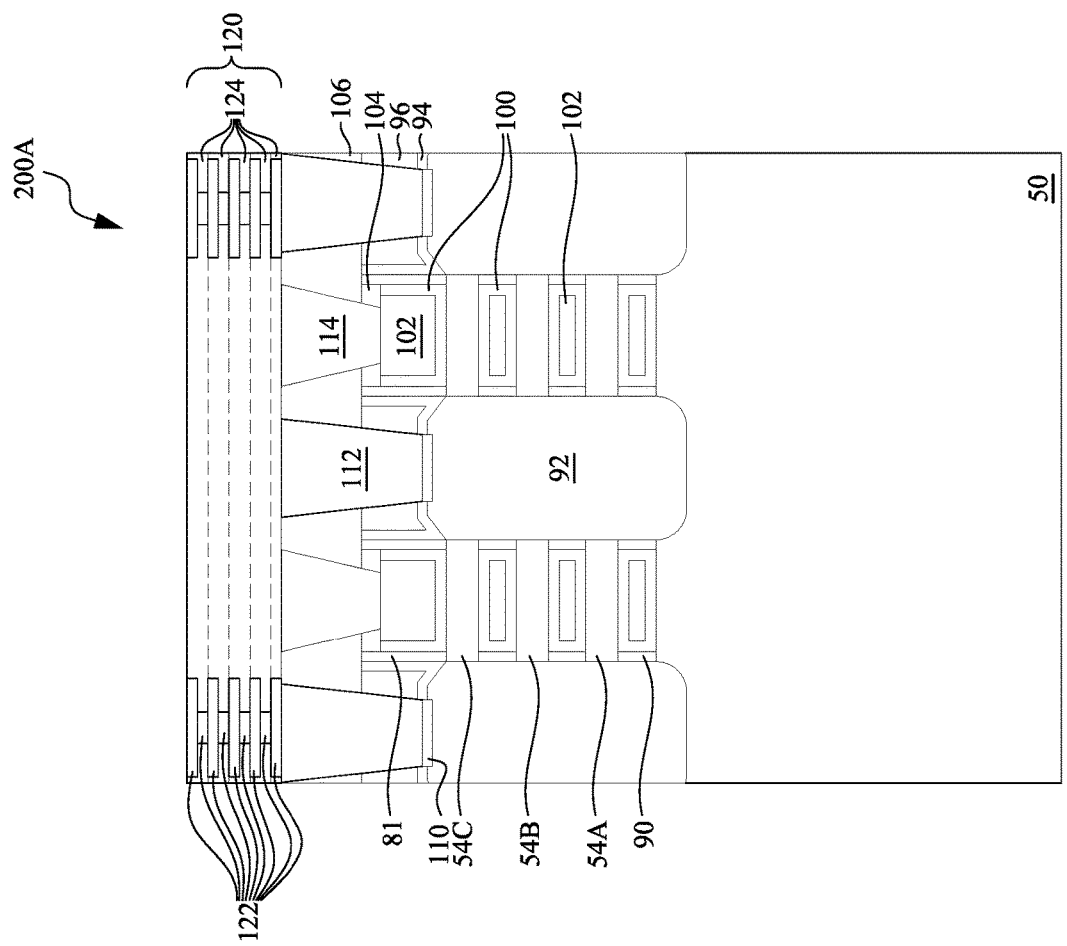

As will be discussed in greater detail below with respect to FIGS. 30 through 32 and 42 through 51, the structures illustrated in FIGS. 21A through 21C may be diced to form first integrated circuit dies 200A, which may subsequently be used to form packaged semiconductor devices (such as the first packaged semiconductor device 300A, discussed below with respect to FIGS. 30 through 32, the fourth packaged semiconductor device 300D, discussed below with respect to FIGS. 42 through 46, and the fifth packaged semiconductor device 300E, discussed below with respect to FIGS. 47 through 51). The dicing process may include sawing, a laser ablation method, an etching process, a combination thereof, or the like.

Figure 21D:
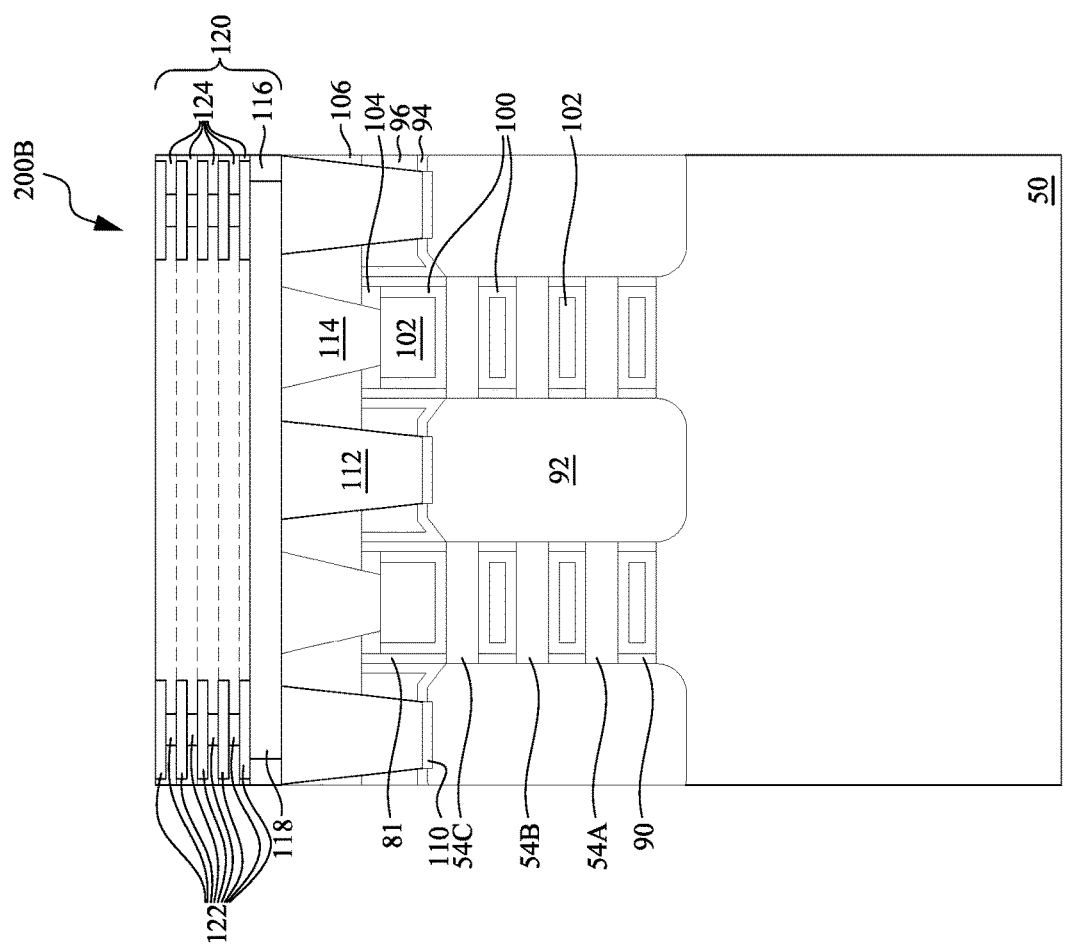

FIG. 21D illustrates an embodiment in which the front-side interconnect structure 120 further includes first conductive lines 118 and a second dielectric layer 116 formed over the second ILD 106, the source/drain contacts 112, and the gate contacts 114. As illustrated in FIG. 21D, the first conductive features 122 and the first dielectric layers 124 may be formed over the first conductive lines 118 and the second dielectric layer 116. The second dielectric layer 116 may be similar to the first dielectric layers 124. For example, the second dielectric layer 116 may be formed of a like material and using a like process as the first dielectric layers 124.

The first conductive lines 118 are formed in the second dielectric layer 116. Forming the first conductive lines 118 may include patterning recesses in the second dielectric layer 116 using a combination of photolithography and etching processes, for example. A pattern of the recesses in the second dielectric layer 116 may correspond to a pattern of the first conductive lines 118. The first conductive lines 118 are then formed by depositing a conductive material in the recesses. In some embodiments, the first conductive lines 118 comprise a metal layer, which may be a single layer or a composite layer comprising a plurality of sub-layers formed of different materials. In some embodiments, the first conductive lines 118 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The first conductive lines 118 may be formed using, for example, CVD, ALD, PVD, plating or the like. The first conductive lines 118 may be electrically coupled to the epitaxial source/drain regions 92 through the source/drain contacts 112 and the first silicide regions 110 and may be electrically coupled to the gate electrodes 102 through the gate contacts 114.

A planarization process (e.g., a CMP, a grinding, an etch-back, or the like) may be performed to remove excess portions of the first conductive lines 118 formed over the second dielectric layer 116. In some embodiments, the first conductive lines 118 are front-side power rails, which are conductive lines that electrically connect the epitaxial source/drain regions 92 and/or the gate electrode 102 to a reference voltage, a supply voltage, or the like.

As will be discussed in greater detail below with respect to FIGS. 30 through 36, the structures illustrated in FIG. 21D may be diced to form second integrated circuit dies 200B, which may subsequently be used to form packaged semiconductor devices (such as the first packaged semiconductor device 300A, discussed below with respect to FIGS. 30 through 32 and the second packaged semiconductor device 300B, discussed below with respect to FIGS. 33 through 36). The dicing process may include sawing, a laser ablation method, an etching process, a combination thereof, or the like.

Figure 22B:
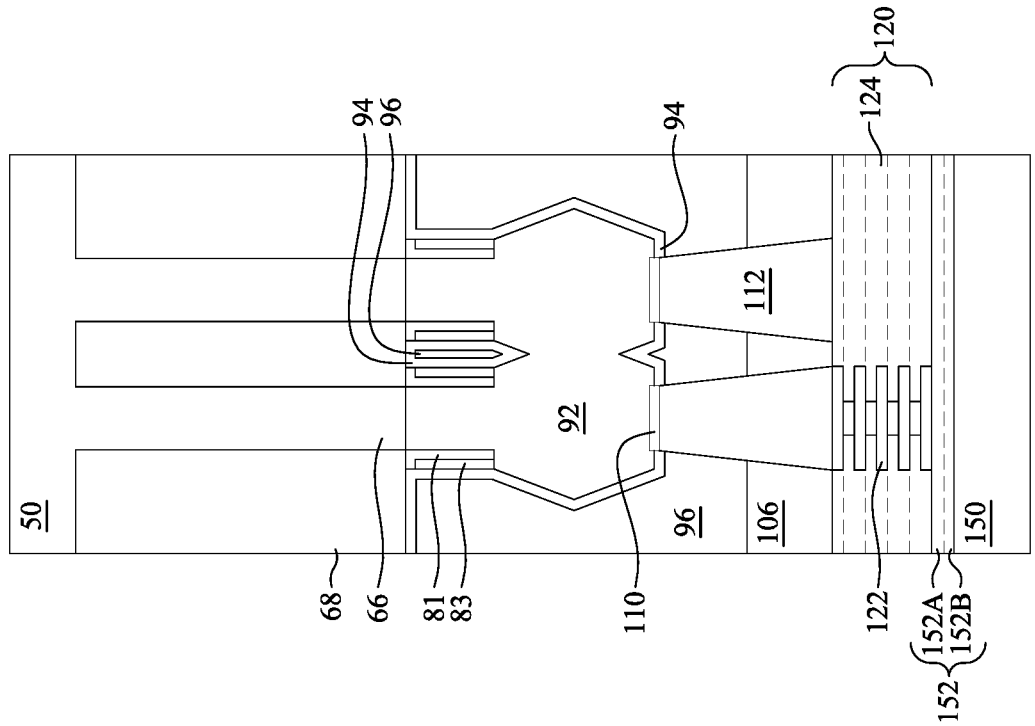
Figure 22A:
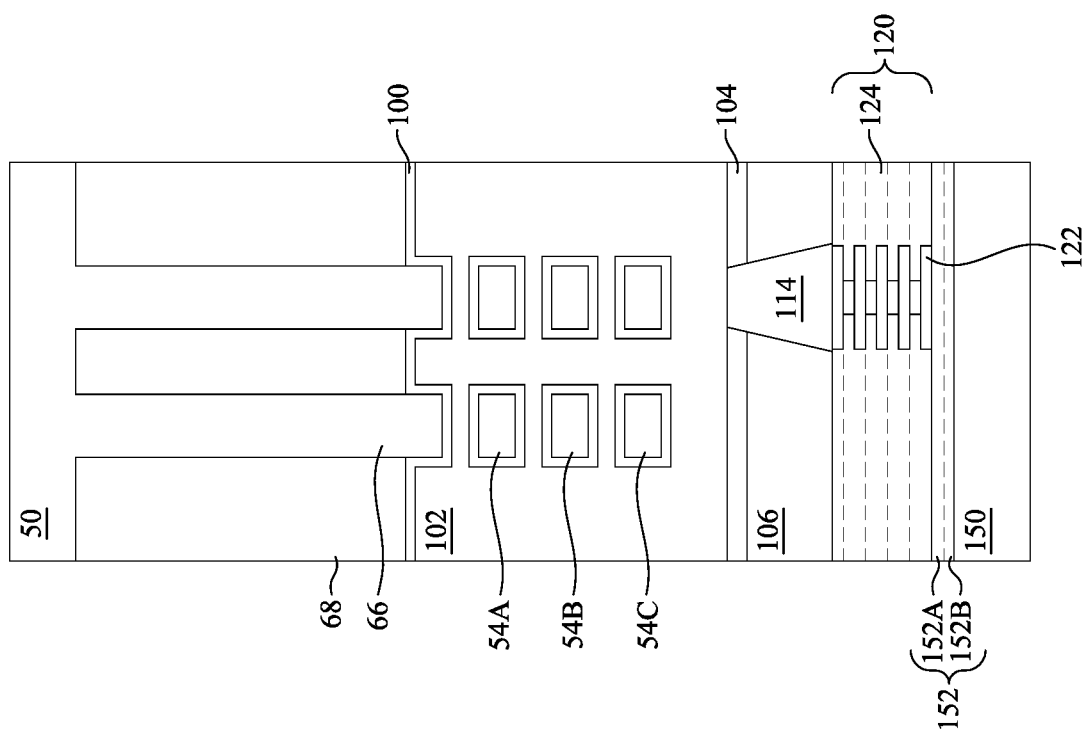
Figure 22C:
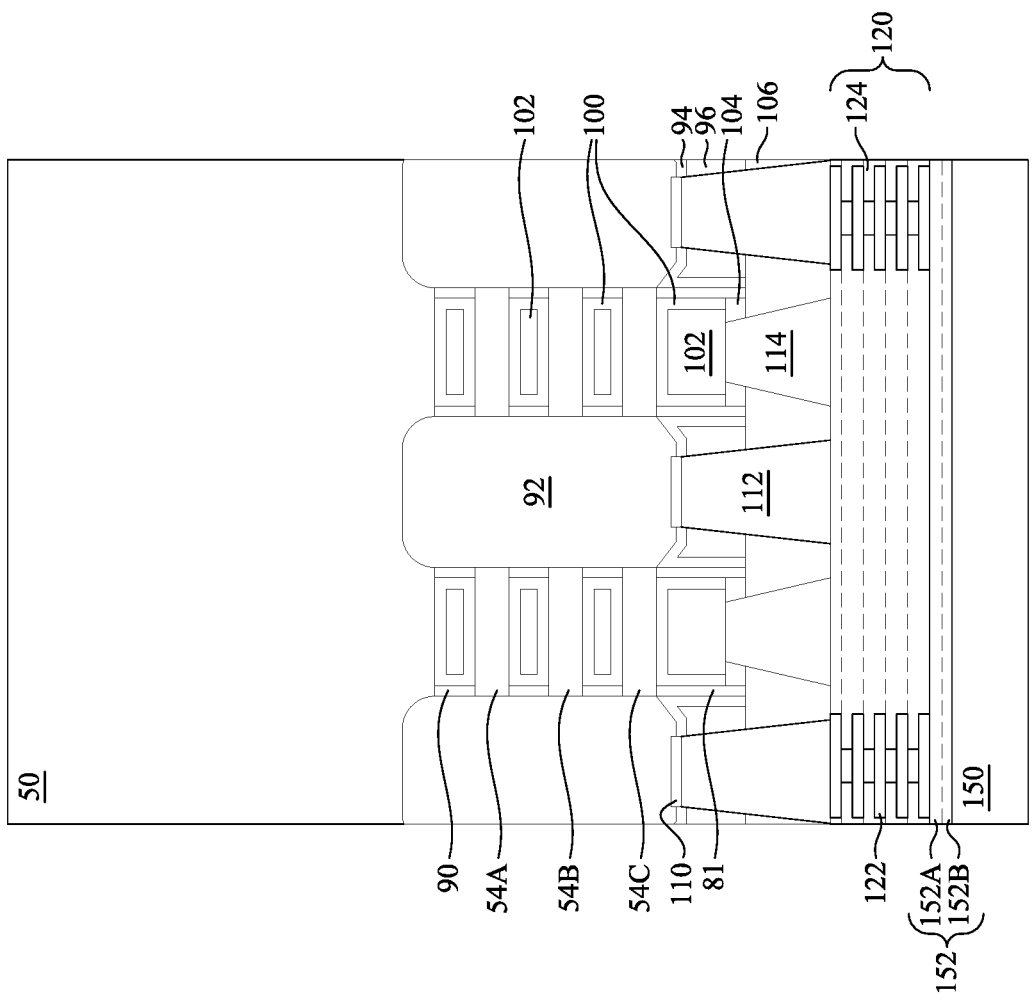

In FIGS. 22A through 22C, a first carrier substrate 150 is bonded to a top surface of the front-side interconnect structure 120 by a first bonding layer 152A and a second bonding layer 152B (collectively referred to as a bonding layer 152). The first carrier substrate 150 may be a glass carrier substrate, a ceramic carrier substrate, a wafer (e.g., a silicon wafer), or the like. The first carrier substrate 150 may provide structural support during subsequent processing steps and in the completed device.

In various embodiments, the first carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high-density plasma (HDP) oxide or the like) that is deposited by CVD, ALD, PVD, or the like. The second bonding layer 152B may likewise be an oxide layer that is formed on a surface of the first carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The first carrier substrate 150 is then aligned with the front-side interconnect structure 120 and the two are pressed against each other to initiate a pre-bonding of the first carrier substrate 150 to the front-side interconnect structure 120. The pre-bonding may be performed at room temperature (e.g., from about 21° C. to about 25° C.). After the pre-bonding, an annealing process may be applied by, for example, heating the front-side interconnect structure 120 and the first carrier substrate 150 to a temperature of about 170° C.

Further in FIGS. 22A through 22C, after the first carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 23C:
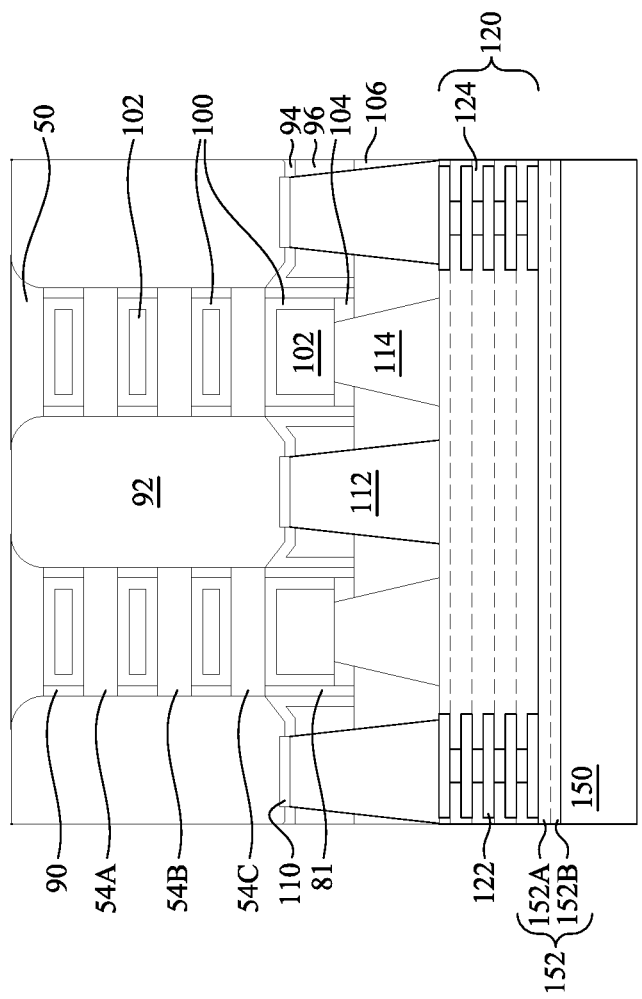

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the epitaxial source/drain regions 92, the gate dielectric layers 100, the fins 66, the first spacers 81, and the CESL 94 opposite the front-side interconnect structure 120. Portions of the substrate 50 may remain over the gate structure (e.g., the gate electrodes 102 and the gate dielectric layers 100) and the nanostructures 55 after the thinning process.

Figure 24B:
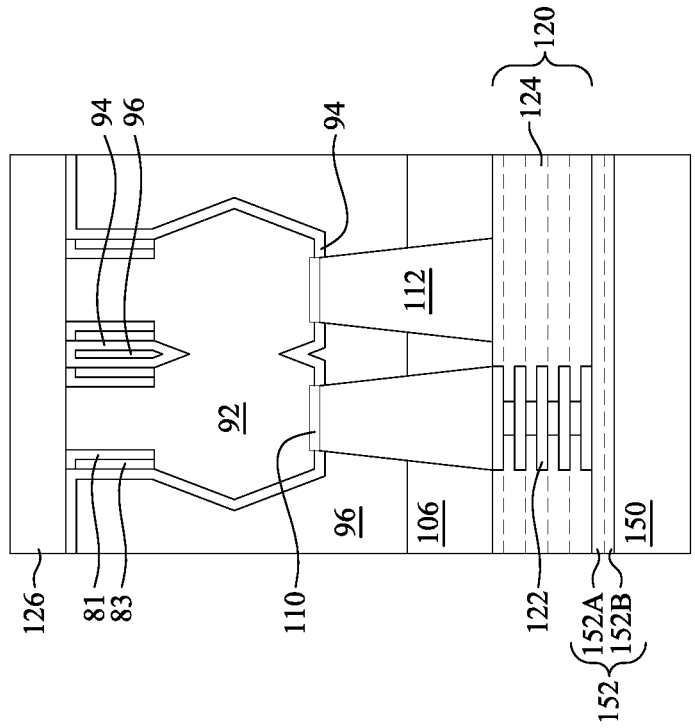
Figure 24A:
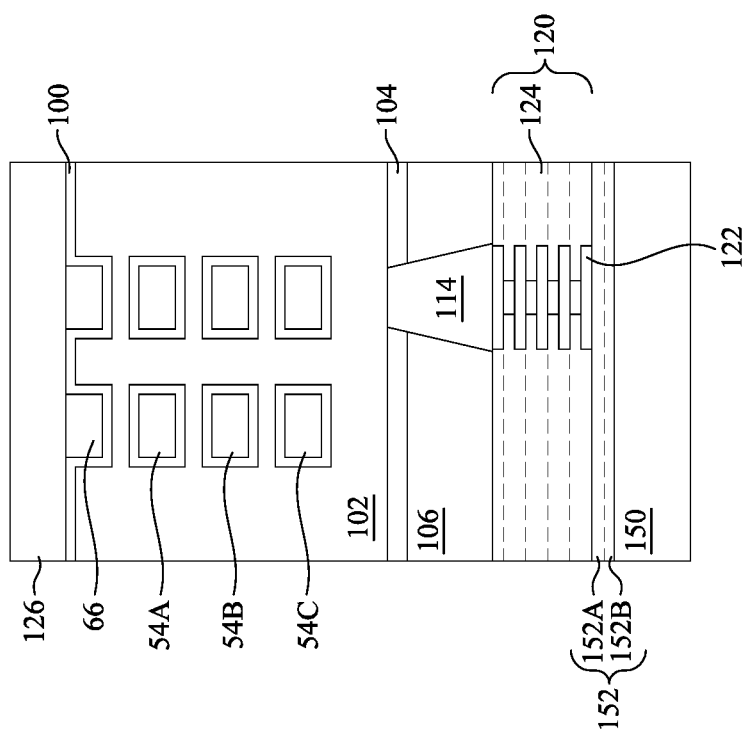
Figure 24C:
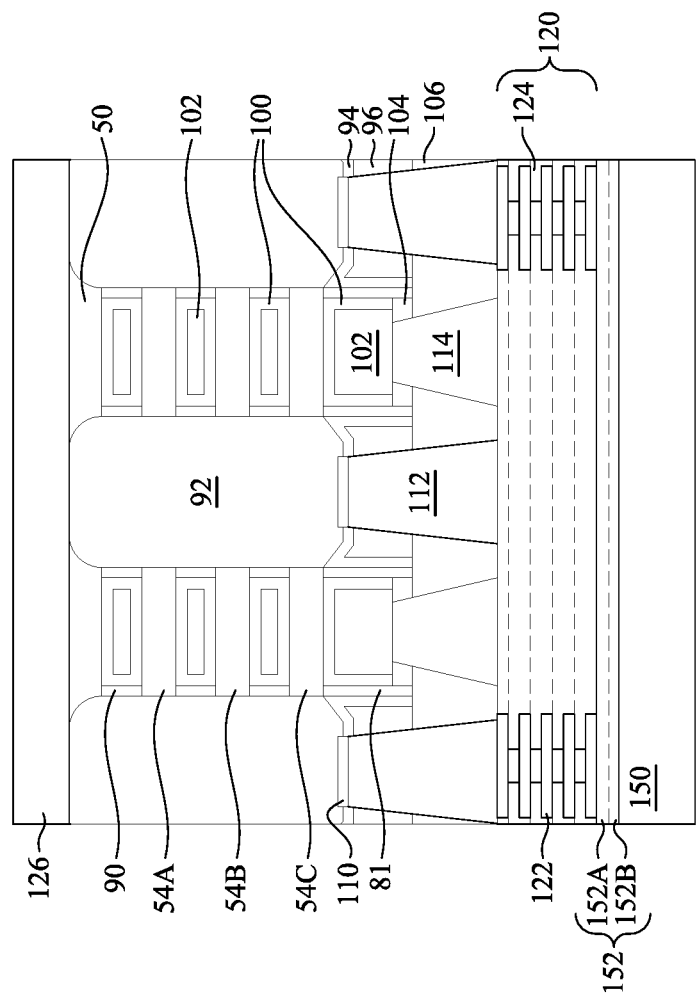

In FIGS. 24A through 24C, a third dielectric layer 126 is deposited on the backside of the device. The third dielectric layer 126 may be deposited over the epitaxial source/drain regions 92, remaining portions of the substrate 50, the gate dielectric layers 100, the fins 66, the first spacers 81, and the CESL 94. The third dielectric layer 126 may physically contact surfaces of the epitaxial source/drain regions 92, the remaining portions of the substrate 50, the gate dielectric layers 100, the fins 66, the first spacers 81, and the CESL 94. The third dielectric layer 126 may be substantially similar to the second ILD 106 described above. For example, the third dielectric layer 126 may be formed of a like material and using a like process as the second ILD 106.

Figure 25C:
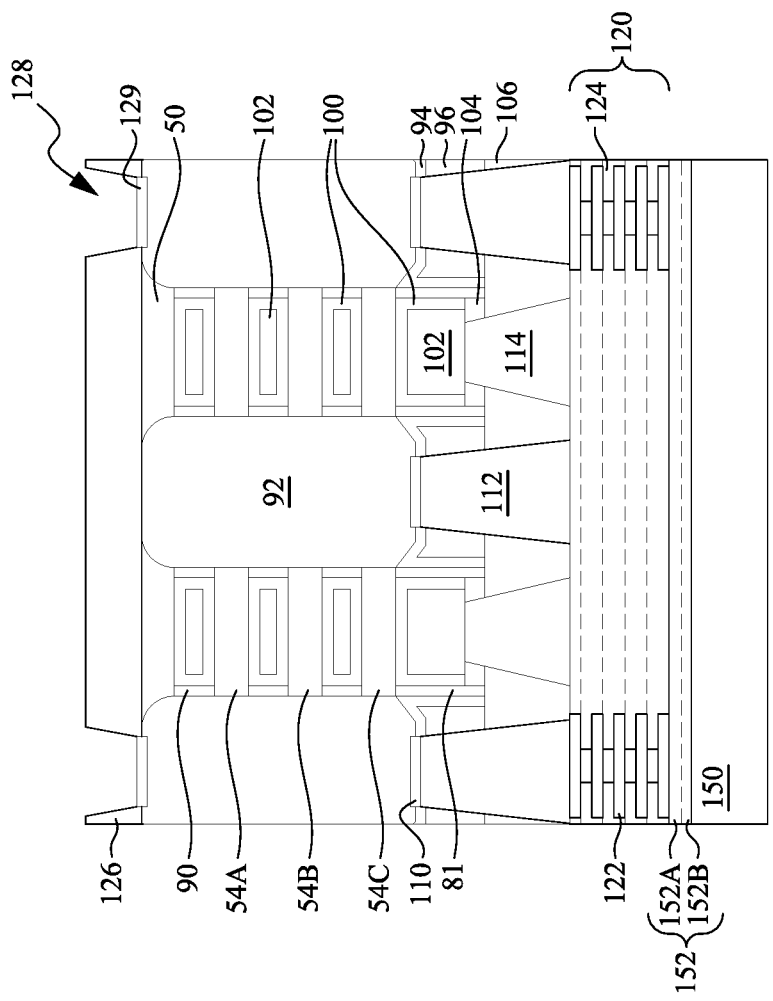

In FIGS. 25A through 25C, fifth recesses 128 are patterned in the third dielectric layer 126. The fifth recesses 128 may be patterned using processes the same as or similar to those used to form the fourth recesses 108, described above with respect to FIGS. 19A through 19C. The fifth recesses 128 may expose surfaces of the epitaxial source/drain regions 92. As also illustrated in FIGS. 25B and 25C, second silicide regions 129 are formed on a backside of the epitaxial source/drain regions 92. The second silicide regions 129 may be similar to the first silicide regions 110, described above with respect to FIGS. 19A through 19C. For example, the second silicide regions 129 may be formed of materials and using processes the same as or similar to those used for the first silicide regions 110.

Figure 26C:
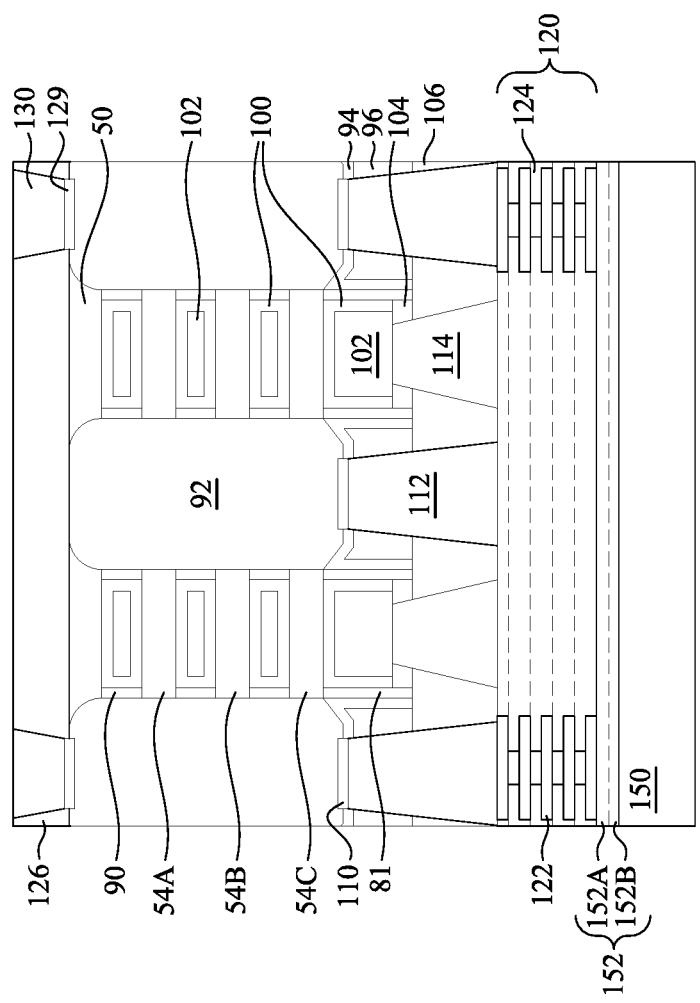

In FIGS. 26A through 26C, backside vias 130 are formed in the fifth recesses 128. The backside vias 130 may extend through the third dielectric layer 126 and may be electrically coupled to the epitaxial source/drain regions 92 through the second silicide regions 129. The backside vias 130 may be similar to the source/drain contacts 112, described above with respect to FIGS. 20A through 20C. For example, the backside vias 130 may be formed of materials and using processes the same as or similar to those used for the source/drain contacts 112.

Figure 27B:
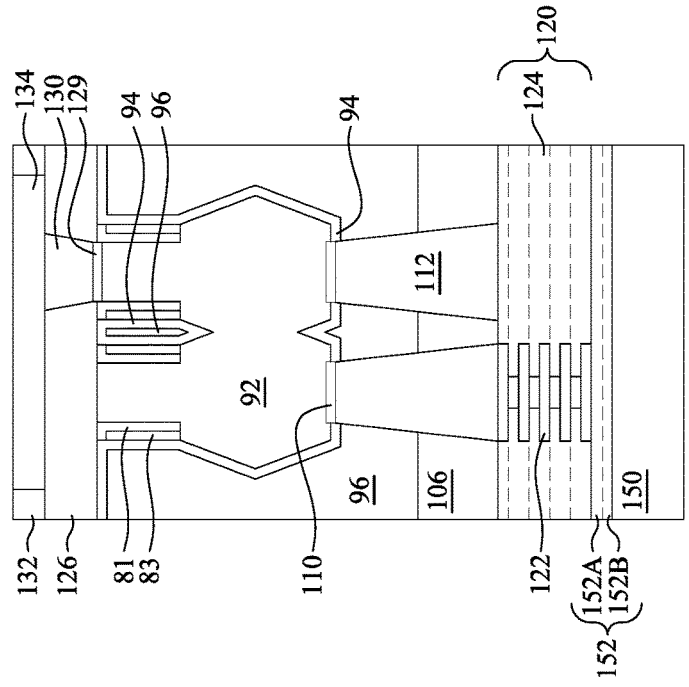
Figure 27A:
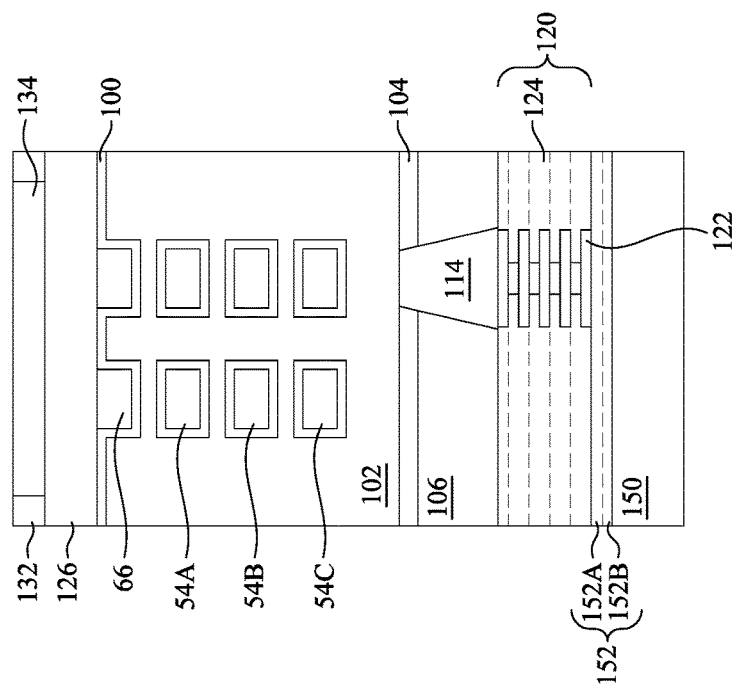
Figure 27C:
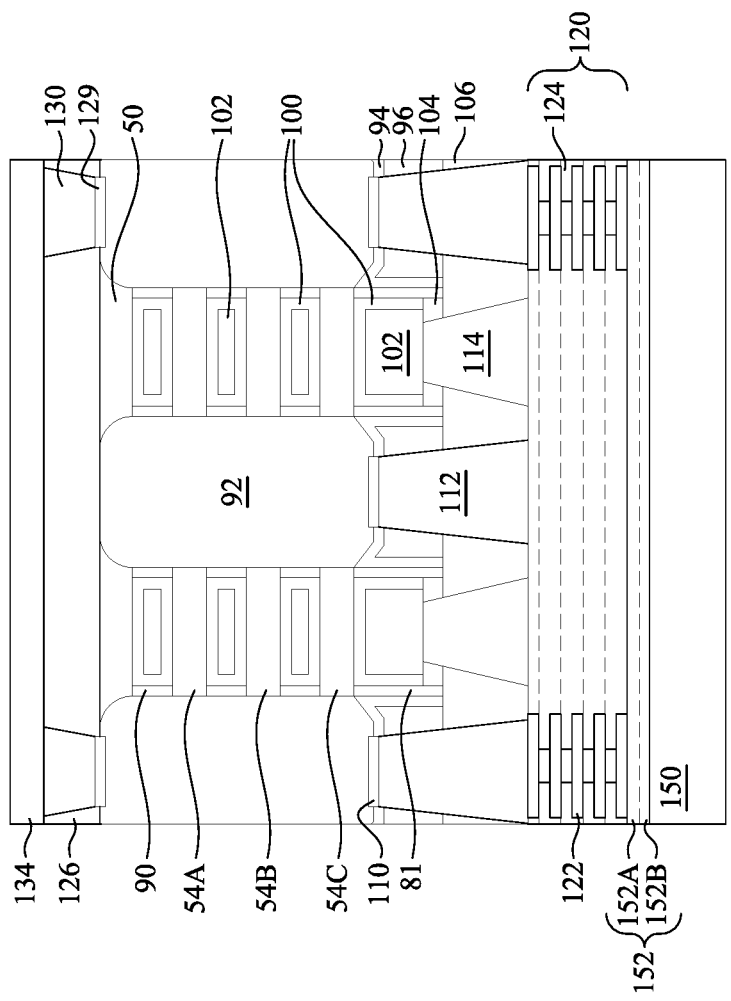

In FIGS. 27A through 27C, second conductive lines 134 and a fourth dielectric layer 132 are formed over the third dielectric layer 126, the STI regions 68, and the backside vias 130. The fourth dielectric layer 132 may be similar to the third dielectric layer 126. For example, the fourth dielectric layer 132 may be formed of materials and using processes the same as or similar to those used for the second dielectric layer 125.

The second conductive lines 134 are formed in the fourth dielectric layer 132. Forming the second conductive lines 134 may include patterning recesses in the fourth dielectric layer 132 using a combination of photolithography and etching processes, for example. A pattern of the recesses in the fourth dielectric layer 132 may correspond to a pattern of the second conductive lines 134. The second conductive lines 134 are then formed by depositing a conductive material in the recesses. In some embodiments, the second conductive lines 134 comprise a metal layer, which may be a single layer or a composite layer comprising a plurality of sub-layers formed of different materials. In some embodiments, the second conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The second conductive lines 134 may be formed using, for example, CVD, ALD, PVD, plating or the like. The second conductive lines 134 are electrically coupled to the epitaxial source/drain regions 92 through the backside vias 130 and the second silicide regions 129. A planarization process (e.g., a CMP, a grinding, an etch-back, or the like) may be performed to remove excess portions of the second conductive lines 134 formed over the fourth dielectric layer 132.

In some embodiments, the second conductive lines 134 are backside power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the second conductive lines 134 may be at least twice a width of first level conductive lines (e.g., the first conductive features 122 and/or the first conductive lines 118) of the front-side interconnect structure 120.

Figure 28B:
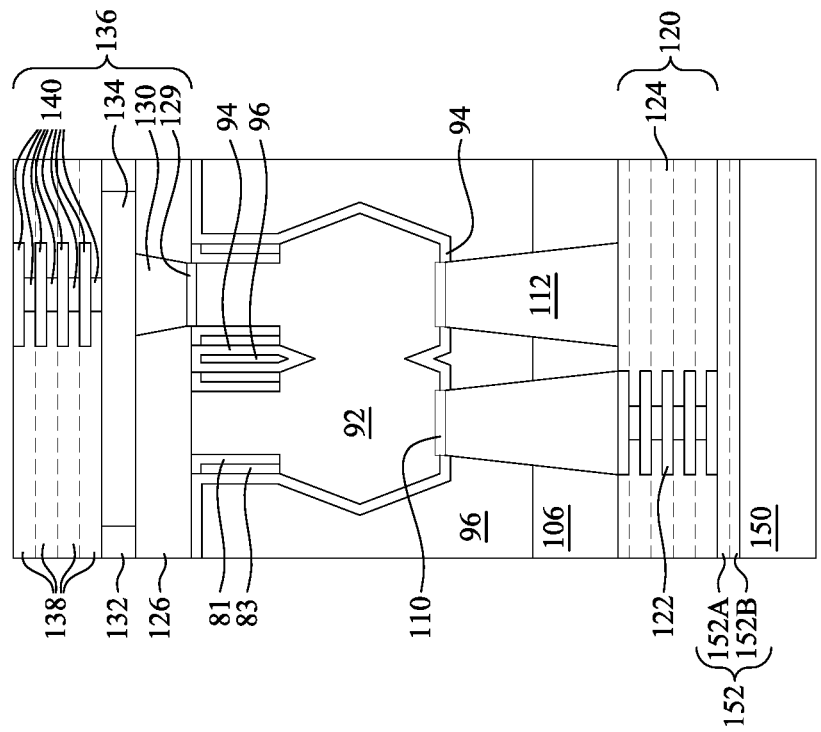
Figure 28A:
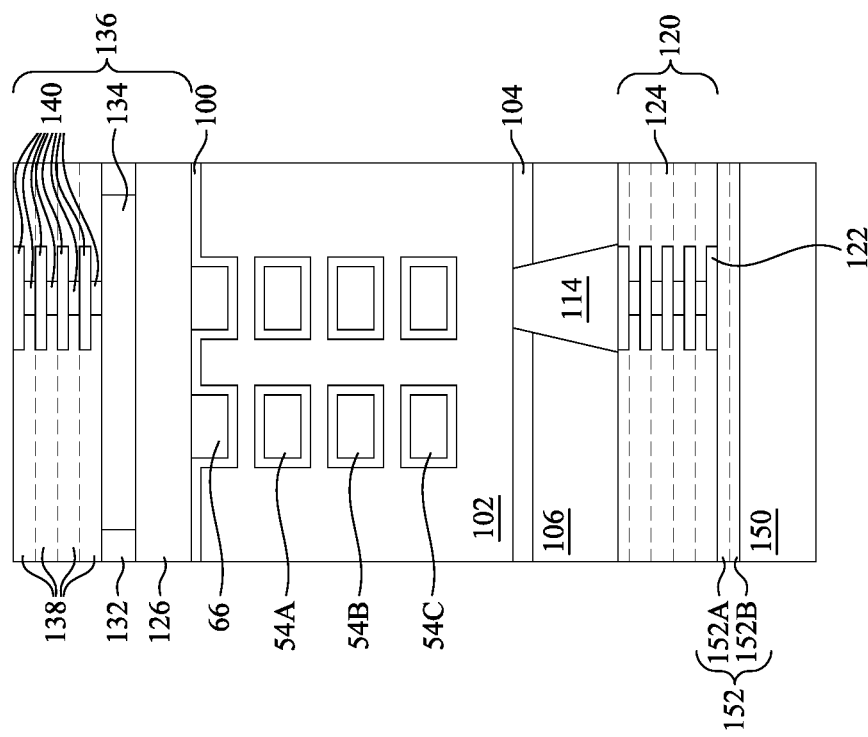
Figure 28C:
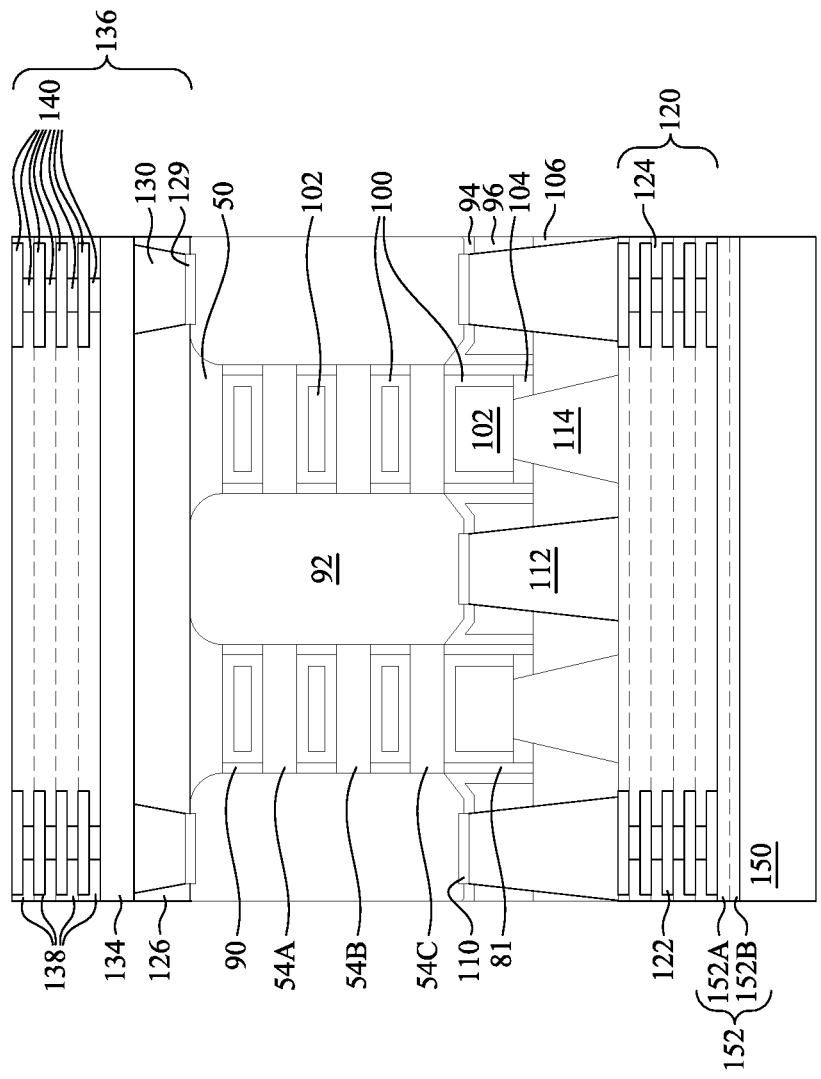

In FIGS. 28A through 28C, remaining portions of a backside interconnect structure 136 are formed over the fourth dielectric layer 132 and the second conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the third dielectric layer 126, the fourth dielectric layer 132, the backside vias 130, and the second conductive lines 134.

The remaining portions of the backside interconnect structure 136 may comprise materials and be formed using processes the same as or similar to those used for the front-side interconnect structure 120, discussed above with respect to FIGS. 21A through 21C. In particular, the backside interconnect structure 136 may comprise stacked layers of second conductive features 140 formed in fifth dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. For example, in FIGS. 28A through 28C, the second conductive features 140 may comprise a metal-insulator-metal (MIM) inductor. The embedded passive devices may be integrated with the second conductive lines 134 (e.g., the power rail) to provide circuits (e.g., power circuits) on the backside of the nano-FETs.

Figure 29B:
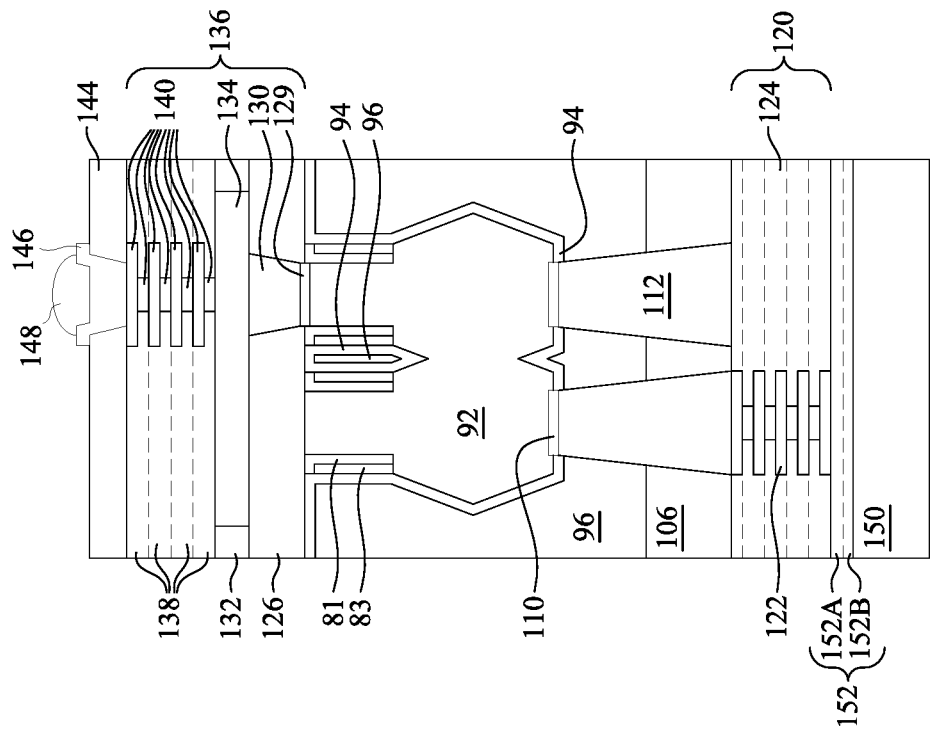
Figure 29A:
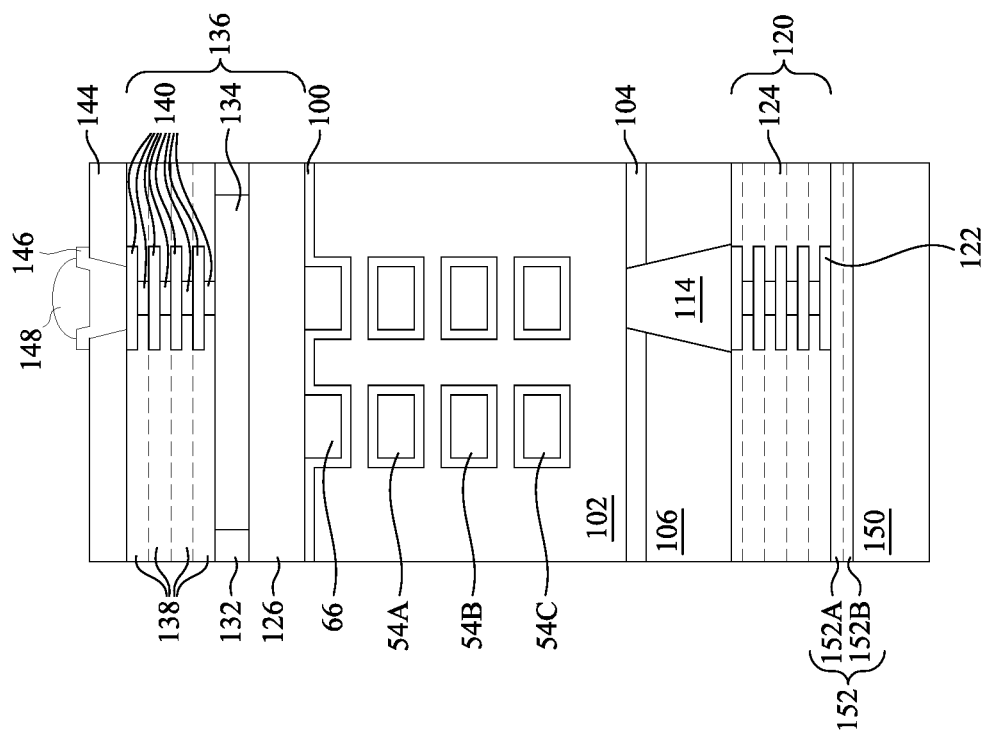
Figure 29C:
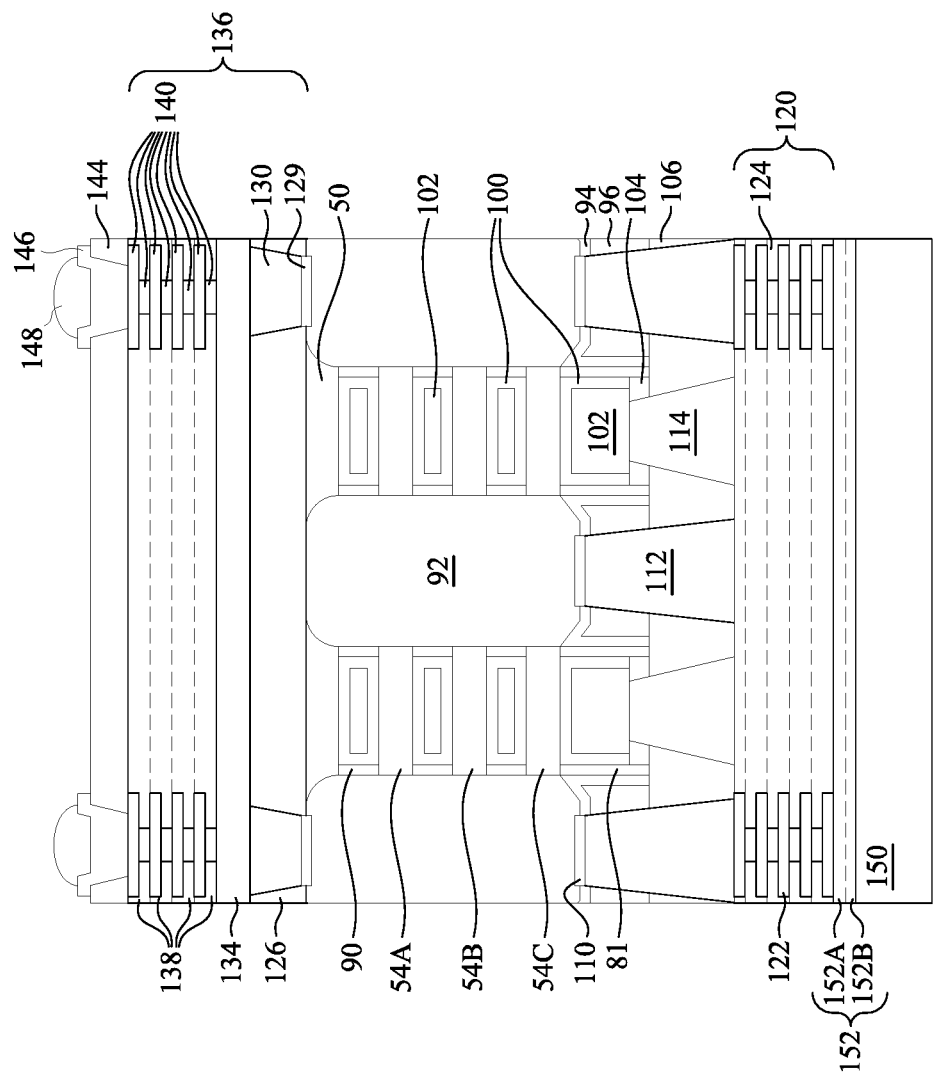

In FIGS. 29A through 29C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

FIGS. 30 through 51 illustrate intermediate steps of forming packaged semiconductor devices, which may include nano-FETs formed by the processes described above. FIGS. 30 through 51 illustrate reference cross-section C-C' illustrated in FIG. 1. The process steps described in FIGS. 30 through 51 may be applied using both n-type nano-FETs and p-type nano-FETs.

Figure 30:
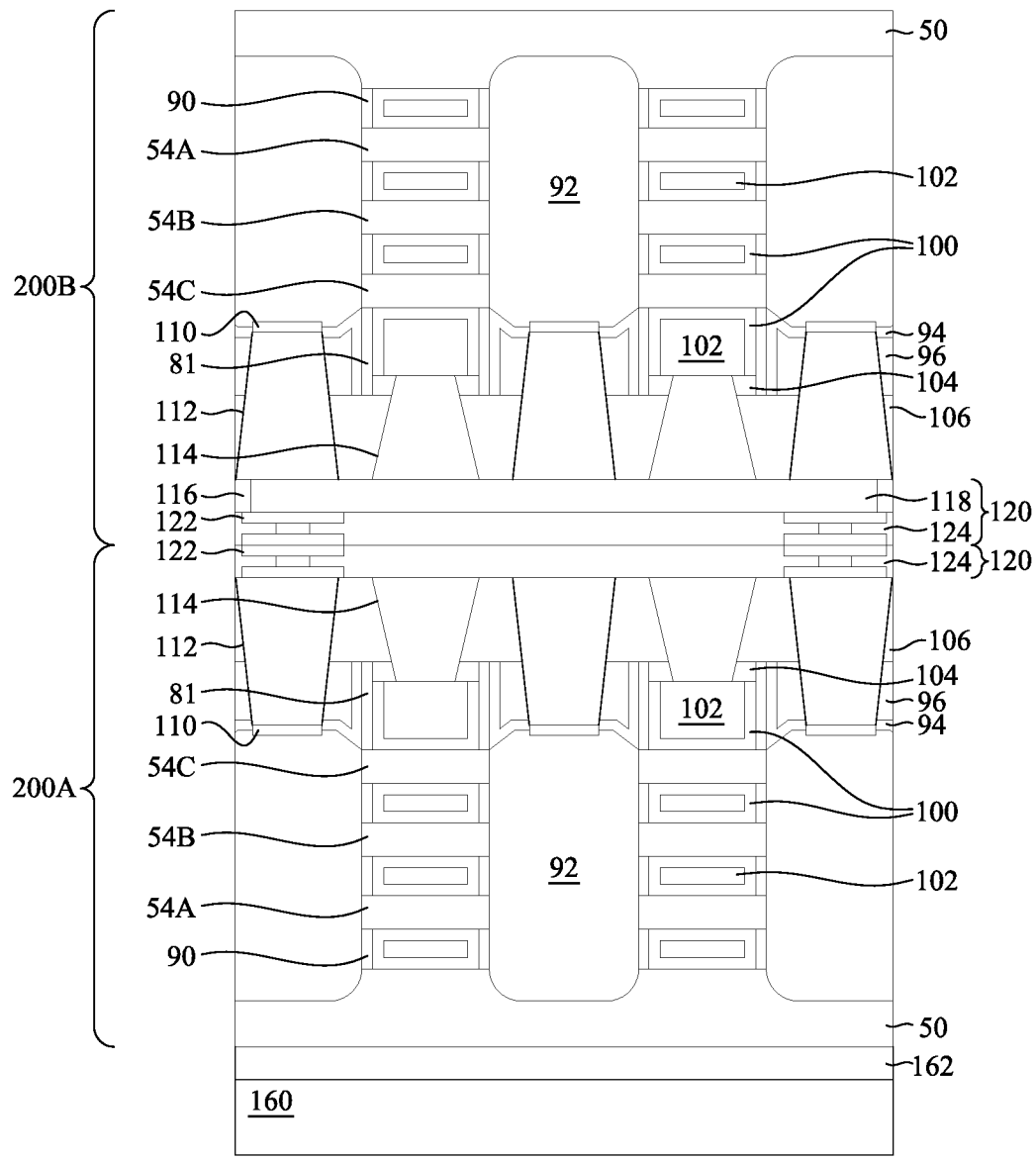
FIGS. 30 through 51 are cross-sectional views of intermediate stages in the packaging of integrated circuit dies, in accordance with some embodiments.

In FIG. 30, a second carrier substrate 160 is attached to a backside surface of a first IC die 200A (e.g., discussed above with respect to FIGS. 21A through 21C) using a first release layer 162 and a front-side of a second IC die 200B (e.g., discussed above with respect to FIG. 21D) is bonded to a front-side of the first IC die 200A. The second carrier substrate 160 may be a glass carrier substrate, a ceramic carrier substrate, or the like. The second carrier substrate 160 may be a wafer, such that multiple first IC dies 200A and second IC dies 200B may be processed on the second carrier substrate 160 simultaneously.

The first release layer 162 may be formed of a polymer-based material, which may be subsequently removed along with the second carrier substrate 160 from the overlying first IC die 200A. In some embodiments, the first release layer 162 is an epoxy-based thermal-release material, which loses its adhesive property when heated, such as a light-to-heat-conversion (LTHC) release coating. In other embodiments, the first release layer 162 may be an ultra-violet (UV) glue, which loses its adhesive property when exposed to UV lights. The first release layer 162 may be dispensed as a liquid and cured, may be a laminate film laminated onto the second carrier substrate 160, or may be the like. The top surface of the first release layer 162 may be leveled and may have a high degree of planarity.

The second IC die 200B is then bonded to the first IC die 200A. The second IC die 200B is face-to-face bonded to the first IC die 200A. For example, as illustrated in FIG. 30, the front-side interconnect structure 120 of the second IC die 200B is directly bonded in a face-to-face manner by hybrid bonding to the front-side interconnect structure 120 of the first IC die 200A. Specifically, dielectric-to-dielectric bonds are formed between a first dielectric layer 124 of the first IC die 200A and a first dielectric layer 124 of the second IC die 200B and metal-to-metal bonds are formed between first conductive features 122 of the first IC die 200A and first conductive features 122 of the second IC die 200B.

As an example, a hybrid bonding process starts applying a surface treatment to the first dielectric layer 124 of the first IC die 200A and/or the first dielectric layer 124 of the second IC die 200B. The surface treatment may include a plasma treatment. The plasma treatment may be performed in a vacuum environment. After the plasma treatment, the surface treatment may further include a cleaning process (e.g., a rinse with deionized water or the like) that may be applied to the first dielectric layer 124 of the first IC die 200A and/or the first dielectric layer 124 of the second IC die 200B. The hybrid bonding process may then proceed to aligning the first conductive features 122 of the second IC die 200B with the first conductive features 122 of the first IC die 200A. When the second IC die 200B is aligned with the first IC die 200A, the first conductive features 122 of the second IC die 200B may overlap with the corresponding first conductive features 122 of the first IC die 200A. Next, the hybrid bonding includes a pre-bonding step, during which the second IC die 200B put in contact with the first IC die 200A. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in of the first conductive features 122 of the second IC die 200B (e.g., copper) and the metal of the first conductive features 122 of the first IC die 200A (e.g., copper) inter-diffuses, and the direct metal-to-metal bonds are formed. Although a single second IC die 200B is illustrated as being bonded to the first IC die 200A, other embodiments may include multiple second IC dies 200B, which may be bonded to one or more first IC dies 200A. In such embodiments, the multiple second IC dies 200B and/or the multiple first IC dies 200A may be in a stacked configuration (e.g., having multiple stacked dies) and/or a side-by-side configuration.

The first IC die 200A and the second IC die 200B may be logic dies (e.g., central processing units (CPUs), graphics processing units (GPUs), system-on-a-chips (SoCs), application processors (APs), field-programmable gate arrays (FPGAs), microcontrollers, or the like), memory dies (e.g., dynamic random access memory (DRAM) dies, static random access memory (SRAM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), the like, or combinations thereof.

Figure 31:
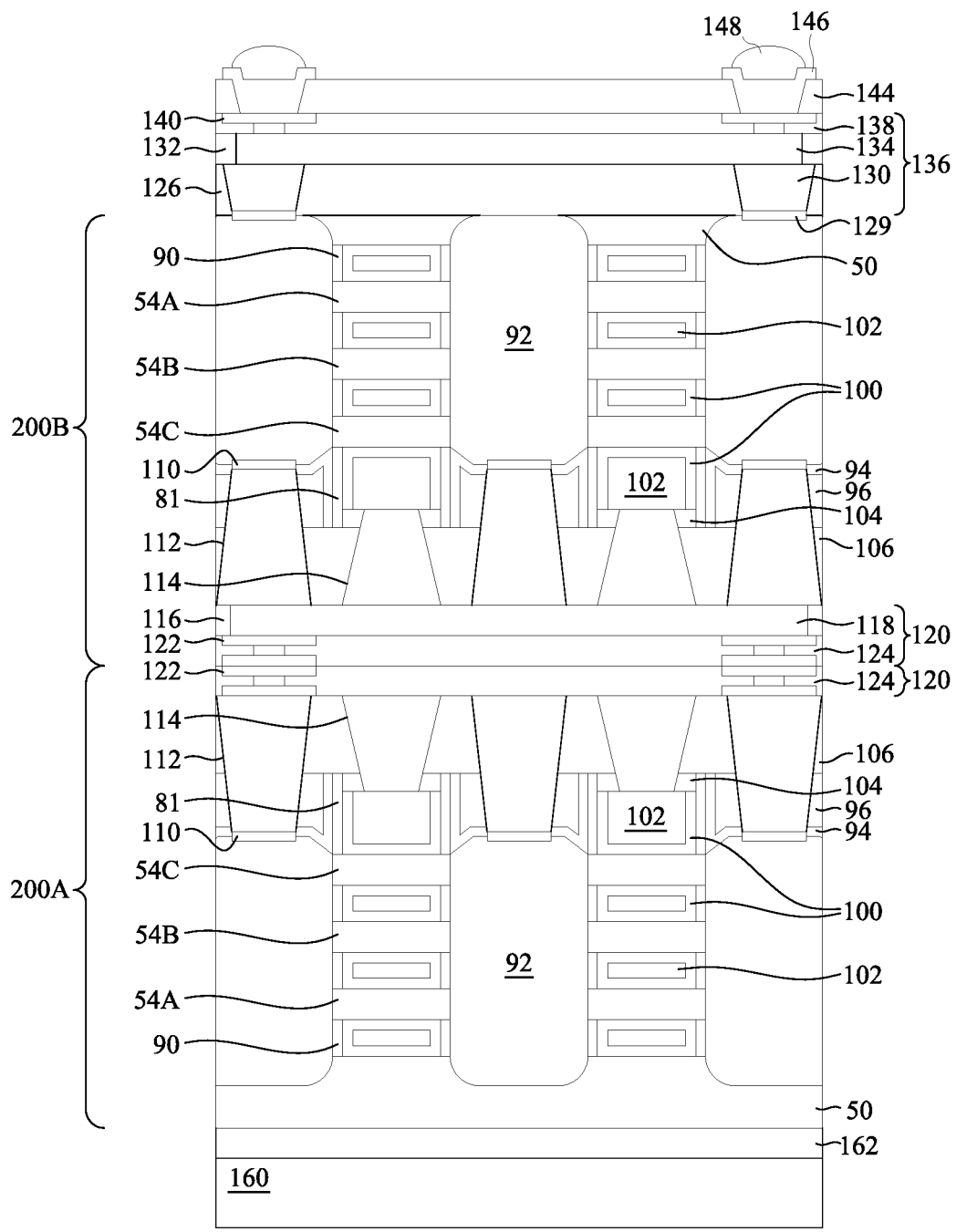

In FIG. 31, a thinning process is applied to the backside of the substrate 50 of the second IC die 200B and a backside interconnect structure 136, a passivation layer 144, UBMs 146, and external connectors 148 are formed over backsides of the substrate 50 and the epitaxial source/drain regions 92 of the second IC die 200B. The substrate 50 may be thinned using processes the same as or similar to those described above with respect to FIGS. 23A through 23C. The backside interconnect structure 136, the passivation layer 144, the UBMs 146, and the external connectors 148 may be formed of materials and using processes the same as or similar to those discussed above with respect to FIGS. 24A through 29C.

Figure 32:
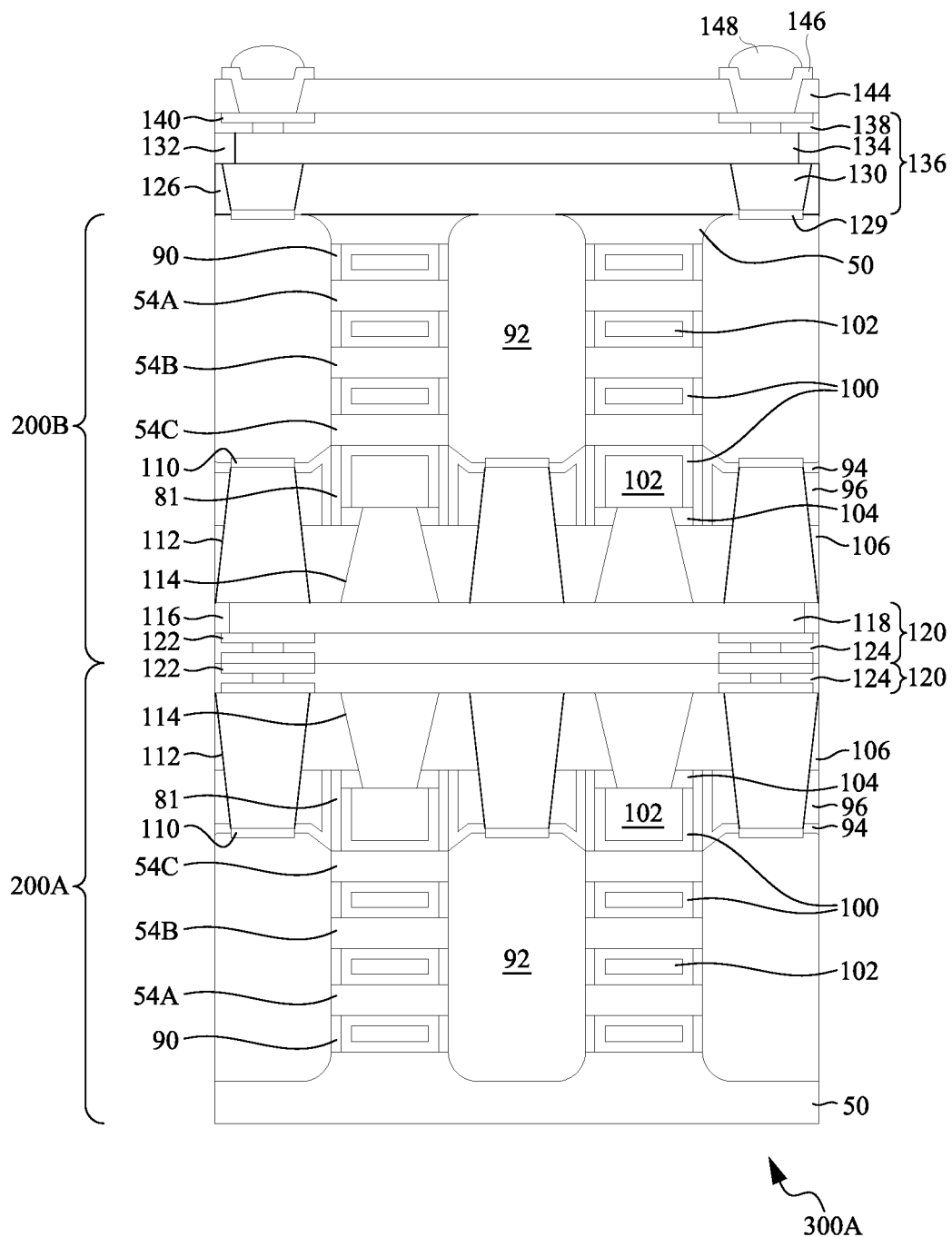

In FIG. 32, a carrier substrate debonding is performed to detach (or "debond") the second carrier substrate 160 from the first IC die 200A and a first packaged semiconductor device 300A is formed. In some embodiments, the debonding includes projecting a light such as a laser light or a UV light onto the first release layer 162 so that the first release layer 162 decomposes under the heat of the light and the second carrier substrate 160 can be removed. Removing the second carrier substrate 160 exposes the substrate 50 on the backside of the first IC die 200A.

Conventional processes may form through substrate vias through substrates in order to provide backside connections to integrated circuit dies. In contrast, forming the second conductive lines 134 (e.g., the power rails) and the backside interconnect structures 136 to provide backside connections for the first packaged semiconductor device 300A reduces the area required for backside connections, increasing device density, and improves the flexibility of backside connections. Moreover, bonding the second IC die 200B to the first IC die 200A using hybrid bonding shortens the routing distance between the second IC die 200B and the first IC die 200A and reduces the resistance between the second IC die 200B and the first IC die 200A. As such, the first packaged semiconductor device 300A may be formed with greater device densities, greater flexibility, and improved performance.

Figure 33:
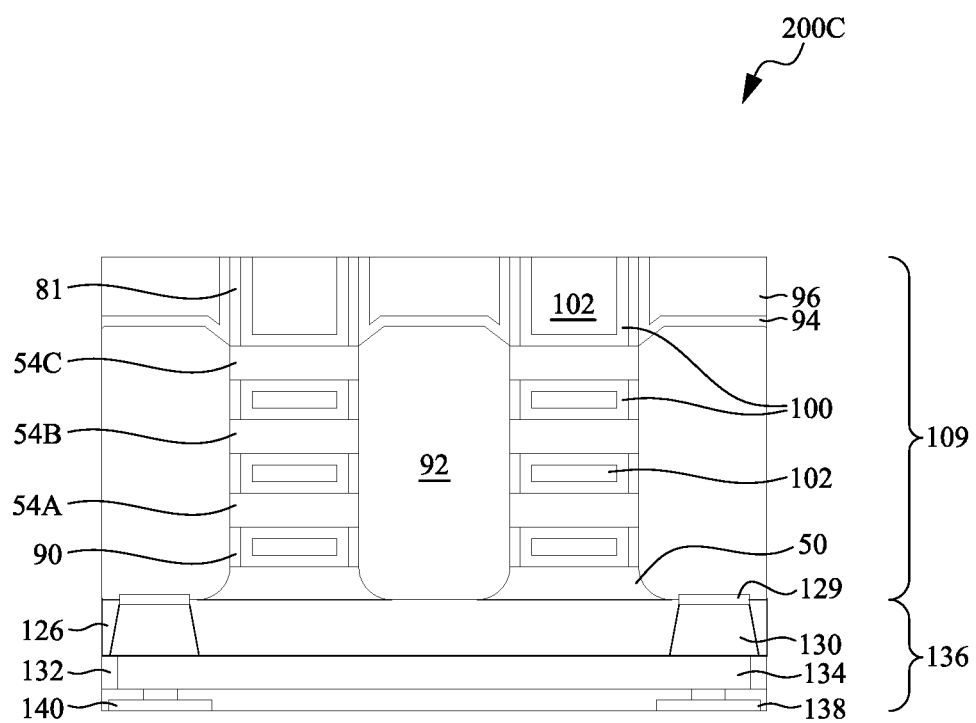

FIG. 33 illustrates a third IC die 200C, which may be used in packaged semiconductor devices. The third IC die 200C may be formed by performing the processes described above with respect to FIGS. 2 through 17C to form transistor structures 109, then performing the processes described above with respect to FIGS. 22A through 28C to form a backside interconnect structure 136. The processes described above with respect to FIGS. 18A through 23C (e.g., the processes used to form source/drain contacts 112, gate contacts 114, and a front-side interconnect structure 120) may be skipped to form the third IC die 200C. A dicing process, such as sawing, a laser ablation method, an etching process, a combination thereof, or the like, may then be used to form the third IC die 200C. The third IC die 200C may be a logic die (e.g., a central processing unit (CPU), a graphics processing unit (GPU), a system-on-a-chip (SoC), an application processor (AP), a field-programmable gate array (FPGA), a microcontroller, or the like), a memory die (e.g., a dynamic random access memory (DRAM) die, a static random access memory (SRAM) die, or the like), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., an analog front-end (AFE) die), the like, or a combination thereof.

Figure 34:
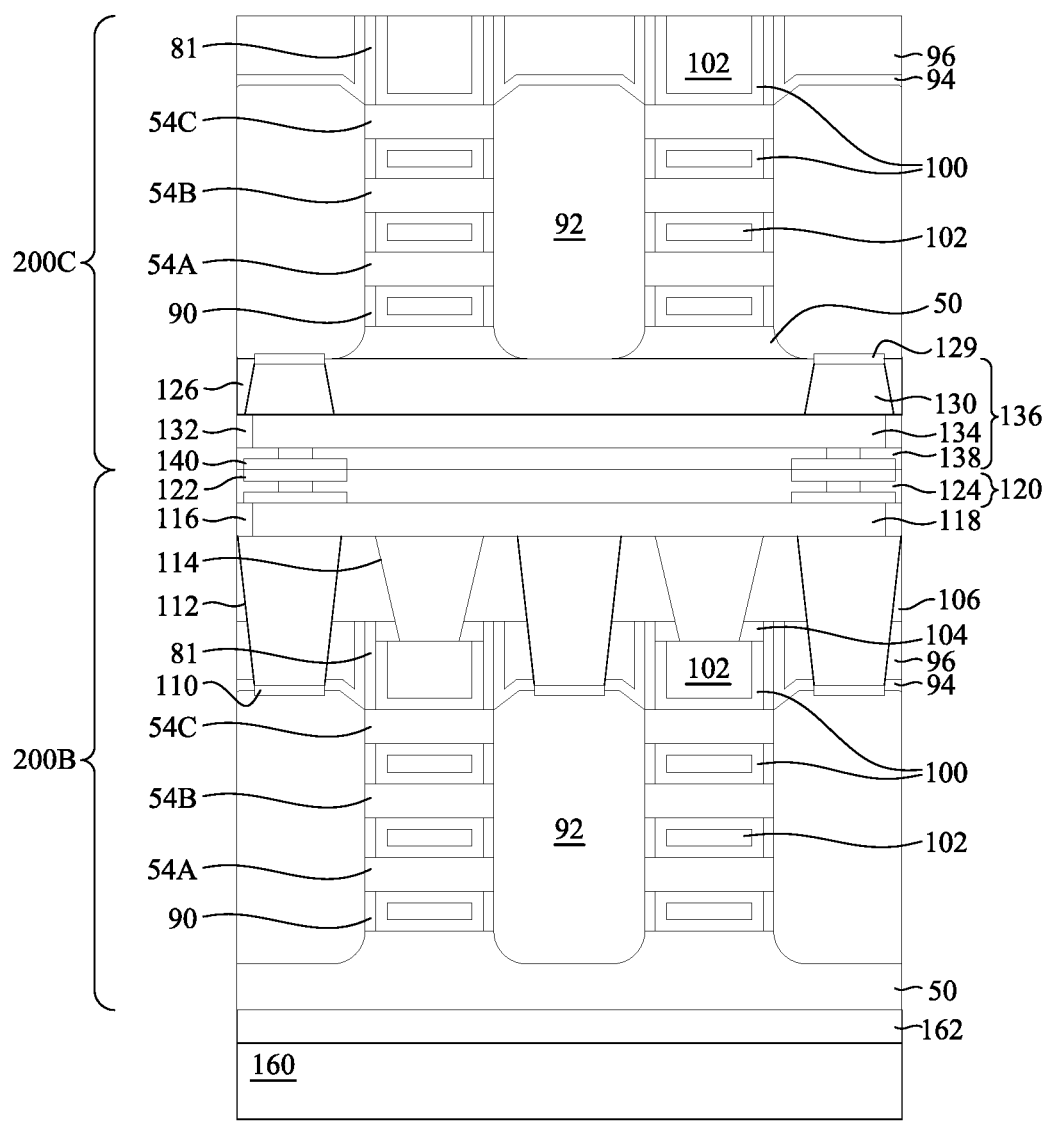

In FIG. 34, a second carrier substrate 160 is attached to a backside surface of a second IC die 200B (discussed above with respect to FIG. 21D) using a first release layer 162 and a backside of a third IC die 200C (discussed above with respect to FIG. 33) is bonded to a front-side of the second IC die 200B. The second carrier substrate 160 may be a glass carrier substrate, a ceramic carrier substrate, or the like. The second carrier substrate 160 may be a wafer, such that multiple second IC dies 200B and third IC dies 200C may be processed on the second carrier substrate 160 simultaneously.

The first release layer 162 may be formed of a polymer-based material, which may be subsequently removed along with the second carrier substrate 160 from the overlying second IC die 200B. In some embodiments, the first release layer 162 is an epoxy-based thermal-release material, which loses its adhesive property when heated, such as a light-to-heat-conversion (LTHC) release coating. In other embodiments, the first release layer 162 may be an ultra-violet (UV) glue, which loses its adhesive property when exposed to UV lights. The first release layer 162 may be dispensed as a liquid and cured, may be a laminate film laminated onto the second carrier substrate 160, or may be the like. The top surface of the first release layer 162 may be leveled and may have a high degree of planarity.

The third IC die 200C is then bonded to the second IC die 200B. The third IC die 200C is back-to-face bonded to the second IC die 200B. For example, as illustrated in FIG. 34, the backside interconnect structure 136 of the third IC die 200C is directly bonded in a back-to-face manner by hybrid bonding to the front-side interconnect structure 120 of the second IC die 200B. Specifically, dielectric-to-dielectric bonds are formed between a first dielectric layer 124 of the second IC die 200B and a fifth dielectric layer 138 of the third IC die 200C and metal-to-metal bonds are formed between first conductive features 122 of the second IC die 200B and second conductive features 140 of the third IC die 200C.

Figure 35:
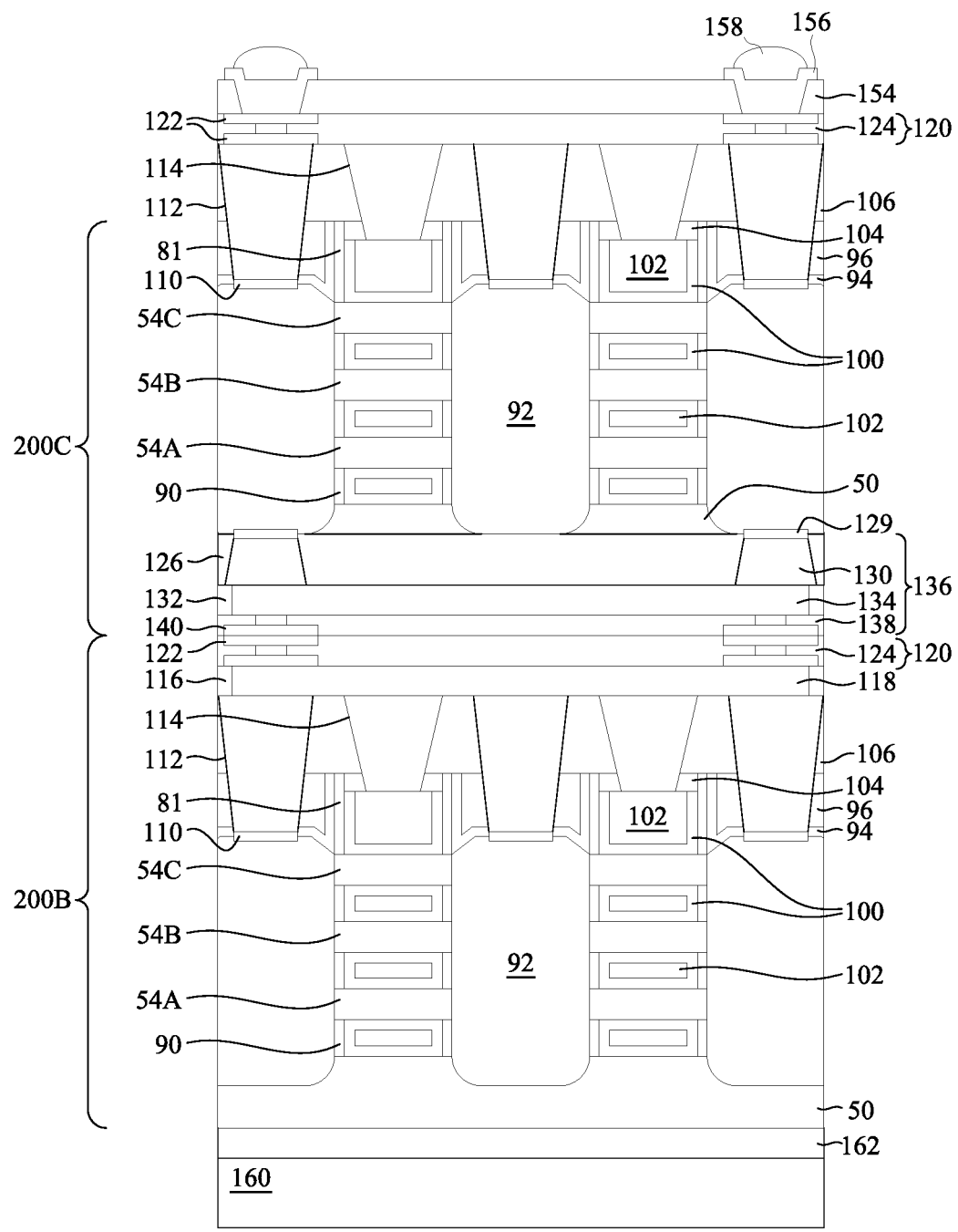

In FIG. 35, source/drain contacts 112, gate contacts 114, a second ILD 106, a front-side interconnect structure 120, a passivation layer 154, UBMs 156, and external connectors 158 are formed over a front-side of the third IC die 200C. The source/drain contacts 112, the gate contacts 114, the second ILD 106, and the front-side interconnect structure 120 may be formed of materials and using processes the same as or similar to those discussed above with respect to FIGS. 18A through 21C.

The passivation layer 154, the UBMs 156, and the external connectors 158 are then formed over the front-side interconnect structure 120. The passivation layer 154 may comprise polymers such as PBO, polyimide, BCB, or the like. Alternatively, the passivation layer 154 may include non-organic dielectric materials such as silicon oxide, silicon nitride, silicon carbide, silicon oxynitride, or the like. The passivation layer 154 may be deposited by, for example, CVD, PVD, ALD, or the like.

The UBMs 156 are formed through the passivation layer 154 to the first conductive features 122 in the front-side interconnect structure 120 and the external connectors 158 are formed on the UBMs 156. The UBMs 156 may comprise one or more layers of copper, nickel, gold, or the like, which are formed by a plating process, or the like. The external connectors 158 (e.g., solder balls) are formed on the UBMs 156. The formation of the external connectors 158 may include placing solder balls on exposed portions of the UBMs 156 and reflowing the solder balls. In some embodiments, the formation of the external connectors 158 includes performing a plating step to form solder regions over the topmost first conductive features 122 and then reflowing the solder regions. The UBMs 156 and the external connectors 158 may be used to provide input/output connections to other electrical components, such as, other device dies, redistribution structures, printed circuit boards (PCBs), motherboards, or the like. The UBMs 156 and the external connectors 158 may also be referred to as front-side input/output pads that may provide signal, supply voltage, and/or ground connections to the nano-FETs of the third IC die 200C and the second IC die 200B.

Figure 36:
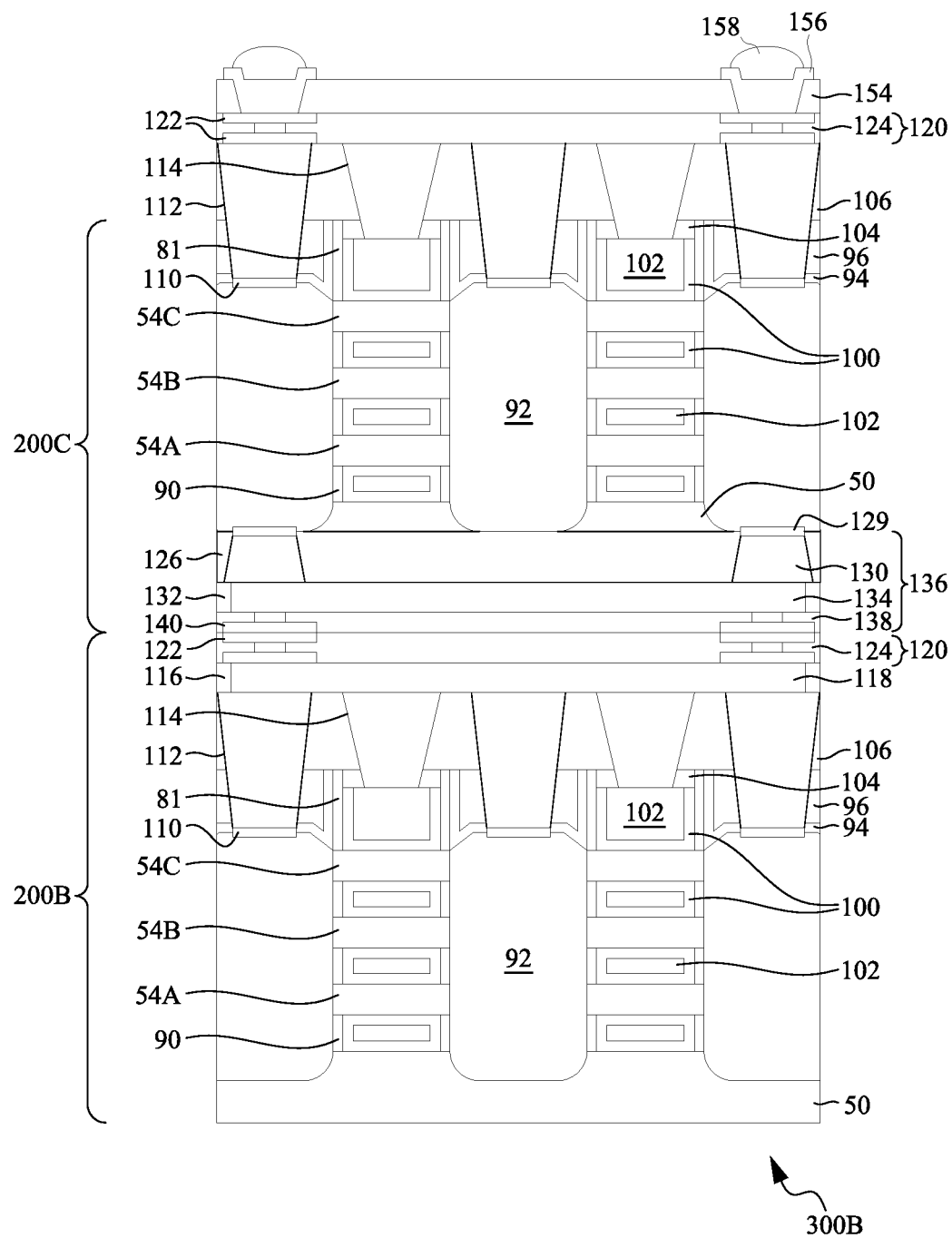

In FIG. 36, a carrier substrate debonding is performed to detach (or "debond") the second carrier substrate 160 from the second IC die 200B and a second packaged semiconductor device 300B is formed. In some embodiments, the debonding includes projecting a light such as a laser light or a UV light onto the first release layer 162 so that the first release layer 162 decomposes under the heat of the light and the second carrier substrate 160 can be removed. Removing the second carrier substrate 160 exposes the substrate 50 on the backside of the second IC die 200B.

Conventional processes may form through substrate vias through substrates in order to provide backside connections to integrated circuit dies. In contrast, forming the second conductive lines 134 (e.g., the power rails) and the backside interconnect structures 136 to provide backside connections for the second packaged semiconductor device 300B reduces the area required for backside connections, increasing device density, and improves the flexibility of backside connections. Moreover, bonding the third IC die 200C to the second IC die 200B using hybrid bonding shortens the routing distance between the third IC die 200C and the second IC die 200B and reduces the resistance between the third IC die 200C and the second IC die 200B. As such, the second packaged semiconductor device 300B may be formed with greater device densities, greater flexibility, and improved performance.

Figure 37:
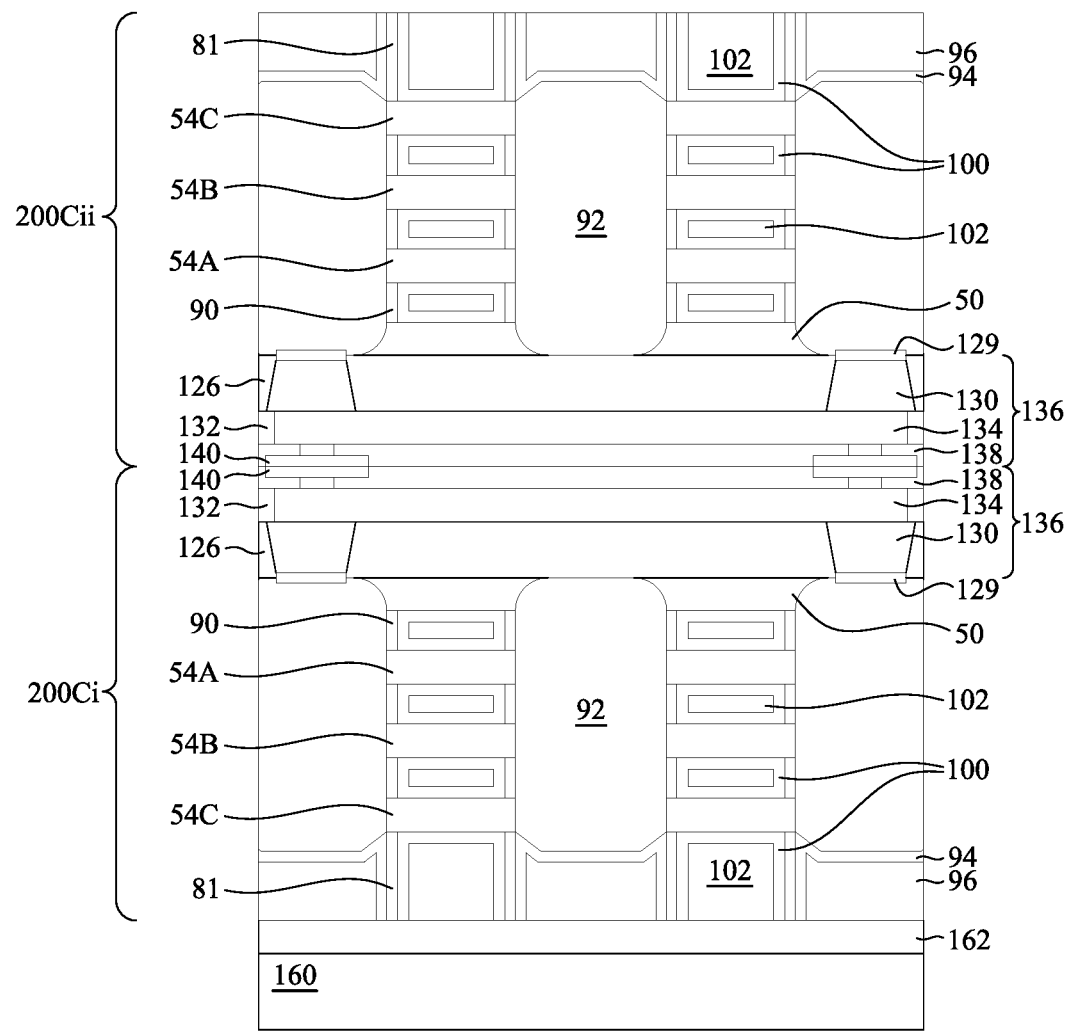

In FIG. 37, a second carrier substrate 160 is attached to a front-side surface of a third IC die 200Ci (discussed above with respect to FIG. 33) using a first release layer 162 and a backside of a third IC die 200Cii (discussed above with respect to FIG. 33) is bonded to a backside of the third IC die 200Ci. The second carrier substrate 160 may be a glass carrier substrate, a ceramic carrier substrate, or the like. The second carrier substrate 160 may be a wafer, such that multiple third IC dies 200Ci and third IC dies 200Cii may be processed on the second carrier substrate 160 simultaneously.

The first release layer 162 may be formed of a polymer-based material, which may be subsequently removed along with the second carrier substrate 160 from the overlying third IC die 200Ci. In some embodiments, the first release layer 162 is an epoxy-based thermal-release material, which loses its adhesive property when heated, such as a light-to-heat-conversion (LTHC) release coating. In other embodiments, the first release layer 162 may be an ultra-violet (UV) glue, which loses its adhesive property when exposed to UV lights. The first release layer 162 may be dispensed as a liquid and cured, may be a laminate film laminated onto the second carrier substrate 160, or may be the like. The top surface of the first release layer 162 may be leveled and may have a high degree of planarity.

The third IC die 200Cii is then bonded to the third IC die 200Ci. The third IC die 200Cii is back-to-back bonded to the third IC die 200Ci. For example, as illustrated in FIG. 37, the backside interconnect structure 136 of the third IC die 200Cii is directly bonded in a back-to-back manner by hybrid bonding to the backside interconnect structure 136 of the third IC die 200Ci. Specifically, dielectric-to-dielectric bonds are formed between a fifth dielectric layer 138 of the third IC die 200Ci and a fifth dielectric layer 138 of the third IC die 200Cii and metal-to-metal bonds are formed between second conductive features 140 of the third IC die 200Ci and second conductive features 140 of the third IC die 200Cii.

Figure 38:
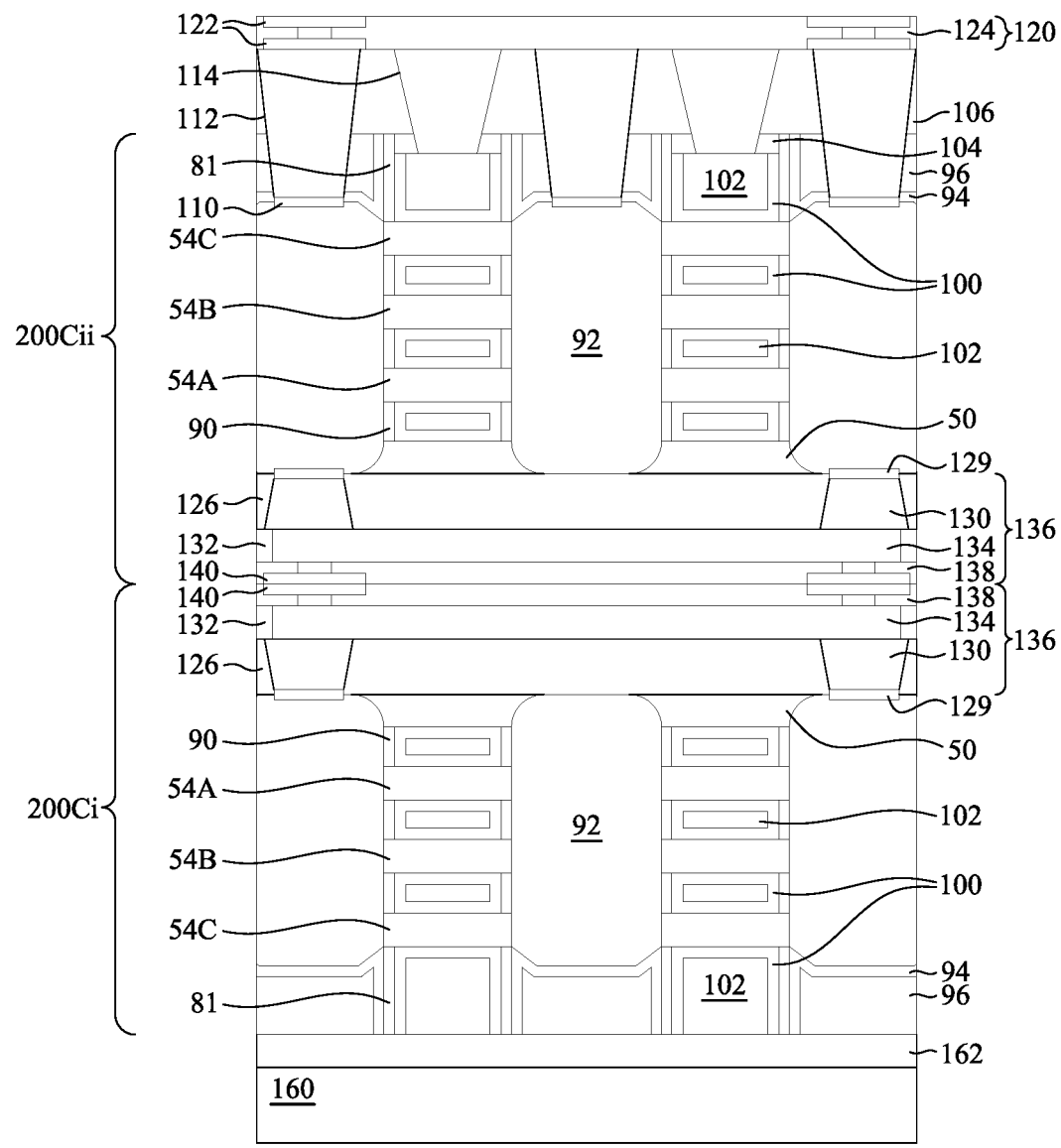

In FIG. 38, source/drain contacts 112, gate contacts 114, a second ILD 106, a front-side interconnect structure 120, a passivation layer 154, UBMs 156, and external connectors 158 are formed over a front-side of the third IC die 200Cii. The source/drain contacts 112, the gate contacts 114, the second ILD 106, and the front-side interconnect structure 120 may be formed of materials and using processes the same as or similar to those discussed above with respect to FIGS. 18A through 21C. Further, the passivation layer 154, the UBMs 156, and the external connectors 158 may be formed of materials and using processes the same as or similar to those discussed above with respect to FIG. 35.

Figure 39:
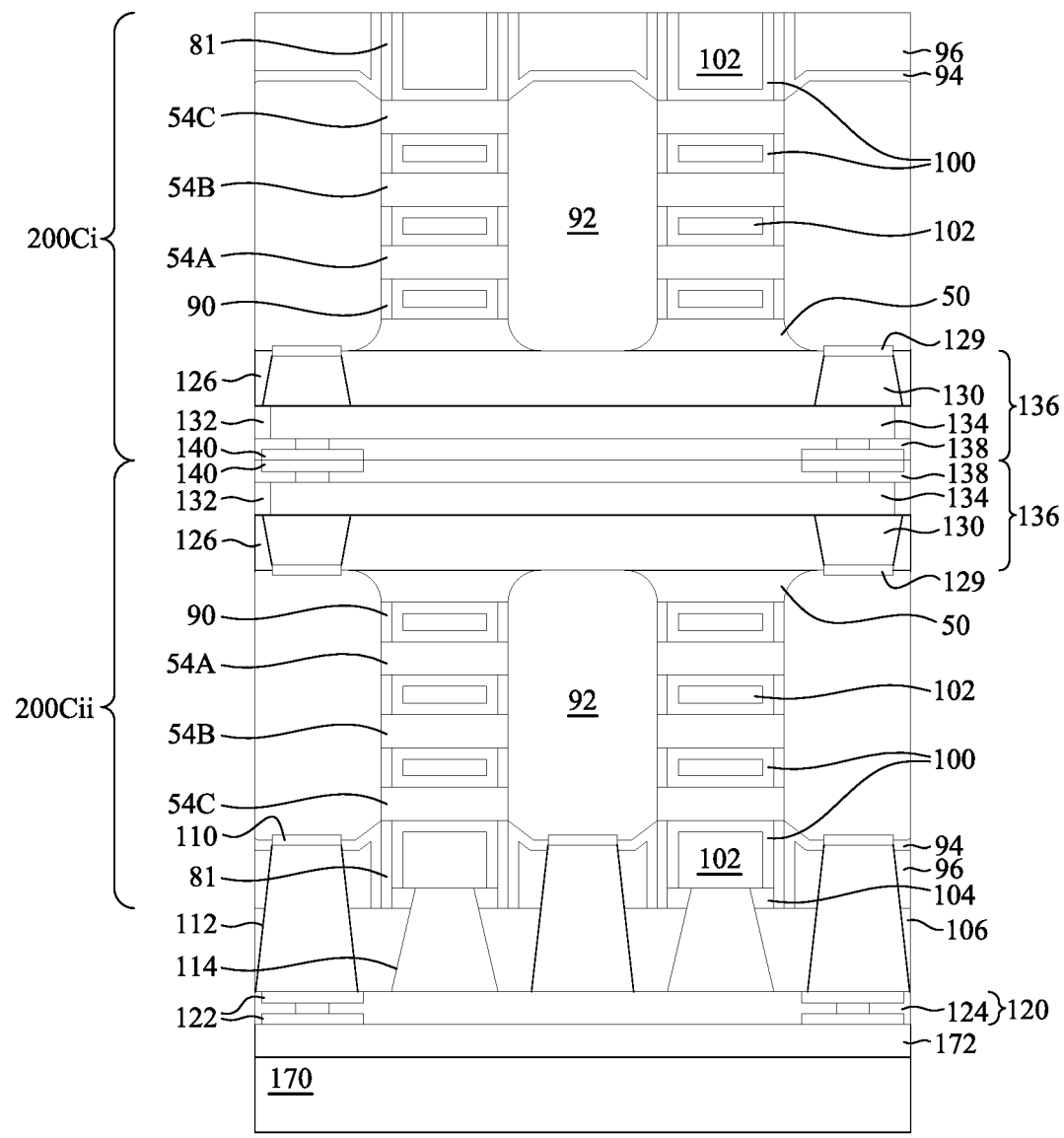

In FIG. 39, the structure of FIG. 38 is flipped such that a front-side of the third IC die 200Ci faces upwards and a third carrier substrate 170 is attached to a front-side of the front-side interconnect structure 120 formed over the front-side of the third IC die 200Cii using a second release layer 172. The third carrier substrate 170 may be a glass carrier substrate, a ceramic carrier substrate, or the like. The third carrier substrate 170 may be a wafer, such that multiple third IC dies 200Ci and third IC dies 200Cii may be processed on third carrier substrate 170 simultaneously.

The second release layer 172 may be formed of a polymer-based material, which may be subsequently removed along with the third carrier substrate 170 from the overlying third IC die 200Cii. In some embodiments, the second release layer 172 is an epoxy-based thermal-release material, which loses its adhesive property when heated, such as a light-to-heat-conversion (LTHC) release coating. In other embodiments, the second release layer 172 may be an ultra-violet (UV) glue, which loses its adhesive property when exposed to UV lights. The second release layer 172 may be dispensed as a liquid and cured, may be a laminate film laminated onto the third carrier substrate 170, or may be the like. The top surface of the second release layer 172 may be leveled and may have a high degree of planarity.

The third IC die 200Cii is then bonded to the third IC die 200Ci. The third IC die 200Cii is back-to-back bonded to the third IC die 200Ci. For example, as illustrated in FIG. 39, the backside interconnect structure 136 of the third IC die 200Cii is directly bonded in a back-to-back manner by hybrid bonding to the backside interconnect structure 136 of the third IC die 200Ci. Specifically, dielectric-to-dielectric bonds are formed between a fifth dielectric layer 138 of the third IC die 200Ci and a fifth dielectric layer 138 of the third IC die 200Cii and metal-to-metal bonds are formed between second conductive features 140 of the third IC die 200Ci and second conductive features 140 of the third IC die 200Cii.

Figure 40:
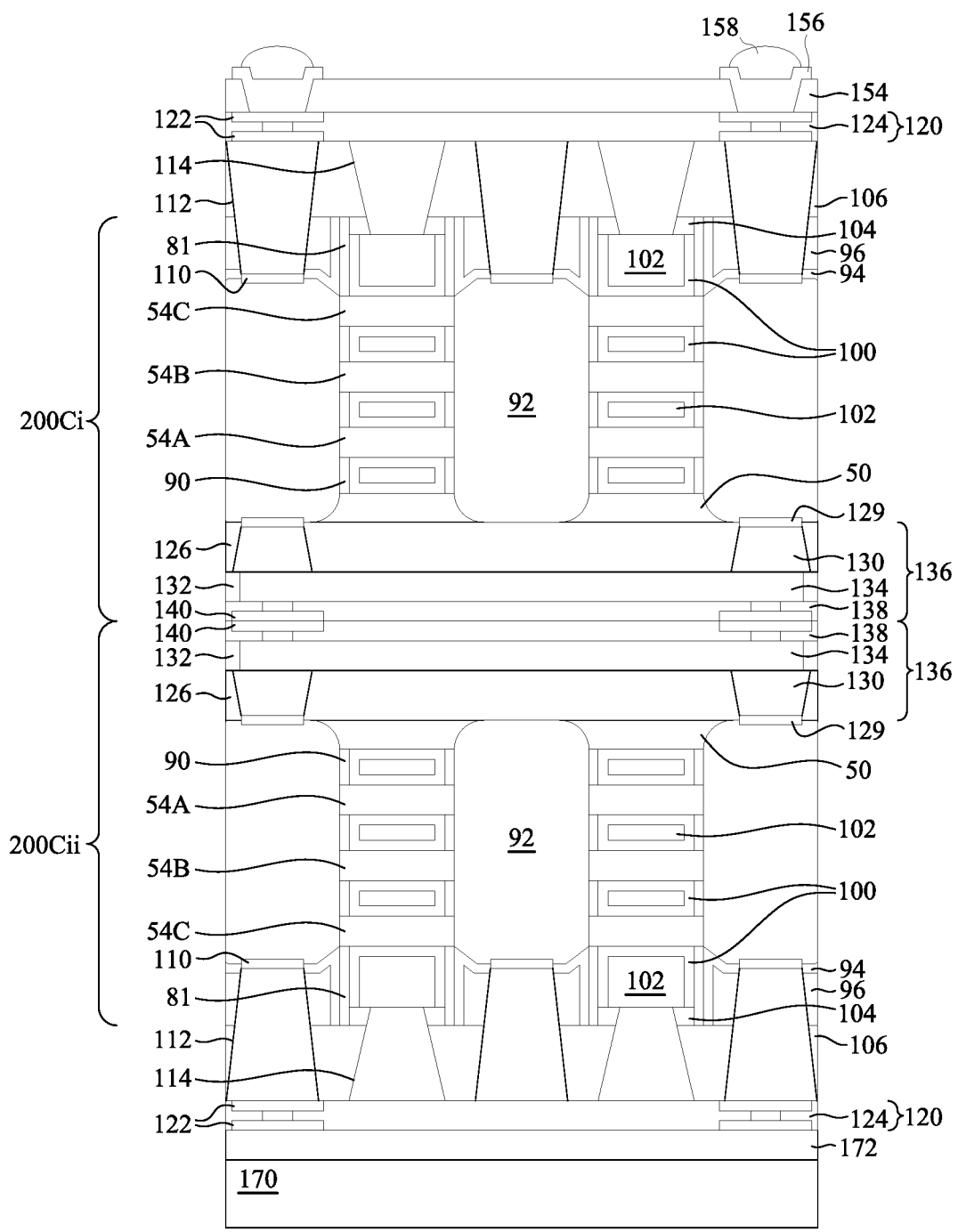

In FIG. 40, source/drain contacts 112, gate contacts 114, a second ILD 106, a front-side interconnect structure 120, a passivation layer 154, UBMs 156, and external connectors 158 are formed over a front-side of the third IC die 200Ci. The source/drain contacts 112, the gate contacts 114, the second ILD 106, and the front-side interconnect structure 120 may be formed of materials and using processes the same as or similar to those discussed above with respect to FIG. 38. Further, the passivation layer 154, the UBMs 156, and the external connectors 158 may be formed of materials and using processes the same as or similar to those discussed above with respect to FIG. 38.

Figure 41:
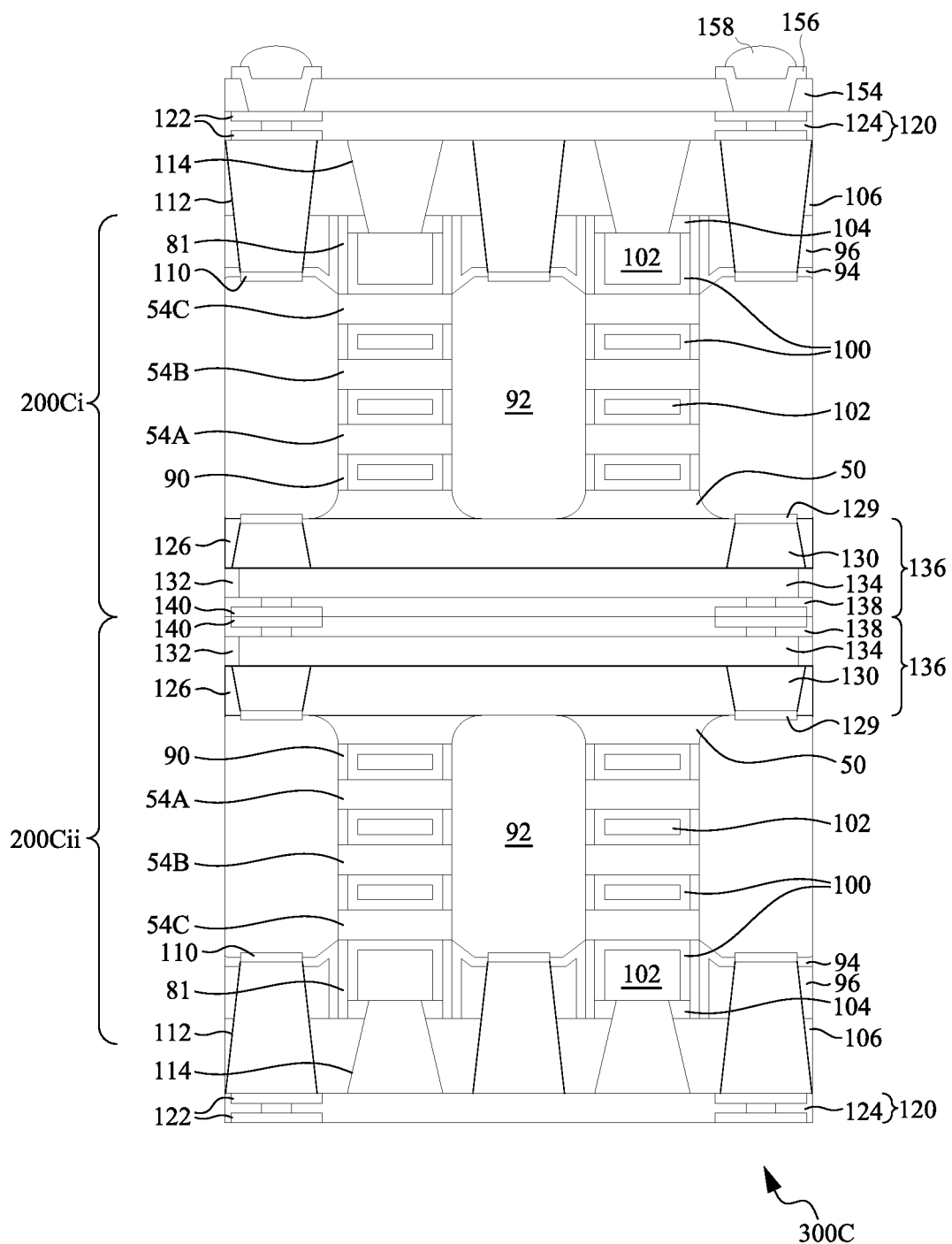

In FIG. 41, a carrier substrate debonding is performed to detach (or "debond") the third carrier substrate 170 from the third IC die 200Cii and a third packaged semiconductor device 300C is formed. In some embodiments, the debonding includes projecting a light such as a laser light or a UV light onto the second release layer 172 so that the second release layer 172 decomposes under the heat of the light and the third carrier substrate 170 can be removed. Removing the third carrier substrate 170 exposes the front-side interconnect structure 120 on the front-side of the third IC die 200Cii.

Conventional processes may form through substrate vias through substrates in order to provide backside connections to integrated circuit dies. In contrast, forming the second conductive lines 134 (e.g., the power rails) and the backside interconnect structures 136 to provide backside connections for the third packaged semiconductor device 300C reduces the area required for backside connections, increasing device density, and improves the flexibility of backside connections. Moreover, bonding the third IC die 200Cii to the third IC die 200Ci using hybrid bonding shortens the routing distance between the third IC die 200Cii and the third IC die 200Ci and reduces the resistance between the third IC die 200Cii and the third IC die 200Ci. As such, the third packaged semiconductor device 300C may be formed with greater device densities, greater flexibility, and improved performance.

Figure 42:
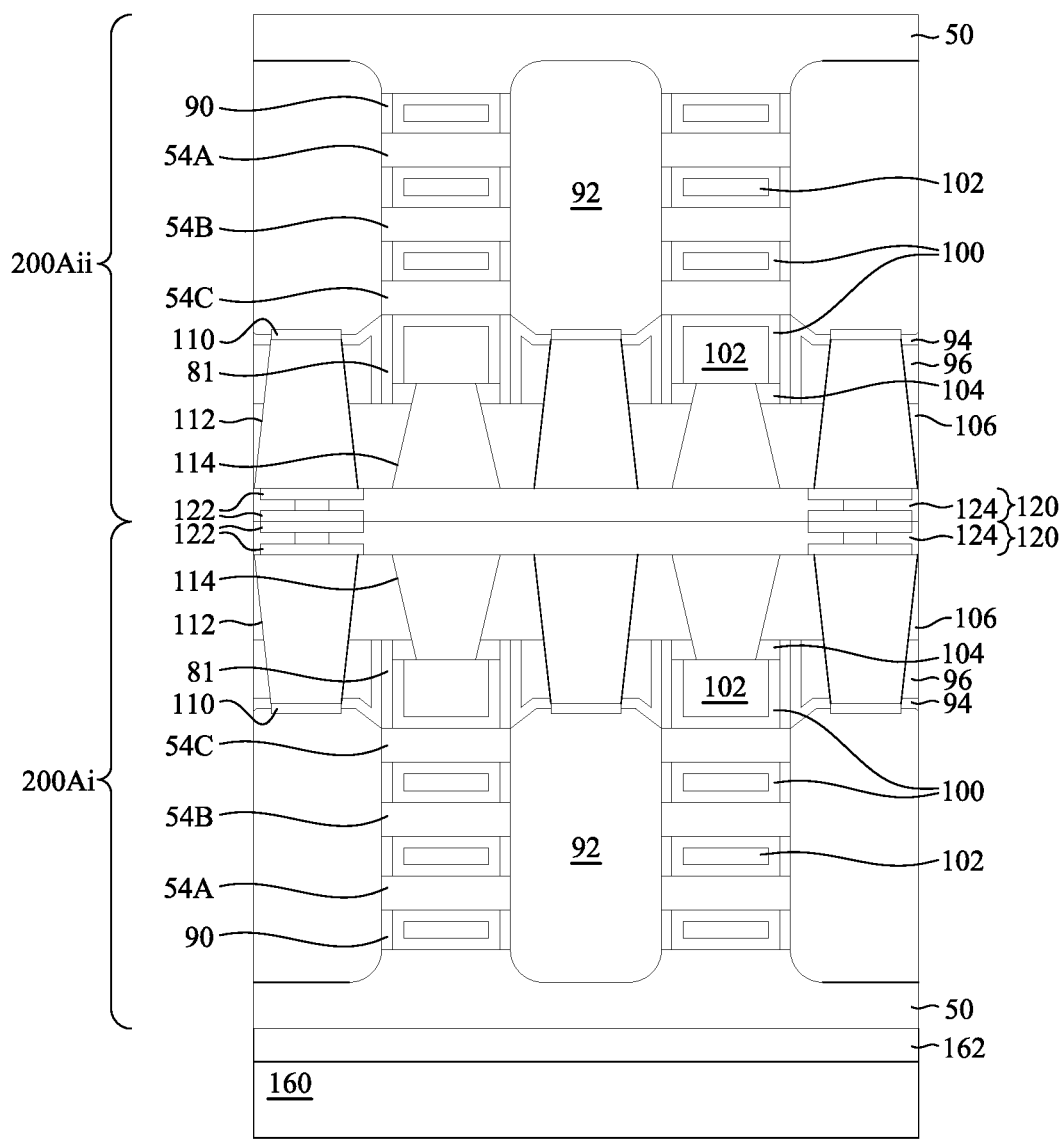

In FIG. 42, a second carrier substrate 160 is attached to a backside surface of a first IC die 200Ai (discussed above with respect to FIGS. 21A through 21C) using a first release layer 162 and a front-side of a first IC die 200Aii (discussed above with respect to FIGS. 21A through 21C) is bonded to a front-side of the first IC die 200Ai. The second carrier substrate 160 may be a glass carrier substrate, a ceramic carrier substrate, or the like. The second carrier substrate 160 may be a wafer, such that multiple first IC dies 200Ai and first IC dies 200Aii may be processed on the second carrier substrate 160 simultaneously.

The first release layer 162 may be formed of a polymer-based material, which may be subsequently removed along with the second carrier substrate 160 from the overlying first IC die 200Ai. In some embodiments, the first release layer 162 is an epoxy-based thermal-release material, which loses its adhesive property when heated, such as a light-to-heat-conversion (LTHC) release coating. In other embodiments, the first release layer 162 may be an ultra-violet (UV) glue, which loses its adhesive property when exposed to UV lights. The first release layer 162 may be dispensed as a liquid and cured, may be a laminate film laminated onto the second carrier substrate 160, or may be the like. The top surface of the first release layer 162 may be leveled and may have a high degree of planarity.

The first IC die 200Aii is then bonded to the first IC die 200Ai. The first IC die 200Aii is face-to-face bonded to the first IC die 200Ai. For example, as illustrated in FIG. 42, the front-side interconnect structure 120 of the first IC die 200Aii is directly bonded in a face-to-face manner by hybrid bonding to the front-side interconnect structure 120 of the first IC die 200Ai. Specifically, dielectric-to-dielectric bonds are formed between a first dielectric layer 124 of the first IC die 200Ai and a first dielectric layer 124 of the first IC die 200Aii and metal-to-metal bonds are formed between first conductive features 122 of the first IC die 200Ai and first conductive features 122 of the first IC die 200Ai.

Figure 43:
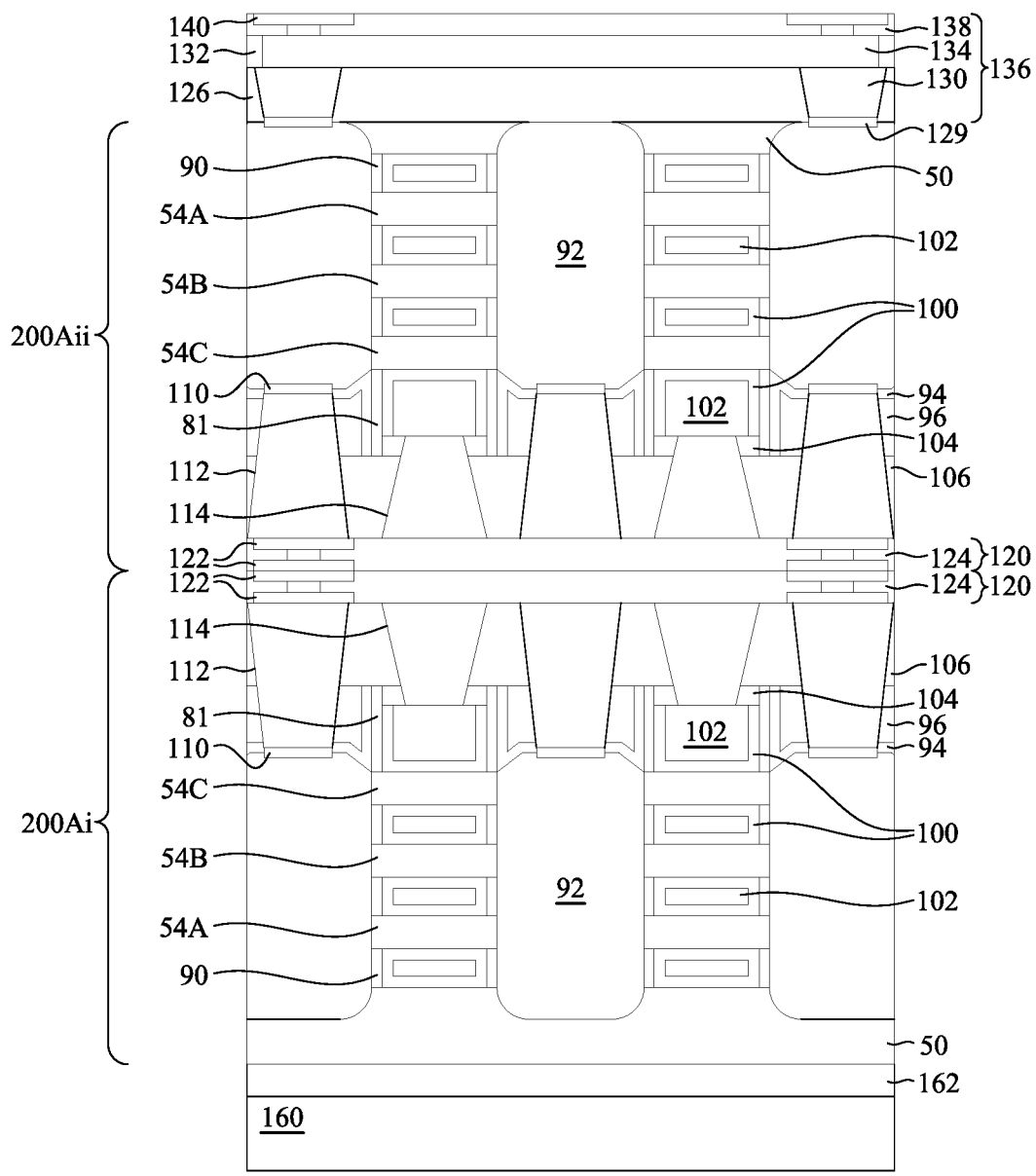

In FIG. 43, a thinning process is applied to the backside of the substrate 50 of the first IC die 200Aii and a backside interconnect structure 136 is formed over backsides of the substrate 50 and the epitaxial source/drain regions 92 of the first IC die 200Aii. The substrate 50 may be thinned using processes the same as or similar to those described above with respect to FIGS. 23A through 23C. The backside interconnect structure 136 may be formed of materials and using processes the same as or similar to those discussed above with respect to FIGS. 24A through 28C.

Figure 44:
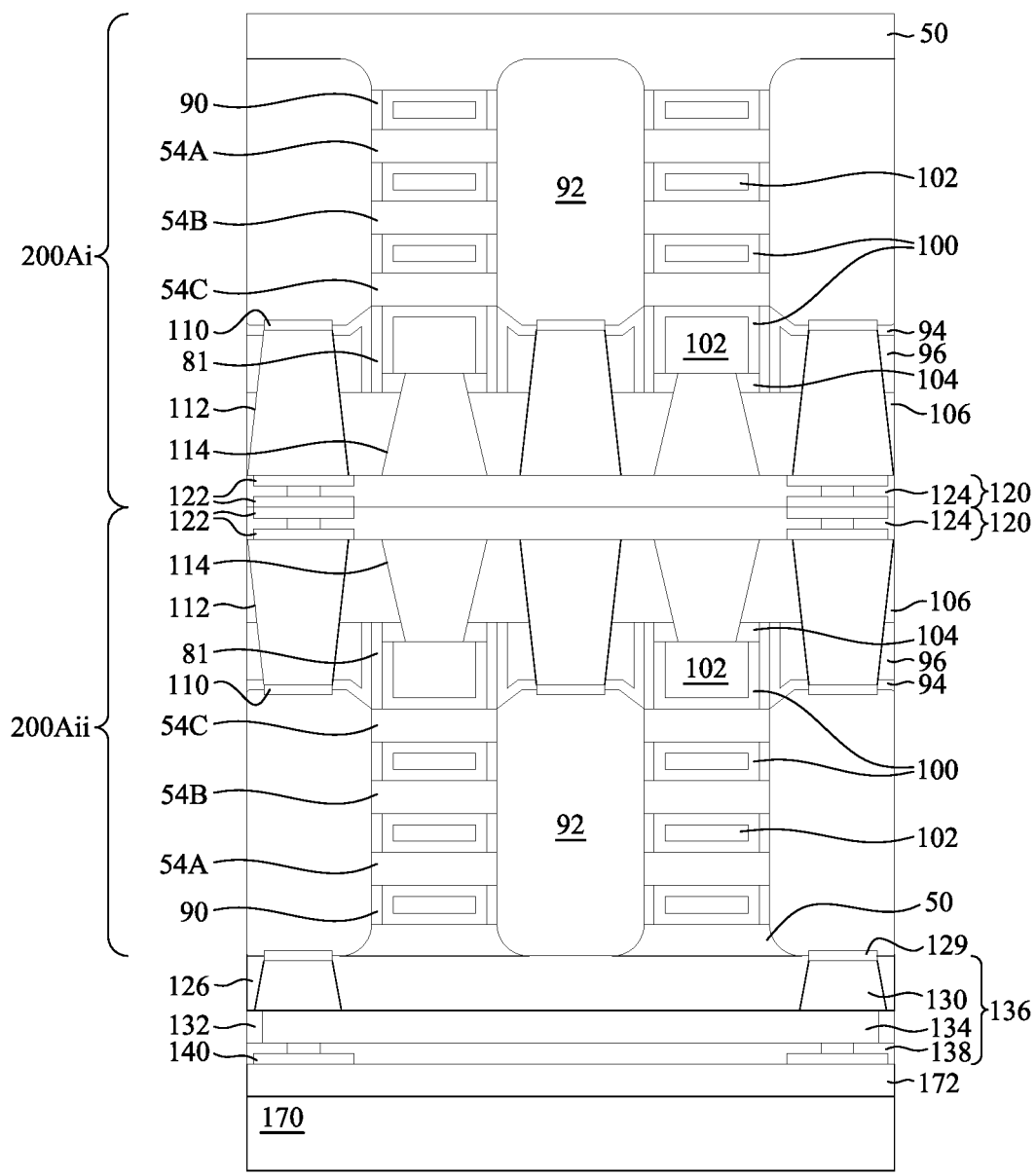

In FIG. 44, the structure of FIG. 43 is flipped such that a backside of the first IC die 200Ai faces upwards and a third carrier substrate 170 is attached to a backside of the backside interconnect structure 136 formed over the backside of the first IC die 200Aii using a second release layer 172. The third carrier substrate 170 may be a glass carrier substrate, a ceramic carrier substrate, or the like. The third carrier substrate 170 may be a wafer, such that multiple first IC dies 200Ai and first IC dies 200Aii may be processed on third carrier substrate 170 simultaneously.

The second release layer 172 may be formed of a polymer-based material, which may be subsequently removed along with the third carrier substrate 170 from the overlying first IC die 200Aii. In some embodiments, the second release layer 172 is an epoxy-based thermal-release material, which loses its adhesive property when heated, such as a light-to-heat-conversion (LTHC) release coating. In other embodiments, the second release layer 172 may be an ultra-violet (UV) glue, which loses its adhesive property when exposed to UV lights. The second release layer 172 may be dispensed as a liquid and cured, may be a laminate film laminated onto the third carrier substrate 170, or may be the like. The top surface of the second release layer 172 may be leveled and may have a high degree of planarity.

Figure 45:
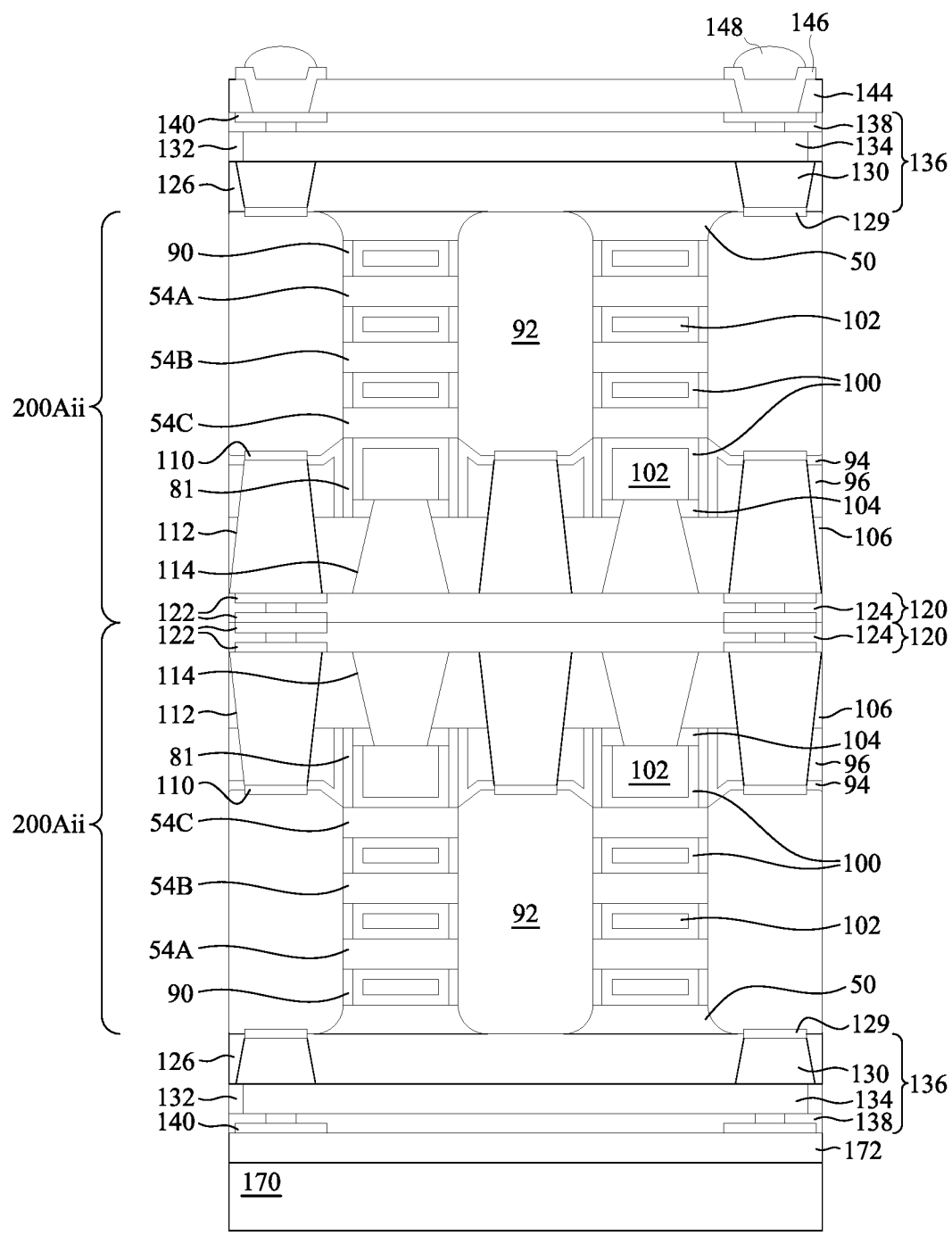

In FIG. 45, a thinning process is applied to the backside of the substrate 50 of the first IC die 200Ai and a backside interconnect structure 136, a passivation layer 144, UBMs 146, and external connectors 148 are formed over backsides of the substrate 50 and the epitaxial source/drain regions 92 of the first IC die 200Ai. The substrate 50 may be thinned using processes the same as or similar to those described above with respect to FIGS. 23A through 23C. The backside interconnect structure 136, the passivation layer 144, the UBMs 146, and the external connectors 148 may be formed of materials and using processes the same as or similar to those discussed above with respect to FIGS. 24A through 29C.

Figure 46:
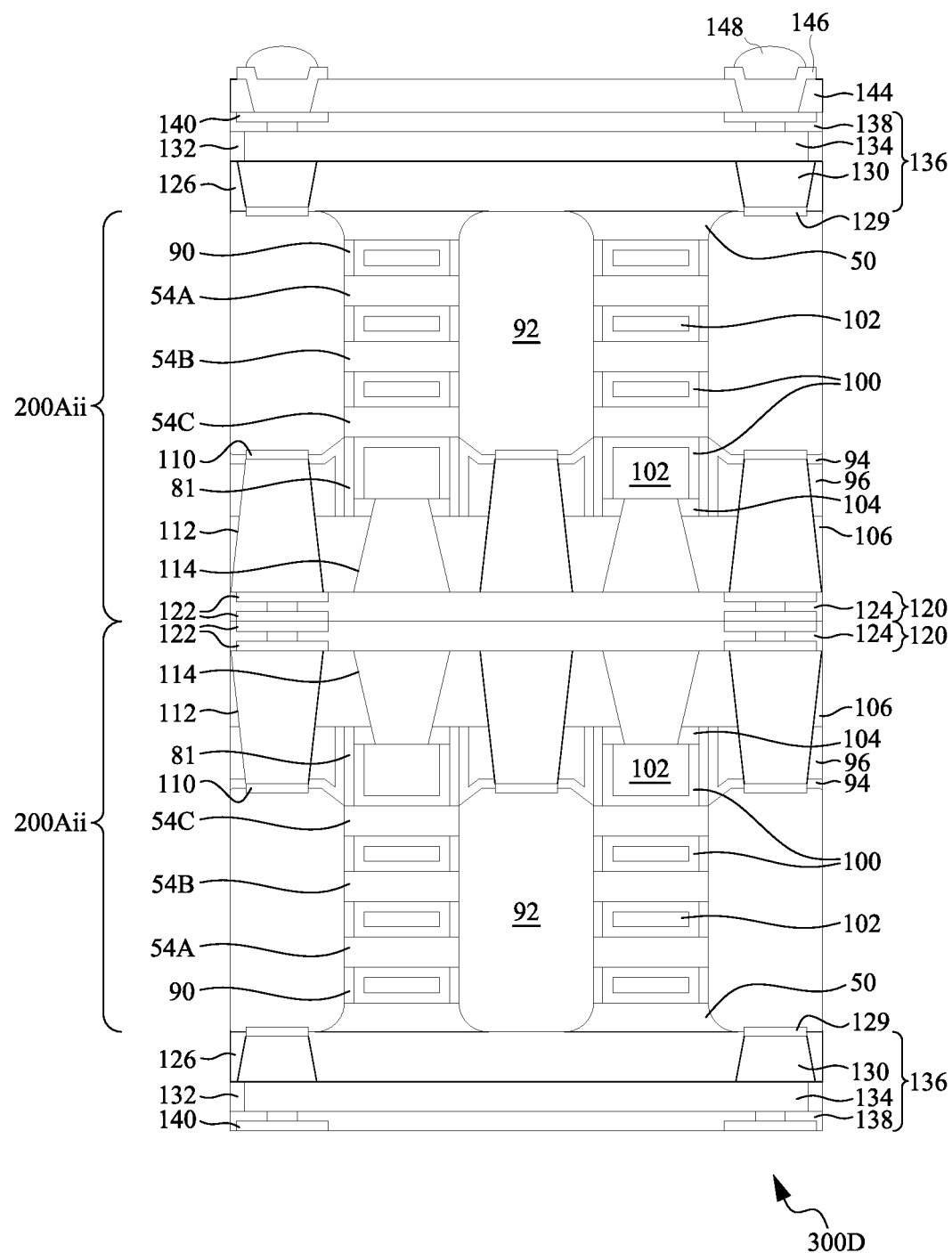

In FIG. 46, a carrier substrate debonding is performed to detach (or "debond") the third carrier substrate 170 from the first IC die 200Aii and a fourth packaged semiconductor device 300D is formed. In some embodiments, the debonding includes projecting a light such as a laser light or a UV light onto the second release layer 172 so that the second release layer 172 decomposes under the heat of the light and the third carrier substrate 170 can be removed. Removing the third carrier substrate 170 exposes the backside interconnect structure 136 on the backside of the first IC die 200Aii.

Conventional processes may form through substrate vias through substrates in order to provide backside connections to integrated circuit dies. In contrast, forming the second conductive lines 134 (e.g., the power rails) and the backside interconnect structures 136 to provide backside connections for the fourth packaged semiconductor device 300D reduces the area required for backside connections, increasing device density, and improves the flexibility of backside connections. Moreover, bonding the first IC die 200Aii to the first IC die 200Ai using hybrid bonding shortens the routing distance between the first IC die 200Aii and the first IC die 200Ai and reduces the resistance between the first IC die 200Aii and the first IC die 200Ai. As such, the fourth packaged semiconductor device 300D may be formed with greater device densities, greater flexibility, and improved performance.

Figure 47:
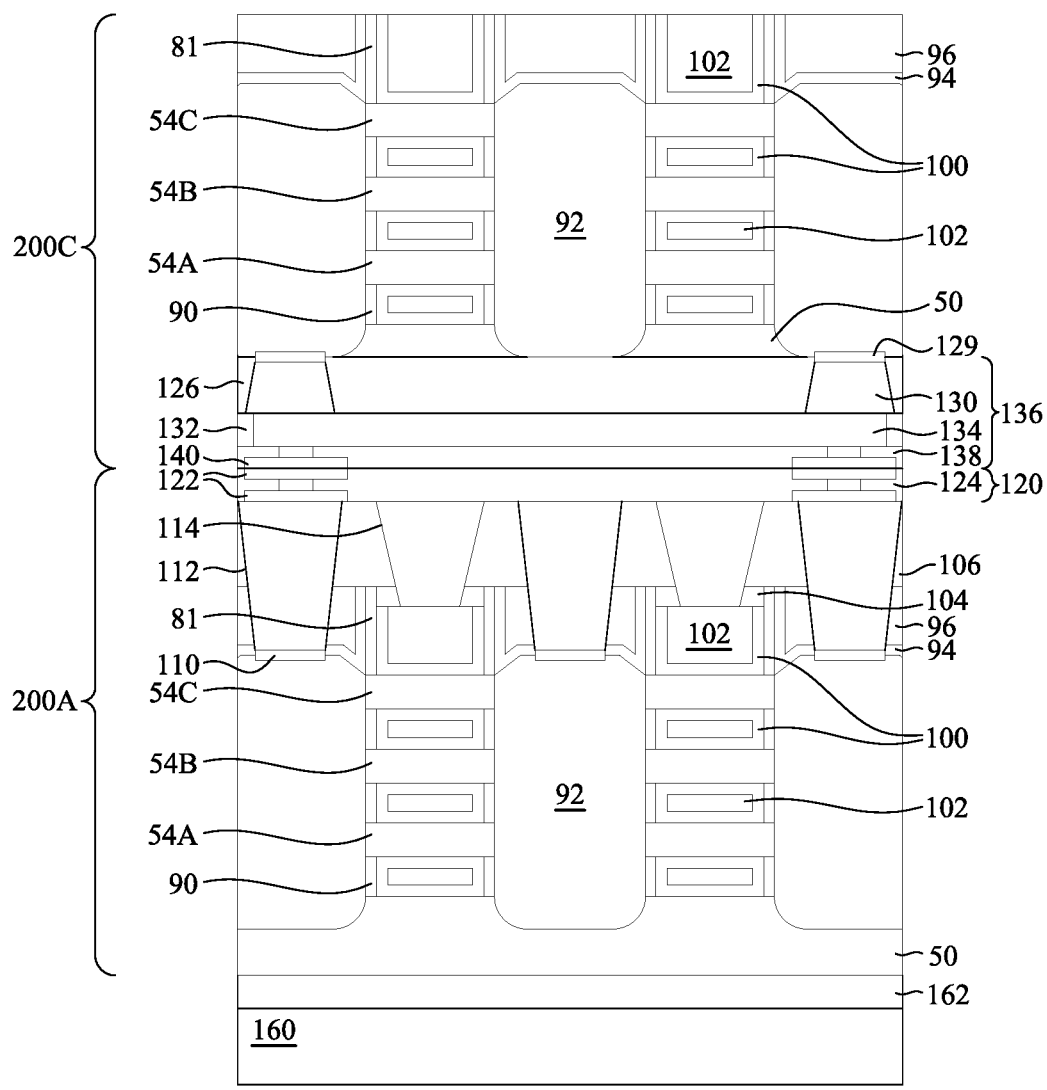

In FIG. 47, a second carrier substrate 160 is attached to a backside surface of a first IC die 200A (discussed above with respect to FIGS. 21A through 21C) using a first release layer 162 and a backside of a third IC die 200C (discussed above with respect to FIG. 33) is bonded to a front-side of the first IC die 200A. The second carrier substrate 160 may be a glass carrier substrate, a ceramic carrier substrate, or the like. The second carrier substrate 160 may be a wafer, such that multiple first IC dies 200A and third IC dies 200C may be processed on the second carrier substrate 160 simultaneously.

The first release layer 162 may be formed of a polymer-based material, which may be subsequently removed along with the second carrier substrate 160 from the overlying first IC die 200A. In some embodiments, the first release layer 162 is an epoxy-based thermal-release material, which loses its adhesive property when heated, such as a light-to-heat-conversion (LTHC) release coating. In other embodiments, the first release layer 162 may be an ultra-violet (UV) glue, which loses its adhesive property when exposed to UV lights. The first release layer 162 may be dispensed as a liquid and cured, may be a laminate film laminated onto the second carrier substrate 160, or may be the like. The top surface of the first release layer 162 may be leveled and may have a high degree of planarity.

The third IC die 200C is then bonded to the first IC die 200A. The third IC die 200C is back-to-face bonded to the first IC die 200A. For example, as illustrated in FIG. 47, the backside interconnect structure 136 of the third IC die 200C is directly bonded in a back-to-face manner by hybrid bonding to the front-side interconnect structure 120 of the first IC die 200A. Specifically, dielectric-to-dielectric bonds are formed between a first dielectric layer 124 of the first IC die 200A and a fifth dielectric layer 138 of the third IC die 200C and metal-to-metal bonds are formed between first conductive features 122 of the first IC die 200A and second conductive features 140 of the third IC die 200C.

Figure 48:
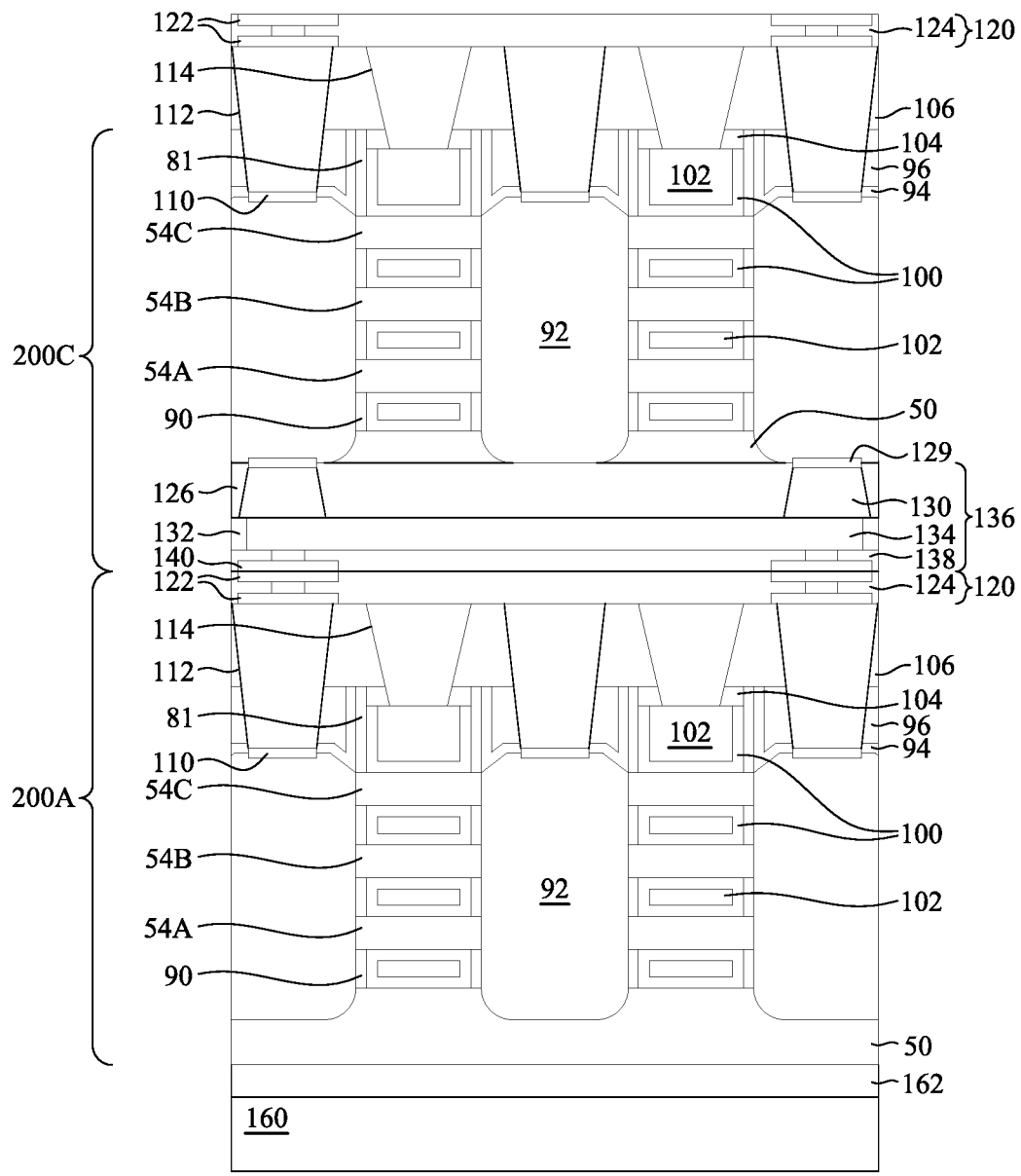

In FIG. 48, source/drain contacts 112, gate contacts 114, a second ILD 106, and a front-side interconnect structure 120 are formed over a front-side of the third IC die 200C. The source/drain contacts 112, the gate contacts 114, the second ILD 106, and the front-side interconnect structure 120 may be formed of materials and using processes the same as or similar to those discussed above with respect to FIGS. 18A through 21C.

Figure 49:
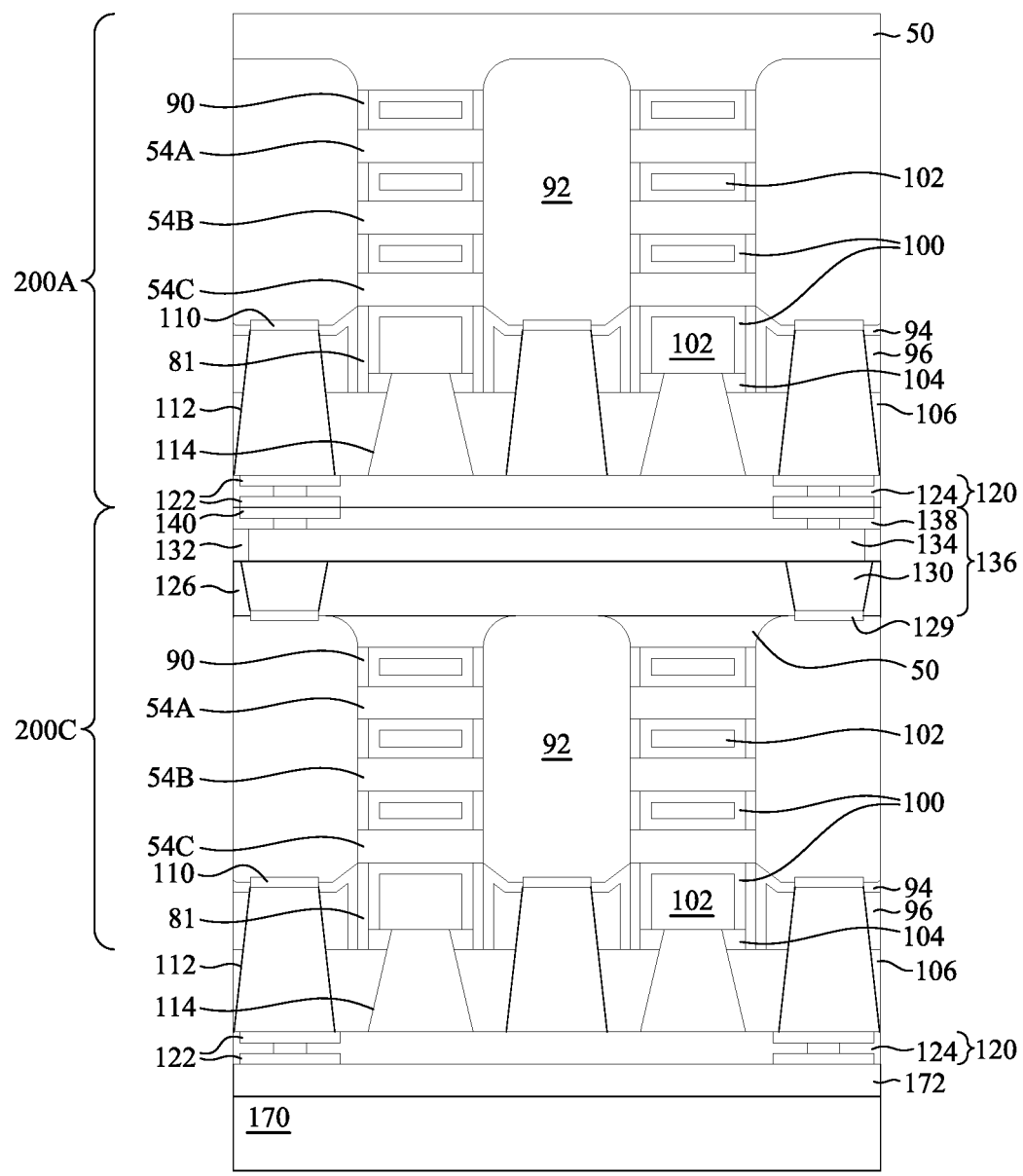

In FIG. 49, the structure of FIG. 48 is flipped such that a backside of the first IC die 200A faces upwards and a third carrier substrate 170 is attached to a front-side of the front-side interconnect structure 120 formed over the front-side of the third IC die 200C using a second release layer 172. The third carrier substrate 170 may be a glass carrier substrate, a ceramic carrier substrate, or the like. The third carrier substrate 170 may be a wafer, such that multiple first IC dies 200A and third IC dies 200C may be processed on third carrier substrate 170 simultaneously.

The second release layer 172 may be formed of a polymer-based material, which may be subsequently removed along with the third carrier substrate 170 from the overlying third IC die 200C. In some embodiments, the second release layer 172 is an epoxy-based thermal-release material, which loses its adhesive property when heated, such as a light-to-heat-conversion (LTHC) release coating. In other embodiments, the second release layer 172 may be an ultra-violet (UV) glue, which loses its adhesive property when exposed to UV lights. The second release layer 172 may be dispensed as a liquid and cured, may be a laminate film laminated onto the third carrier substrate 170, or may be the like. The top surface of the second release layer 172 may be leveled and may have a high degree of planarity.

Figure 50:
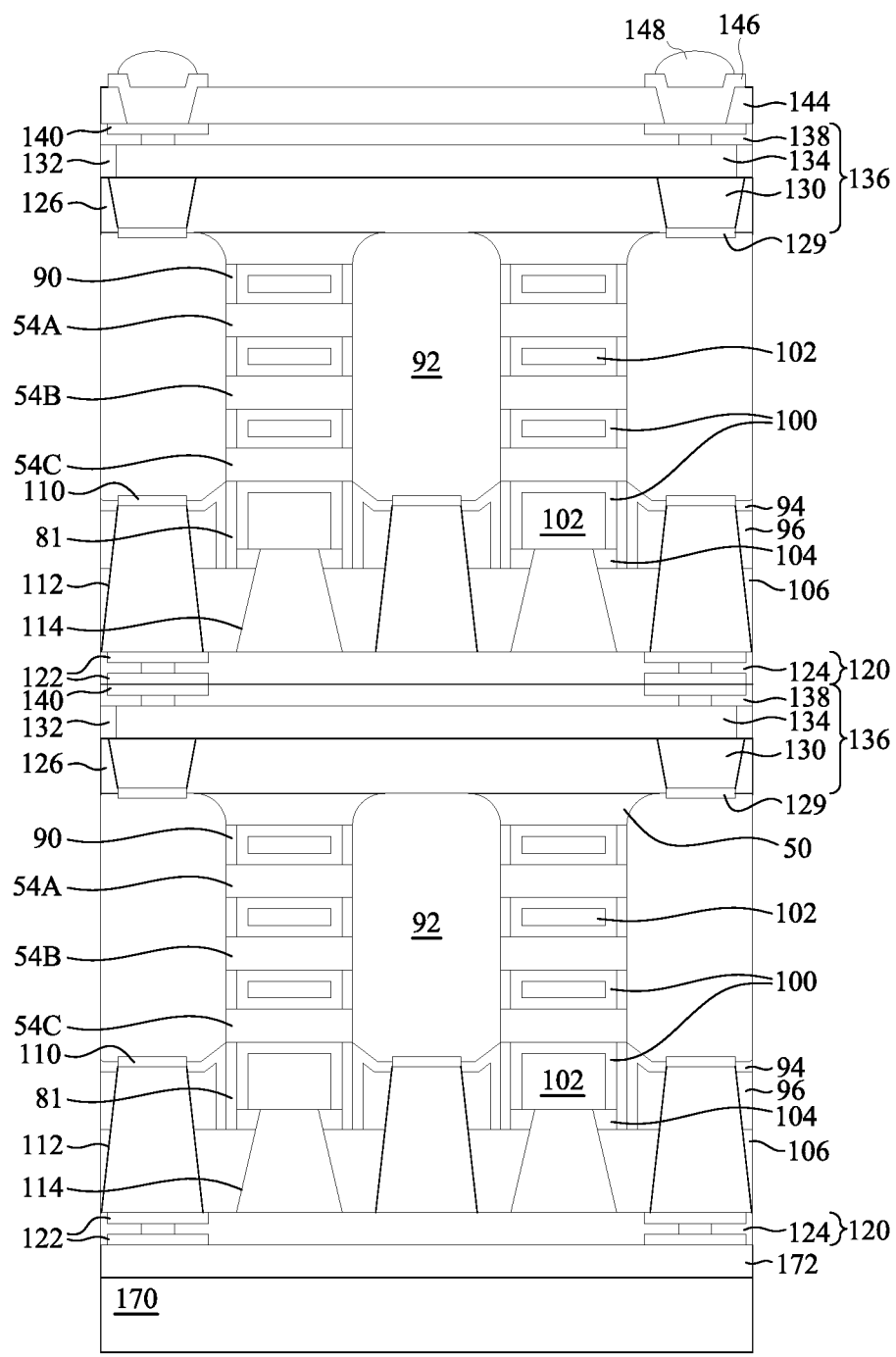

In FIG. 50, a thinning process is applied to the backside of the substrate 50 of the first IC die 200A and a backside interconnect structure 136, a passivation layer 144, UBMs 146, and external connectors 148 are formed over backsides of the substrate 50 and the epitaxial source/drain regions 92 of the first IC die 200A. The substrate 50 may be thinned using processes the same as or similar to those described above with respect to FIGS. 23A through 23C. The backside interconnect structure 136, the passivation layer 144, the UBMs 146, and the external connectors 148 may be formed of materials and using processes the same as or similar to those discussed above with respect to FIGS. 24A through 29C.

Figure 51:
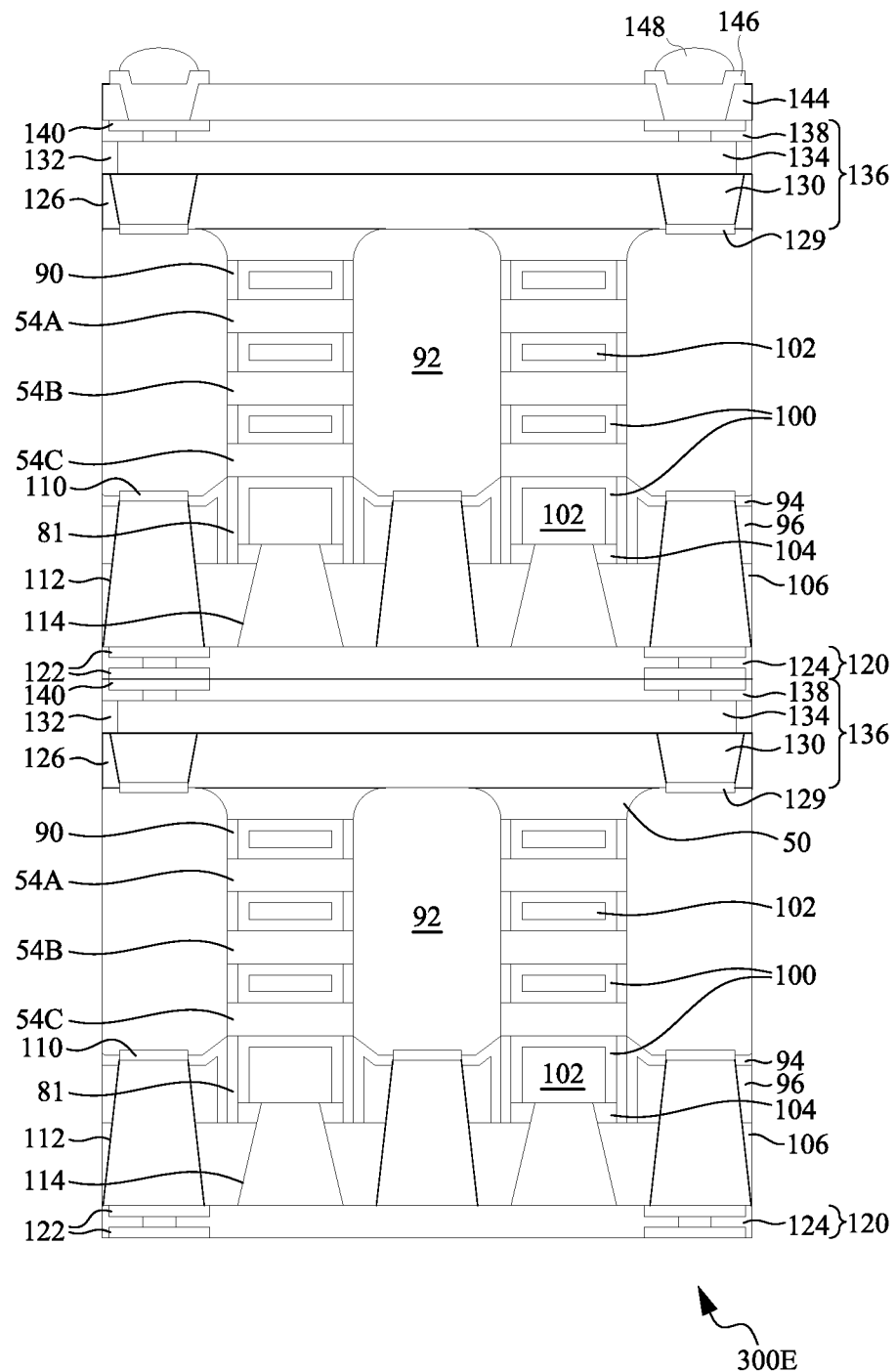

In FIG. 51, a carrier substrate debonding is performed to detach (or "debond") the third carrier substrate 170 from the third IC die 200C and a fifth packaged semiconductor device 300E is formed. In some embodiments, the debonding includes projecting a light such as a laser light or a UV light onto the second release layer 172 so that the second release layer 172 decomposes under the heat of the light and the third carrier substrate 170 can be removed. Removing the third carrier substrate 170 exposes the front-side interconnect structure 120 on the front-side of the third IC die 200C.

Conventional processes may form through substrate vias through substrates in order to provide backside connections to integrated circuit dies. In contrast, forming the second conductive lines 134 (e.g., the power rails) and the backside interconnect structures 136 to provide backside connections for the fifth packaged semiconductor device 300E reduces the area required for backside connections, increasing device density, and improves the flexibility of backside connections. Moreover, bonding the third IC die 200C to the first IC die 200A using hybrid bonding shortens the routing distance between the third IC die 200C and the first IC die 200A and reduces the resistance between the third IC die 200C and the first IC die 200A. As such, the fifth packaged semiconductor device 300E may be formed with greater device densities, greater flexibility, and improved performance.

Embodiments may achieve advantages. For example, forming IC dies which include backside interconnect structures and including backside power rails in the backside interconnect structures reduces interconnect area, shortens routing distance, increasing the flexibility of interconnect area layouts, and increases device density. Moreover, using hybrid bonding between IC dies in packaged semiconductor devices further aids in increasing the flexibility of interconnect area layouts and shortens routing distance, which improves device performance.

In accordance with an embodiment, a device includes a first integrated circuit device including a first transistor structure in a first device layer; a front-side interconnect structure on a front-side of the first device layer; and a backside interconnect structure on a backside of the first device layer, the backside interconnect structure including a first dielectric layer on the backside of the first device layer; and a first contact extending through the first dielectric layer to a source/drain region of the first transistor structure; and a second integrated circuit device including a second transistor structure in a second device layer; and a first interconnect structure on the second device layer, the first interconnect structure being bonded to the front-side interconnect structure by dielectric-to-dielectric and metal-to-metal bonds. In an embodiment, the first interconnect structure is disposed on a front-side of the second device layer. In an embodiment, the first interconnect structure includes a front-side power rail, and the backside interconnect structure includes a backside power rail electrically coupled to the source/drain region of the first transistor structure through the first contact. In an embodiment, the second integrated circuit device further includes a second interconnect structure disposed on a backside of the second device layer, the second interconnect structure including a second dielectric layer on the backside of the second device layer; and a second contact extending through the second dielectric layer to a source/drain region of the second transistor structure. In an embodiment, the backside interconnect structure includes a first backside power rail electrically coupled to the source/drain region of the first transistor structure through the first contact, and the second interconnect structure includes a second backside power rail electrically coupled to the source/drain region of the second transistor structure through the second contact. In an embodiment, the first interconnect structure is disposed on a backside of the second device layer. In an embodiment, the first interconnect structure includes a second dielectric layer on a backside of the second device layer; and a second contact extending through the second dielectric layer to a source/drain region of the second transistor structure. In an embodiment, the backside interconnect structure includes a first backside power rail electrically coupled to the source/drain region of the first transistor structure through the first contact, and the first interconnect structure includes a second backside power rail electrically coupled to the source/drain region of the second transistor structure through the second contact.

In accordance with another embodiment, a device includes a first integrated circuit device including a first substrate; a first device layer over the first substrate, the first device layer including a first transistor structure; and a first interconnect structure over the first device layer, the first interconnect structure including a first power rail on a backside of the first device layer, the first power rail being electrically coupled to a first source/drain region of the first transistor structure through a first backside via; and a second integrated circuit device including a second substrate; a second device layer over the second substrate, the second device layer including a second transistor structure; and a second interconnect structure over the second device layer, the second interconnect structure being bonded to the first interconnect structure by dielectric-to-dielectric and metal-to-metal bonds. In an embodiment, the backside via is electrically coupled to the first source/drain region through a first silicide region. In an embodiment, the second interconnect structure includes a second dielectric layer over a backside of the second device layer; and a second power rail over the second dielectric layer, the second power rail being electrically coupled to a second source/drain region of the second transistor structure through a second backside via. In an embodiment, the second interconnect structure is on a front-side of the second device layer, the second integrated circuit device further includes a third interconnect structure over the second device layer, the third interconnect structure including a second power rail on a backside of the second device layer, the second power rail being electrically coupled to a second source/drain region of the second transistor structure through a second backside via. In an embodiment, the second integrated circuit device further includes a passivation layer on a surface of the third interconnect structure opposite the second device layer; an underbump metallization (UBM) in the passivation layer; and an external connector on the UBM, the external connector being electrically coupled to the third interconnect structure through the UBM. In an embodiment, the second integrated circuit device includes a gate contact electrically coupled to a gate structure of the second transistor structure, the second interconnect structure including a second power rail over a front-side of the second device layer, the second power rail being electrically coupled to the gate structure through the gate contact.

In accordance with yet another embodiment, a method includes forming a first transistor on a first substrate; forming a first interconnect structure over the first transistor; exposing a first source/drain region of the first transistor, exposing the first source/drain region including thinning the first substrate; after exposing the first source/drain region, forming a second interconnect structure over the first transistor opposite the first interconnect structure, forming the second interconnect structure including depositing a first dielectric layer over the first transistor; forming a first backside via through the first dielectric layer and electrically coupled to a first source/drain region of the first transistor; and forming a first conductive line electrically connected to the first backside via; and bonding a first integrated circuit device to the first interconnect structure, bonding the first integrated circuit device to the first interconnect structure including forming dielectric-to-dielectric bonds between the first integrated circuit device and the first interconnect structure. In an embodiment, the method further includes forming the first integrated circuit device, forming the first integrated circuit device including forming a second transistor on a second substrate; and forming a third interconnect structure over the second transistor opposite the second substrate, bonding the first integrated circuit device to the first interconnect structure including forming the dielectric-to-dielectric bonds between the third interconnect structure and the first interconnect structure. In an embodiment, forming the third interconnect structure includes forming a second conductive line over and electrically coupled to the second transistor, the first conductive line being a first power rail, and the second conductive line being a second power rail. In an embodiment, the method further includes forming the first integrated circuit device, forming the first integrated circuit device including forming a second transistor on a second substrate; exposing a second source/drain region of the second transistor, exposing the second source/drain region including thinning the second substrate; and after exposing the second source/drain region, forming a third interconnect structure over the second transistor, forming the third interconnect structure including depositing a second dielectric layer over the second transistor; forming a second backside via through the second dielectric layer and electrically coupled to a second source/drain region of the second transistor; and forming a second conductive line electrically connected to the second backside via. In an embodiment, bonding the first integrated circuit device to the first interconnect structure includes forming the dielectric-to-dielectric bonds between third interconnect structure and the first interconnect structure. In an embodiment, forming the first integrated circuit device further includes forming a fourth interconnect structure over the second transistor opposite the third interconnect structure, bonding the first integrated circuit device to the first interconnect structure including forming the dielectric-to-dielectric bonds between the fourth interconnect structure and the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first integrated circuit device comprising:
      a first transistor structure in a first device layer;
      a front-side interconnect structure on a front-side of the first device layer; and
      a backside interconnect structure on a backside of the first device layer, the backside interconnect structure comprising:
         a first dielectric layer on the backside of the first device layer; and
         a first contact extending through the first dielectric layer to a source/drain region of the first transistor structure; and
   a second integrated circuit device comprising:
      a second transistor structure in a second device layer; and
      a first interconnect structure on the second device layer, wherein the first interconnect structure is bonded to the front-side interconnect structure by dielectric-to-dielectric and metal-to-metal bonds.

2. The device of claim 1, wherein the first interconnect structure is disposed on a front-side of the second device layer.

3. The device of claim 2, wherein the first interconnect structure comprises a front-side power rail, and wherein the backside interconnect structure comprises a backside power rail electrically coupled to the source/drain region of the first transistor structure through the first contact.

4. The device of claim 2, wherein the second integrated circuit device further comprises a second interconnect structure disposed on a backside of the second device layer, the second interconnect structure comprising:
 a second dielectric layer on the backside of the second device layer; and
 a second contact extending through the second dielectric layer to a source/drain region of the second transistor structure.

5. The device of claim 4, wherein the backside interconnect structure comprises a first backside power rail electrically coupled to the source/drain region of the first transistor structure through the first contact, and wherein the second interconnect structure comprises a second backside power rail electrically coupled to the source/drain region of the second transistor structure through the second contact.

6. The device of claim 1, wherein the first interconnect structure is disposed on a backside of the second device layer.

7. The device of claim 6, wherein the first interconnect structure comprises:
 a second dielectric layer on a backside of the second device layer; and
 a second contact extending through the second dielectric layer to a source/drain region of the second transistor structure.

8. The device of claim 7, wherein the backside interconnect structure comprises a first backside power rail electrically coupled to the source/drain region of the first transistor structure through the first contact, and wherein the first interconnect structure comprises a second backside power rail electrically coupled to the source/drain region of the second transistor structure through the second contact.

9. A device comprising:
 a first integrated circuit device comprising:
  a first substrate;
  a first device layer over the first substrate, the first device layer comprising a first transistor structure; and
  a first interconnect structure over the first device layer, the first interconnect structure comprising a first power rail on a backside of the first device layer, the first power rail being electrically coupled to a first source/drain region of the first transistor structure through a first backside via; and
 a second integrated circuit device comprising:
  a second substrate;
  a second device layer over the second substrate, the second device layer comprising a second transistor structure; and
  a second interconnect structure over the second device layer, wherein the second interconnect structure is bonded to the first interconnect structure by dielectric-to-dielectric and metal-to-metal bonds.

10. The device of claim 9, wherein the first backside via is electrically coupled to the first source/drain region through a first silicide region.

11. The device of claim 9, wherein the second interconnect structure comprises:
 a second dielectric layer over a backside of the second device layer; and
 a second power rail over the second dielectric layer, the second power rail being electrically coupled to a second source/drain region of the second transistor structure through a second backside via.

12. The device of claim 9, wherein the second interconnect structure is on a front-side of the second device layer, wherein the second integrated circuit device further comprises a third interconnect structure over the second device layer, the third interconnect structure comprising a second power rail on a backside of the second device layer, the second power rail being electrically coupled to a second source/drain region of the second transistor structure through a second backside via.

13. The device of claim 12, wherein the second integrated circuit device further comprises:
 a passivation layer on a surface of the third interconnect structure opposite the second device layer;
 an underbump metallization (UBM) in the passivation layer; and
 an external connector on the UBM, the external connector being electrically coupled to the third interconnect structure through the UBM.

14. The device of claim 9, wherein the second integrated circuit device comprises a gate contact electrically coupled to a gate structure of the second transistor structure, wherein the second interconnect structure comprises a second power rail over a front-side of the second device layer, the second power rail being electrically coupled to the gate structure through the gate contact.

15. A method comprising:
 forming a first transistor on a first substrate;
 forming a first interconnect structure over the first transistor;
 exposing a first source/drain region of the first transistor, wherein exposing the first source/drain region comprises thinning the first substrate;
 after exposing the first source/drain region, forming a second interconnect structure over the first transistor opposite the first interconnect structure, wherein forming the second interconnect structure comprises:
  depositing a first dielectric layer over the first transistor;
  forming a first backside via through the first dielectric layer and electrically coupled to a first source/drain region of the first transistor; and
  forming a first conductive line electrically connected to the first backside via; and
 bonding a first integrated circuit device to the first interconnect structure, wherein bonding the first integrated circuit device to the first interconnect structure comprises forming dielectric-to-dielectric bonds between the first integrated circuit device and the first interconnect structure.

16. The method of claim 15, further comprising forming the first integrated circuit device, wherein forming the first integrated circuit device comprises:
 forming a second transistor on a second substrate; and
 forming a third interconnect structure over the second transistor opposite the second substrate, wherein bonding the first integrated circuit device to the first interconnect structure comprises forming the dielectric-to-dielectric bonds between the third interconnect structure and the first interconnect structure.

17. The method of claim 16, wherein forming the third interconnect structure comprises forming a second conductive line over and electrically coupled to the second transistor, wherein the first conductive line is a first power rail, and wherein the second conductive line is a second power rail.

18. The method of claim 15, further comprising forming the first integrated circuit device, wherein forming the first integrated circuit device comprises:
   forming a second transistor on a second substrate;
   exposing a second source/drain region of the second transistor, wherein exposing the second source/drain region comprises thinning the second substrate; and
   after exposing the second source/drain region, forming a third interconnect structure over the second transistor, wherein forming the third interconnect structure comprises:
      depositing a second dielectric layer over the second transistor;
      forming a second backside via through the second dielectric layer and electrically coupled to a second source/drain region of the second transistor; and
      forming a second conductive line electrically connected to the second backside via.

19. The method of claim 18, wherein bonding the first integrated circuit device to the first interconnect structure comprises forming the dielectric-to-dielectric bonds between the third interconnect structure and the first interconnect structure.

20. The method of claim 18, wherein forming the first integrated circuit device further comprises forming a fourth interconnect structure over the second transistor opposite the third interconnect structure, wherein bonding the first integrated circuit device to the first interconnect structure comprises forming the dielectric-to-dielectric bonds between the fourth interconnect structure and the first interconnect structure.

* * * * *